(12) United States Patent
Micheloni et al.

(10) Patent No.: US 10,230,396 B1
(45) Date of Patent: *Mar. 12, 2019

(54) METHOD AND APPARATUS FOR LAYER-SPECIFIC LDPC DECODING

(71) Applicant: MICROSEMI SOLUTIONS (U.S.), INC, Aliso Viejo, CA (US)

(72) Inventors: Rino Micheloni, Turate (IT); Alessia Marelli, Merate (IT); Peter Z. Onufryk, Flanders, NJ (US); Christopher I. W. Norrie, San Jose, CA (US)

(73) Assignee: Microsemi Solutions (US), Inc., Chandler, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/715,011

(22) Filed: Sep. 25, 2017

Related U.S. Application Data

(60) Continuation-in-part of application No. 14/628,212, filed on Feb. 21, 2015, now abandoned, which is a division of application No. 13/785,848, filed on Mar. 5, 2013, now Pat. No. 8,990,661, application No. 15/715,011, which is a continuation of application No. 14/747,042, filed on Jun. 23, 2015, now Pat. No. 9,813,080.

(51) Int. Cl.
*H03M 13/00* (2006.01)
*H03M 13/11* (2006.01)
*G06F 11/10* (2006.01)

(52) U.S. Cl.
CPC ....... *H03M 13/114* (2013.01); *G06F 11/1048* (2013.01); *H03M 13/112* (2013.01)

(58) Field of Classification Search
None
See application file for complete search history.

(56) References Cited

U.S. PATENT DOCUMENTS

| | | | |
|---|---|---|---|
| 815,137 | A | 3/1906 | Beecher |
| 5,615,235 | A | 3/1997 | Kakuishi et al. |
| 5,732,092 | A | 3/1998 | Shinohara |
| 5,822,244 | A | 10/1998 | Hansen et al. |
| 5,875,343 | A | 2/1999 | Binford et al. |
| 6,115,788 | A | 9/2000 | Thowe |
| 6,148,360 | A | 11/2000 | Leak et al. |
| 6,412,041 | B1 | 6/2002 | Lee et al. |

(Continued)

OTHER PUBLICATIONS

NVM Express, Revision 1.0; Intel Corporation, Jul. 12, 2011, pp. 103-106 and 110-114.

(Continued)

*Primary Examiner* — Mujtaba M Chaudry
(74) *Attorney, Agent, or Firm* — Glass & Associates; Kenneth Glass

(57) ABSTRACT

Methods and apparatus are disclosed for decoding low-density parity check (LDPC) encoded data using a parity check matrix having a plurality of layers. The apparatus includes a decoder having circuitry to decode, layer by layer, a LDPC codeword utilizing functional adjustments and an algorithmic approximation to belief propagation to provide an estimate of the LDPC codeword, the functional adjustments including layer specific parameters for at least two layers of the parity check matrix associated with the LDPC codeword.

20 Claims, 26 Drawing Sheets

(56) References Cited

U.S. PATENT DOCUMENTS

| | | | |
|---|---|---|---|
| 6,539,515 B1 | 3/2003 | Gong | |
| 6,567,313 B2 | 5/2003 | Tanaka et al. | |
| 6,633,856 B2 * | 10/2003 | Richardson | G06N 3/02 341/107 |
| 6,725,409 B1 * | 4/2004 | Wolf | H03M 13/2957 714/755 |
| 6,789,227 B2 * | 9/2004 | De Souza | H03M 13/033 714/758 |
| 6,871,168 B1 | 3/2005 | Tanaka et al. | |
| 6,895,547 B2 * | 5/2005 | Eleftheriou | G11B 20/1833 714/801 |
| 6,934,804 B2 | 8/2005 | Hashemi | |
| 6,963,507 B2 | 11/2005 | Tanaka et al. | |
| 6,976,194 B2 | 12/2005 | Cypher | |
| 6,976,197 B2 | 12/2005 | Faust et al. | |
| 7,032,081 B1 | 4/2006 | Gefen et al. | |
| 7,050,334 B2 | 5/2006 | Kim et al. | |
| 7,116,732 B2 * | 10/2006 | Worm | H03M 13/2957 375/341 |
| 7,206,992 B2 | 4/2007 | Xin et al. | |
| 7,209,527 B2 * | 4/2007 | Smith | H03M 13/2957 375/341 |
| 7,237,183 B2 | 6/2007 | Xin | |
| 7,324,559 B2 | 1/2008 | McGibney | |
| 7,376,015 B2 | 5/2008 | Tanaka et al. | |
| 7,450,668 B2 | 11/2008 | Ghosh et al. | |
| 7,457,906 B2 | 11/2008 | Pettey et al. | |
| 7,472,331 B2 | 12/2008 | Kim et al. | |
| 7,484,158 B2 | 1/2009 | Sharon et al. | |
| 7,529,215 B2 | 5/2009 | Osterling | |
| 7,567,472 B2 | 7/2009 | Gatzemeier et al. | |
| 7,620,784 B2 | 11/2009 | Panabaker et al. | |
| 7,650,480 B2 | 1/2010 | Jiang et al. | |
| 7,694,047 B1 | 4/2010 | Alston | |
| 7,708,195 B2 | 5/2010 | Yoshida et al. | |
| 7,739,472 B2 | 6/2010 | Guterman et al. | |
| 7,752,346 B2 | 7/2010 | Talayco et al. | |
| 7,801,233 B1 | 9/2010 | Chow et al. | |
| 7,860,930 B2 | 12/2010 | Freimuth et al. | |
| 7,904,793 B2 | 3/2011 | Mokhlesi et al. | |
| 7,930,623 B2 | 4/2011 | Pisek et al. | |
| 7,937,641 B2 | 5/2011 | Amidi | |
| 7,945,721 B1 | 5/2011 | Johnsen et al. | |
| 7,958,430 B1 | 6/2011 | Kolokowsky et al. | |
| 7,975,193 B2 | 7/2011 | Johnson | |
| 8,094,508 B2 | 1/2012 | Gatzemeier et al. | |
| 8,140,930 B1 | 3/2012 | Maru | |
| 8,176,367 B2 | 5/2012 | Dreifus et al. | |
| 8,219,894 B2 | 7/2012 | Au et al. | |
| 8,223,745 B2 | 7/2012 | Johnsen et al. | |
| 8,228,728 B1 | 7/2012 | Yang et al. | |
| 8,244,946 B2 | 8/2012 | Gupta et al. | |
| 8,245,112 B2 | 8/2012 | Hicken et al. | |
| 8,245,117 B1 | 8/2012 | Wu | |
| 8,250,286 B2 | 8/2012 | Yeh et al. | |
| 8,254,112 B2 | 8/2012 | Yang et al. | |
| 8,255,770 B2 | 8/2012 | Park et al. | |
| 8,259,498 B2 | 9/2012 | Yogev et al. | |
| 8,259,506 B1 | 9/2012 | Sommer et al. | |
| 8,261,136 B2 | 9/2012 | D'Abreu et al. | |
| 8,281,217 B2 | 10/2012 | Kim et al. | |
| 8,281,227 B2 | 10/2012 | Inskeep et al. | |
| 8,286,004 B2 | 10/2012 | Williams | |
| 8,307,258 B2 | 11/2012 | Flynn et al. | |
| 8,327,220 B2 | 12/2012 | Borchers et al. | |
| 8,335,977 B2 | 12/2012 | Weingarten et al. | |
| 8,341,502 B2 | 12/2012 | Steiner et al. | |
| 8,351,258 B1 | 1/2013 | Yang et al. | |
| 8,359,522 B2 | 1/2013 | Gunnam et al. | |
| 8,392,789 B2 | 3/2013 | Biscondi et al. | |
| 8,402,201 B2 | 3/2013 | Strasser et al. | |
| 8,418,023 B2 | 4/2013 | Gunnam et al. | |
| 8,429,325 B1 | 4/2013 | Onufryk et al. | |
| 8,429,497 B2 | 4/2013 | Tu et al. | |
| 8,473,812 B2 | 6/2013 | Ramamoorthy et al. | |
| 8,493,791 B2 | 7/2013 | Karakulak et al. | |
| 8,504,885 B2 | 8/2013 | Haratsch et al. | |
| 8,504,887 B1 | 8/2013 | Varnica et al. | |
| 8,555,140 B2 | 10/2013 | Gunnam et al. | |
| 8,621,318 B1 | 12/2013 | Micheloni et al. | |
| 8,638,602 B1 | 1/2014 | Horn et al. | |
| 8,640,005 B2 | 1/2014 | Wilkerson et al. | |
| 8,645,613 B2 | 2/2014 | Tan et al. | |
| 8,656,257 B1 | 2/2014 | Micheloni et al. | |
| 8,665,648 B2 | 3/2014 | Mun et al. | |
| 8,694,849 B1 | 4/2014 | Micheloni et al. | |
| 8,694,855 B1 | 4/2014 | Micheloni et al. | |
| 8,706,956 B2 | 4/2014 | Cagno et al. | |
| 8,707,122 B1 | 4/2014 | Micheloni et al. | |
| 8,737,141 B2 | 5/2014 | Melik-Martirosian | |
| 8,739,008 B2 | 5/2014 | Liu et al. | |
| 8,755,229 B1 | 6/2014 | Visconti et al. | |
| 8,762,620 B2 | 6/2014 | Prins et al. | |
| 8,769,374 B2 | 7/2014 | Franceschini et al. | |
| 8,775,913 B2 | 7/2014 | Haratsch et al. | |
| 8,787,428 B2 | 7/2014 | Dai et al. | |
| 8,856,622 B2 | 10/2014 | Ramamoorthy et al. | |
| 8,898,372 B2 | 11/2014 | Yeh | |
| 8,917,734 B1 | 12/2014 | Brown | |
| 8,924,824 B1 | 12/2014 | Lu | |
| 8,953,373 B1 | 2/2015 | Haratsch et al. | |
| 8,958,247 B2 | 2/2015 | Asaoka et al. | |
| 8,959,280 B2 | 2/2015 | Ma et al. | |
| 8,984,216 B2 | 3/2015 | Fillingim | |
| 8,995,197 B1 | 3/2015 | Steiner et al. | |
| 8,995,302 B1 | 3/2015 | Brown et al. | |
| 9,025,495 B1 | 5/2015 | Onufryk et al. | |
| 9,058,289 B2 | 6/2015 | Tai et al. | |
| 9,142,314 B2 | 9/2015 | Beltrami et al. | |
| 9,164,891 B2 | 10/2015 | Karamcheti et al. | |
| 9,244,763 B1 | 1/2016 | Kankani et al. | |
| 9,251,909 B1 | 2/2016 | Camp et al. | |
| 9,257,182 B2 | 2/2016 | Grunzke | |
| 9,268,531 B1 | 2/2016 | Son et al. | |
| 9,292,428 B2 | 3/2016 | Kanamori et al. | |
| 9,294,132 B1 | 3/2016 | Peleato-Inarrea | |
| 9,397,701 B1 | 7/2016 | Micheloni et al. | |
| 9,444,655 B2 | 9/2016 | Sverdlov et al. | |
| 9,590,656 B2 | 3/2017 | Micheloni et al. | |
| 9,886,214 B2 | 2/2018 | Micheloni et al. | |
| 9,916,906 B2 | 3/2018 | Wu et al. | |
| 2002/0051501 A1 * | 5/2002 | Demjanenko | H04L 1/0013 375/298 |
| 2002/0129308 A1 | 9/2002 | Kinoshita et al. | |
| 2002/0181438 A1 | 12/2002 | McGibney | |
| 2003/0033567 A1 | 2/2003 | Tamura et al. | |
| 2003/0104788 A1 | 6/2003 | Kim | |
| 2003/0225970 A1 | 12/2003 | Hashemi | |
| 2004/0088636 A1 | 5/2004 | Cypher | |
| 2004/0123230 A1 | 6/2004 | Lee et al. | |
| 2004/0136236 A1 | 7/2004 | Cohen et al. | |
| 2004/0181735 A1 | 9/2004 | Xin | |
| 2004/0234150 A1 | 11/2004 | Chang | |
| 2004/0252791 A1 | 12/2004 | Shen et al. | |
| 2004/0268015 A1 | 12/2004 | Pettey et al. | |
| 2005/0010846 A1 | 1/2005 | Kikuchi et al. | |
| 2005/0226355 A1 | 10/2005 | Kibune et al. | |
| 2005/0248999 A1 | 11/2005 | Tamura et al. | |
| 2005/0252791 A1 | 11/2005 | Pechtold et al. | |
| 2005/0286511 A1 | 12/2005 | Johnsen et al. | |
| 2006/0039370 A1 | 2/2006 | Rosen et al. | |
| 2006/0050694 A1 | 3/2006 | Bury et al. | |
| 2006/0126728 A1 | 6/2006 | Yu et al. | |
| 2006/0206655 A1 | 9/2006 | Chappell et al. | |
| 2006/0282603 A1 | 12/2006 | Onufryk et al. | |
| 2007/0050688 A1 | 3/2007 | Thayer | |
| 2007/0089031 A1 | 4/2007 | Huffman et al. | |
| 2007/0101225 A1 | 5/2007 | Moon et al. | |
| 2007/0118743 A1 | 5/2007 | Thornton et al. | |
| 2007/0136628 A1 | 6/2007 | Doi et al. | |
| 2007/0147489 A1 | 6/2007 | Sun et al. | |
| 2007/0217253 A1 | 9/2007 | Kim et al. | |
| 2007/0233939 A1 | 10/2007 | Kim | |

(56) References Cited

U.S. PATENT DOCUMENTS

| | | |
|---|---|---|
| 2007/0239926 A1 | 10/2007 | Gyl et al. |
| 2008/0005382 A1 | 1/2008 | Mimatsu |
| 2008/0016425 A1 | 1/2008 | Khan et al. |
| 2008/0049869 A1 | 2/2008 | Heinrich et al. |
| 2008/0077843 A1 | 3/2008 | Cho et al. |
| 2008/0148129 A1 | 6/2008 | Moon et al. |
| 2008/0229079 A1 | 9/2008 | Flynn et al. |
| 2008/0229164 A1 | 9/2008 | Tamura et al. |
| 2008/0256280 A1 | 10/2008 | Ma |
| 2008/0256292 A1 | 10/2008 | Flynn et al. |
| 2008/0263265 A1 | 10/2008 | Litsyn et al. |
| 2008/0267081 A1 | 10/2008 | Roeck |
| 2008/0276156 A1 | 11/2008 | Gunnam et al. |
| 2008/0320214 A1 | 12/2008 | Ma et al. |
| 2009/0027991 A1 | 1/2009 | Kaizu et al. |
| 2009/0067320 A1 | 3/2009 | Rosenberg et al. |
| 2009/0077302 A1 | 3/2009 | Fukuda |
| 2009/0164694 A1 | 6/2009 | Talayco et al. |
| 2009/0290441 A1 | 11/2009 | Gatzemeier et al. |
| 2009/0296798 A1 | 12/2009 | Banna et al. |
| 2009/0303788 A1 | 12/2009 | Roohparvar et al. |
| 2009/0307412 A1 | 12/2009 | Yeh et al. |
| 2009/0327802 A1 | 12/2009 | Fukutomi et al. |
| 2010/0085076 A1 | 4/2010 | Danilin et al. |
| 2010/0162075 A1 | 6/2010 | Brannstrom et al. |
| 2010/0185808 A1 | 7/2010 | Yu et al. |
| 2010/0199149 A1 | 8/2010 | Weingarten et al. |
| 2010/0211737 A1 | 8/2010 | Flynn et al. |
| 2010/0211852 A1 | 8/2010 | Lee et al. |
| 2010/0226422 A1 | 9/2010 | Taubin et al. |
| 2010/0246664 A1 | 9/2010 | Citta et al. |
| 2010/0262979 A1 | 10/2010 | Borchers et al. |
| 2010/0293440 A1 | 11/2010 | Thatcher et al. |
| 2011/0010602 A1 | 1/2011 | Chung et al. |
| 2011/0055453 A1 | 3/2011 | Bennett et al. |
| 2011/0055659 A1 | 3/2011 | Tu et al. |
| 2011/0066902 A1 | 3/2011 | Sharon et al. |
| 2011/0072331 A1 | 3/2011 | Sakaue et al. |
| 2011/0119553 A1 | 5/2011 | Gunnam et al. |
| 2011/0161678 A1 | 6/2011 | Niwa |
| 2011/0209031 A1 | 8/2011 | Kim et al. |
| 2011/0225341 A1 | 9/2011 | Satoh et al. |
| 2011/0246136 A1 | 10/2011 | Haratsch et al. |
| 2011/0246842 A1 | 10/2011 | Haratsch et al. |
| 2011/0246853 A1 | 10/2011 | Kim et al. |
| 2011/0296084 A1 | 12/2011 | Nango |
| 2011/0307758 A1 | 12/2011 | Fillingim et al. |
| 2012/0008396 A1 | 1/2012 | Park et al. |
| 2012/0051144 A1 | 3/2012 | Weingarten et al. |
| 2012/0054413 A1 | 3/2012 | Brandt |
| 2012/0096192 A1 | 4/2012 | Tanaka et al. |
| 2012/0140583 A1 | 6/2012 | Chung et al. |
| 2012/0141139 A1 | 6/2012 | Bakhru et al. |
| 2012/0166690 A1 | 6/2012 | Regula |
| 2012/0167100 A1 | 6/2012 | Li et al. |
| 2012/0179860 A1 | 7/2012 | Falanga et al. |
| 2012/0203986 A1 | 8/2012 | Strasser et al. |
| 2012/0239991 A1 | 9/2012 | Melik-Martirosian et al. |
| 2012/0254515 A1 | 10/2012 | Melik-Martirosian et al. |
| 2012/0311388 A1 | 12/2012 | Cronin et al. |
| 2012/0311402 A1 | 12/2012 | Tseng et al. |
| 2013/0013983 A1* | 1/2013 | Livshitz .............. H03M 13/1111 714/776 |
| 2013/0024735 A1 | 1/2013 | Chung et al. |
| 2013/0060994 A1 | 3/2013 | Higgins et al. |
| 2013/0086451 A1 | 4/2013 | Grube et al. |
| 2013/0094286 A1 | 4/2013 | Sridharan et al. |
| 2013/0094290 A1 | 4/2013 | Sridharan et al. |
| 2013/0117616 A1 | 5/2013 | Tai et al. |
| 2013/0117640 A1 | 5/2013 | Tai et al. |
| 2013/0145235 A1 | 6/2013 | Alhussien et al. |
| 2013/0163327 A1 | 6/2013 | Karakulak et al. |
| 2013/0163328 A1 | 6/2013 | Karakulak et al. |
| 2013/0176779 A1 | 7/2013 | Chen et al. |
| 2013/0185598 A1 | 7/2013 | Haratsch et al. |
| 2013/0198451 A1 | 8/2013 | Hyun et al. |
| 2013/0205085 A1 | 8/2013 | Hyun et al. |
| 2013/0314988 A1 | 11/2013 | Desireddi et al. |
| 2013/0315252 A1 | 11/2013 | Emmadi et al. |
| 2013/0318422 A1 | 11/2013 | Weathers et al. |
| 2014/0029336 A1 | 1/2014 | Venkitachalam et al. |
| 2014/0040704 A1 | 2/2014 | Wu et al. |
| 2014/0053037 A1* | 2/2014 | Wang .................... H03M 13/13 714/752 |
| 2014/0068368 A1 | 3/2014 | Zhang et al. |
| 2014/0068382 A1 | 3/2014 | Desireddi et al. |
| 2014/0072056 A1 | 3/2014 | Fay |
| 2014/0085982 A1 | 3/2014 | Asaoka et al. |
| 2014/0101510 A1 | 4/2014 | Wang et al. |
| 2014/0164881 A1 | 6/2014 | Chen et al. |
| 2014/0181426 A1 | 6/2014 | Grunzke et al. |
| 2014/0181617 A1 | 6/2014 | Wu et al. |
| 2014/0185611 A1 | 7/2014 | Lie et al. |
| 2014/0198569 A1 | 7/2014 | Kim et al. |
| 2014/0198581 A1 | 7/2014 | Kim et al. |
| 2014/0215175 A1 | 7/2014 | Kasorla et al. |
| 2014/0219003 A1 | 8/2014 | Ebsen et al. |
| 2014/0229774 A1 | 8/2014 | Melik-Martirosian et al. |
| 2014/0281767 A1 | 9/2014 | Alhussien et al. |
| 2014/0281771 A1 | 9/2014 | Yoon et al. |
| 2014/0281800 A1 | 9/2014 | Micheloni et al. |
| 2014/0281808 A1 | 9/2014 | Lam et al. |
| 2014/0281822 A1 | 9/2014 | Wu et al. |
| 2014/0281823 A1 | 9/2014 | Micheloni et al. |
| 2015/0039952 A1 | 2/2015 | Goessel et al. |
| 2015/0043286 A1 | 2/2015 | Park et al. |
| 2015/0046625 A1 | 2/2015 | Peddle et al. |
| 2015/0127883 A1 | 5/2015 | Chen et al. |
| 2015/0131373 A1 | 5/2015 | Alhussien et al. |
| 2015/0149871 A1 | 5/2015 | Chen et al. |
| 2015/0169468 A1 | 6/2015 | Camp et al. |
| 2015/0186055 A1 | 7/2015 | Darragh |
| 2015/0221381 A1 | 8/2015 | Nam |
| 2015/0242268 A1 | 8/2015 | Wu et al. |
| 2015/0332780 A1 | 11/2015 | Kim et al. |
| 2015/0371718 A1 | 12/2015 | Becker et al. |
| 2016/0034206 A1 | 2/2016 | Ryan et al. |
| 2016/0049203 A1 | 2/2016 | Alrod et al. |
| 2016/0071601 A1 | 3/2016 | Shirakawa et al. |
| 2016/0072527 A1 | 3/2016 | Tadokoro et al. |
| 2016/0155507 A1 | 6/2016 | Grunzke |
| 2016/0179406 A1 | 6/2016 | Gorobets et al. |
| 2016/0247581 A1 | 8/2016 | Yoshida et al. |
| 2016/0293259 A1 | 10/2016 | Kim et al. |
| 2017/0147135 A1 | 5/2017 | Higashibeppu |
| 2017/0213597 A1 | 7/2017 | Micheloni et al. |
| 2018/0033490 A1 | 2/2018 | Marelli et al. |

OTHER PUBLICATIONS

NVM Express, Revision 1.0; Intel Corporation, Mar. 1, 2011, pp. 1-122.

RapidIO, PCI Express, and Gigabit Ethernet Comparison: Pros and Cons of Using Three Interconnects in Embedded Systems; RapidIO Trade Association, Technical White Paper, Revision 03,, May 2005, 1-36.

PCI Express Base Specification Revision 3.0 (PCI Express Base Expression, PCISIG, hereinafter "PCIExpress"), Nov. 10, 2010, 1-860.

RFC 793: Transmission Control Protocol, RFC 793, University of Southern California, IETF,, Sep. 1981, pp. 1-89.

Cai, et al., "Data Retention in MLC NAND Flash Memory: Characterization, Optimization, and Recovery", 2015 IEEE 21st International Symposium on High Performance Computer Architecture (HPCA); Carnegie Mellon University, LSI Corporation, 2015, pp. 551-563.

Chen, et al., "Increasing flash memory lifetime by dynamic voltage allocation for constant mutual information", 2014 Information Theory and Applications Workshop (ITA), 2014, pp. 1-5.

Peleato, et al., "Probabilistic graphical model for flash memory programming", Statistical Signal Processing Workshop (SSP), 2012 IEEE, 2012, pp. 1-4.

(56) References Cited

OTHER PUBLICATIONS

Wu, et al., "Reducing SSD Read Latency via NAND Flash Program and Erase Suspension", Proceedings of FAST'2012; Department of Electrical and Computer Engineering Virginia Commonwealth University, Richmond, VA 23284, 2012, pp. 117-123.

\* cited by examiner $$m_j^i = \prod_{k \in N(j) \setminus \{j\}} sign(r_k^j) \cdot \min_{k \in N(j) \setminus \{j\}} |r_k^j|$$

702

$$m_j^i = \prod_{k \in N(j) \setminus \{j\}} sign(r_k^j) \cdot \max\left(\min_{k \in N(j) \setminus \{j\}} |r_k^j| - \beta, 0\right)$$

704

$$\beta = \beta_{rs} = \begin{vmatrix} \beta_{11} & \cdots & \beta_{1s} \\ \vdots & \ddots & \vdots \\ \beta_{r1} & \cdots & \beta_{rs} \end{vmatrix}$$

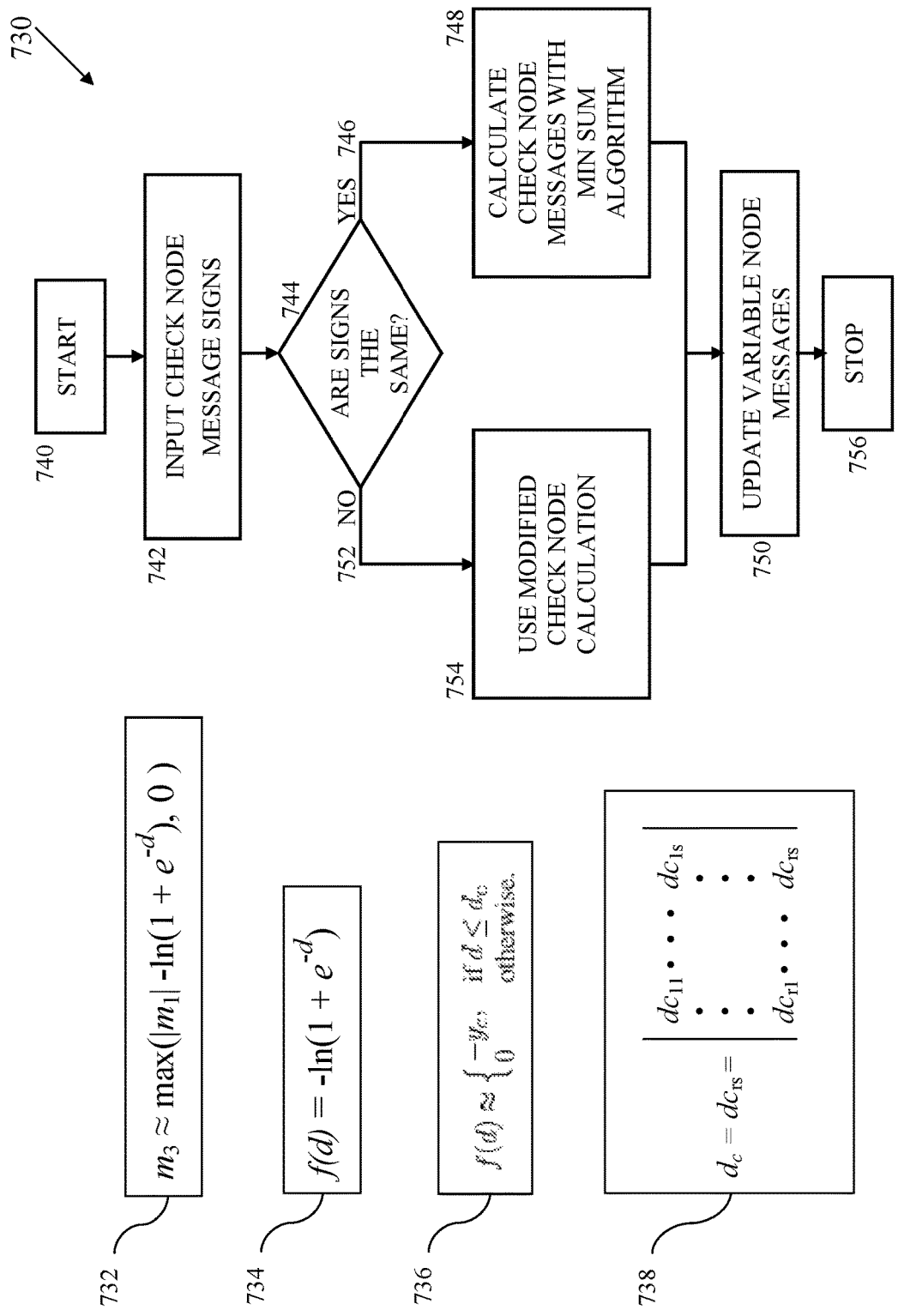

802 — $m'_{v \to c} = \alpha m_{v \to c}$

804 — $\alpha = \alpha_{rs} = \begin{vmatrix} \alpha_{11} & \cdots & \alpha_{1s} \\ \vdots & \cdots & \vdots \\ \alpha_{r1} & \cdots & \alpha_{rs} \end{vmatrix}$

850 →

852 — $|m'_{v \to c}| = \begin{cases} m_{v \to c} - \beta & |m_{v \to c}| > \beta \\ m_{v \to c} & |m_{v \to c}| \leq \beta \end{cases}$ 854 — $\beta = \beta_{rs} = \begin{vmatrix} \beta_{11} & \cdots & \beta_{1s} \\ \vdots & \cdots & \vdots \\ \beta_{r1} & \cdots & \beta_{rs} \end{vmatrix}$

FIG 9B

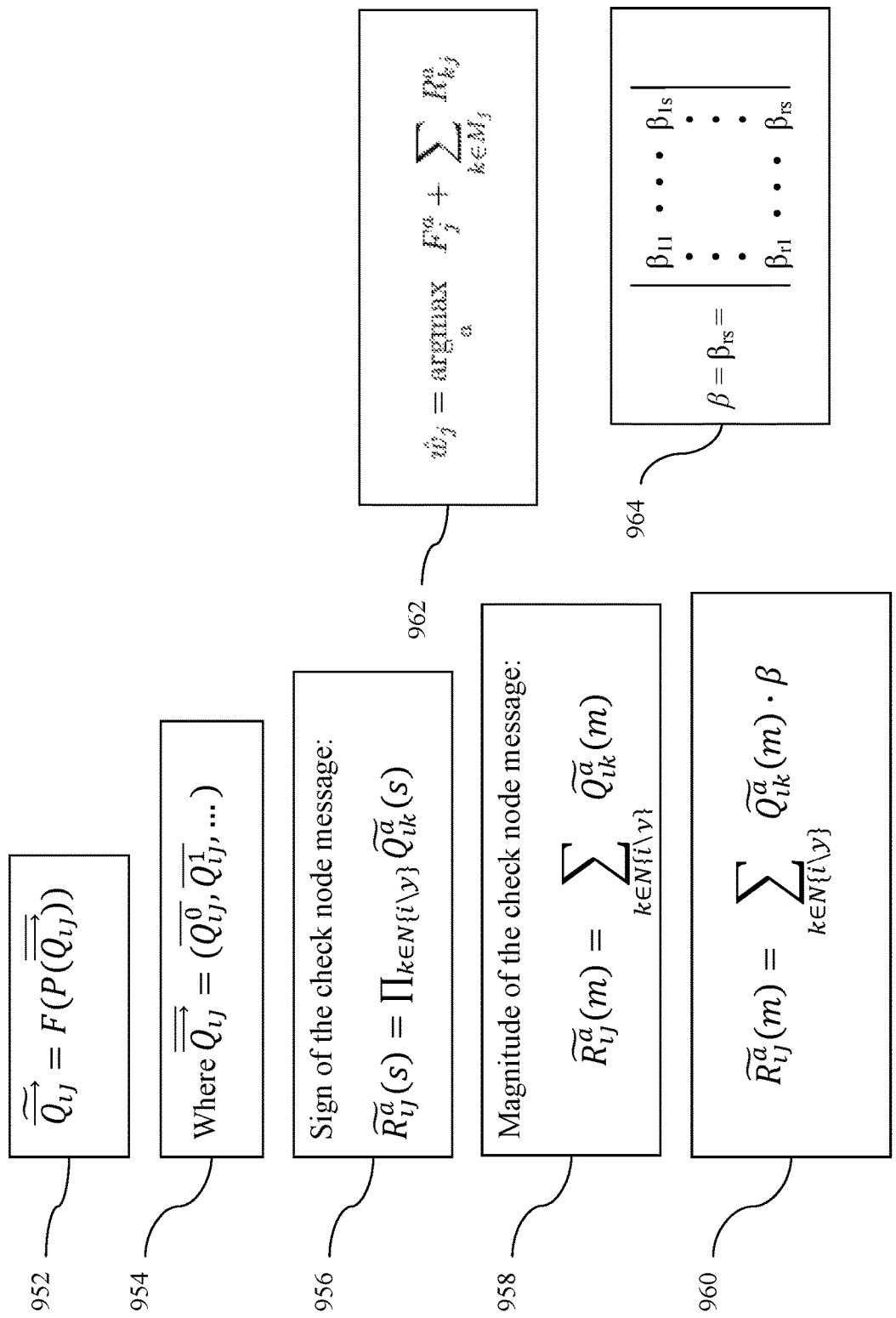

952 — $\overrightarrow{\widetilde{Q}_{ij}} = F(P(\overrightarrow{Q_{ij}}))$

954 — Where $\overrightarrow{Q_{ij}} = (\overrightarrow{Q_{ij}^0}, \overrightarrow{Q_{ij}^1}, \ldots)$ 956 — Sign of the check node message:
$\widetilde{R}_{ij}^{\tilde{a}}(s) = \prod_{k \in N\{i\}\backslash j} \widetilde{Q}_{ik}^{\tilde{a}}(s)$ 958 — Magnitude of the check node message:
$\widetilde{R}_{ij}^{\tilde{a}}(m) = \sum_{k \in N\{i\}\backslash j} \widetilde{Q}_{ik}^{\tilde{a}}(m)$ 960 — $\widetilde{R}_{ij}^{\tilde{a}}(m) = \sum_{k \in N\{i\}\backslash j} \widetilde{Q}_{ik}^{\tilde{a}}(m) \cdot \beta$ 962 — $\hat{w}_j = \underset{a}{\arg\max}\ F_j^{\prime a} + \sum_{k \in M_j} R_{kj}^{a}$ 964 — $\beta = \beta_{rs} = \begin{vmatrix} \beta_{11} & \cdots & \beta_{r1} \\ \vdots & \cdots & \vdots \\ \beta_{1s} & \cdots & \beta_{rs} \end{vmatrix}$

FIG 11A

1102: $R_{ij} = \prod_{j \in N\{i\}\backslash j} \alpha_{j'i} \cdot \phi\left(\sum_{j \in N\{i\}\backslash j} \phi(|Q_{ij}|)\right)$ 1104: Where $\phi(x) = -\log\left(\tanh\left(\frac{x}{2}\right)\right)$ 1106: $|R_{ij}| = \phi_\delta^{-1}\left(\sum_{j \in N\{i\}\backslash j} \phi_\delta(b_{j'i})\right)$ 1108: Where $\beta_{j'i} = \delta b_{j'i}$ and $\delta = \ln(2)$ 1110: When $x$ is large, $\log(1 \pm e^{-x}) \cong e^{-x}$ which results in:

$\phi_\delta(b_{j'i}) \cong 2\exp(-\delta b_{j'i})$

1112: The inverse of this approximation will be:

$\phi_\delta^{-1}(x) \cong -\log_2\left(\frac{x}{2}\right)$

1114:

1100: $|R_{ij}| = C_1 - \left\lceil\left\lceil log_2\left(\sum_{i' \in N\{i\}\backslash j}(2^{-b_{j'i}} + C_2)\right)\right\rceil\right\rceil$ 1116: $C_1 = C1_{rs} = \begin{bmatrix} C1_{11} & \cdots & C1_{r1} \\ \vdots & & \vdots \\ C1_{1s} & \cdots & C1_{rs} \end{bmatrix}$ 1118: $C_2 = C2_{rs} = \begin{bmatrix} C2_{11} & \cdots & C2_{r1} \\ \vdots & & \vdots \\ C2_{1s} & \cdots & C2_{rs} \end{bmatrix}$

FIG 15A

1502: $$R_{ij} = \prod_{j'\in N\{i\setminus j\}} \alpha_{j'i} \cdot \phi\left(\sum_{j'\in N\{i\setminus j\}} \phi(|Q_{ij'}|)\right)$$

1504: $$R_{ijsplit} = \prod_{j'\in N\{i\setminus j\}} \alpha_{j'i} \cdot \phi\left(\sum_{j'\in Nsplit\{i\setminus j\}} \phi(|Q_{ij'}|)\right)$$

1506: $$\sum_{j'\in Nsplit\{i\setminus j\}} \phi(|Q_{ij'}|) \leq \sum_{j'\in N\{i\setminus j\}} \phi(|Q_{ij'}|)$$

1508: $$\phi\left(\sum_{j'\in Nsplit\{i\setminus j\}} \phi(|Q_{ij'}|)\right) \geq \phi\left(\sum_{j'\in N\{i\setminus j\}} \phi(|Q_{ij'}|)\right)$$

1510: $$R_{ijsplit} = \frac{\prod_{j'\in N\{i\setminus j\}} \alpha_{j'i} \cdot \phi\left(\sum_{j'\in Nsplit\{i\setminus j\}} \phi(|Q_{ij'}|)\right)}{S}$$

1512: 
$$S = S_{rst} = \begin{array}{|ccc|} \hline S_{1s} & \cdots & S_{rs} \\ \vdots & \cdots & \vdots \\ S_{11} & \cdots & S_{r1} \\ \hline \end{array}$$

1500

METHOD AND APPARATUS FOR LAYER-SPECIFIC LDPC DECODING

BACKGROUND

A solid state drive (SSD) is a data storage device that utilizes solid-state memory to retain data in nonvolatile memory chips. NAND-based flash memories are widely used as the solid-state memory storage in SSDs due to their compactness, low power consumption, low cost, high data throughput and reliability. SSDs commonly employ several NAND-based flash memory chips and a flash controller to manage the flash memory and to transfer data between the flash memory and a host computer.

While NAND-based flash memories are reliable, they are not inherently error-free and often rely on error correction coding (ECC) to correct raw bit errors in the stored data. One commonly employed error correction code employed in nonvolatile memory storage modules, such as SSDs, are low-density parity-check (LDPC) codes. An LDPC code is a linear error correcting code having a parity check matrix with a small number of nonzero elements in each row and column. Various methods for decoding data encoded with LDPC error correction codes are known in the art. Some commonly employed decoding methods for LDPC coding are approximations of the quasi-optimal decoding method of belief propagation. Such approximations of belief propagation can introduce hardware simplifications in the design of a decoder. The layered min-sum algorithm (MSA), as well as others, are iterative by layer and are approximations of belief propagation. The layered MSA is less complex than other decoding methods known in the art. However, approximations to belief propagation such as layered MSA exhibit noticeable degradation in the decoding performance compared to the more complex decoding methods, such as belief propagation. To counteract the degradation in the decoding performance achievable with approximations such as the layered MSA, normalized layered min-sum algorithms have been developed incorporating a normalization factor, or attenuation factor, to account for the degradation in decoding performance. However, in the prior art, normalized layered MSAs utilize the same attenuation factor for each layer of the min-sum decoding process to recover the LDPC encoded codeword. Utilization of the same attenuation factor for each layer of an algorithmic approximation to belief propagation may not converge to the original codeword or may require a high number of iterations for convergence. This may present a problem.

Use of belief propagation directly as the decoding algorithm while optimal in terms of error correction capacity does not always converge quickly to produce a codeword. This can present a problem.

In standard normalized layered min-sum LDPC decoding, the attenuation factor is not subject to change during the decoding procedure, the attenuation factor remains the same regardless of the layer of the structure upon which the min-sum calculation is being performed. Utilizing the same attenuation factor for all the layers during the decoding procedure may not yield the best decoding performance, because the calculations for the second layer already utilize an input which is cleaner than the input used during the calculations on the first layer. This may present a problem.

In the standard normalized min-sum algorithm, the attenuation factor is computed by comparing the value obtained with the belief propagation algorithm and the min-sum algorithm for the entire parity check matrix associated with a codeword. In other words, the attenuation factor is computed as the ratio of the average value in check node processing computed with belief propagation and the average value in check node processing computed with the min-sum algorithm. This may present a problem.

SUMMARY

A method to decode low-density parity check (LDPC) encoded data using a parity check matrix having a plurality of layers, includes receiving a plurality of values at a decoder. Each value of the plurality of values represents one of a plurality of bits of an LDPC codeword encoded using the parity check matrix. The LDPC codeword is decoded using layered scheduling. A functional adjustment is applied to an approximation of belief propagation used during the decoding. At least one layer specific functional adjustment is used to provide an estimate of the codeword.

An apparatus to decode low-density parity check (LDPC) encoded data using a parity check matrix having a plurality of layers, includes a functional adjustment matrix containing functional adjustment parameters. Each location in the functional adjustment matrix provides a layer specific functional adjustment for each layer of the plurality of layers. A check node processor is coupled to the functional adjustment matrix. The check node processor has circuitry to perform check node processing on a plurality of values for each layer of the parity check matrix associated with a codeword utilizing an approximation to belief propagation. A variable node processor is coupled to the check node processor. The variable node processor has circuitry for performing variable node processing on a plurality of values for each layer of the parity check matrix associated with the codeword. A codeword estimate check processor is coupled to the variable node processor. The codeword estimate check processor has circuitry to perform a check of an estimate of the codeword to determine if the estimate is a codeword.

An apparatus to decode low-density parity check (LDPC) encoded data using a parity check matrix having a plurality of layers includes a decoder. The decoder includes circuitry to decode, layer by layer, the LDPC encoded data utilizing functional adjustments and an algorithmic approximation to belief propagation to provide an estimate of the LDPC codeword. The functional adjustments include layer specific parameters for at least two layers of the parity check matrix associated with the codeword.

An integrated circuit to decode low-density parity check (LDPC) encoded data using a parity check matrix having a plurality of layers, including a section of memory. The section of memory is configured to store functional adjustment parameters. A check node processor is coupled to the section of memory. The check node processor has circuitry to perform check node processing on a plurality of values for each layer of the parity check matrix associated with a codeword utilizing an algorithm that approximates belief propagation. The algorithm is adjusted with one or more functional adjustment parameters which are specific to at least one layer of the plurality of layers. A variable node processor is coupled to the check node processor. The variable node processor has circuitry to perform variable node processing on a plurality of values for each layer of the parity check matrix associated with the codeword. A codeword estimate check processor is coupled to the variable node processor. The codeword estimate check processor has circuitry to perform a check of an estimate of the codeword to determine if the estimate is a codeword.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

FIG. 7A illustrates an algorithmic approximation to belief propagation decoding using an OFFSET MIN SUM approximation according to embodiments of the invention.

FIG. 7B illustrates an algorithmic approximation to belief propagation decoding using a TWO-STEP MIN SUM approximation according to embodiments of the invention.

FIG. 8 illustrates improvements to belief propagation decoding according to embodiments of the invention.

FIGS. 9A-9C illustrate an algorithmic approximation to belief propagation decoding using an LOG-FFT approximation according to embodiments of the invention.

FIGS. 11A-B illustrate an algorithmic approximation to belief propagation decoding using a RICHARDSON/NOVICHKOV approximation according to embodiments of the invention.

FIGS. 15A-B illustrate an algorithmic approximation to belief propagation decoding using a SPLIT ROW DECODING approximation according to embodiments of the invention.

DETAILED DESCRIPTION

In the following detailed description of embodiments of the invention, reference is made to the accompanying drawings in which like references indicate similar elements, and in which is shown by way of illustration, specific embodiments in which the invention may be practiced. These embodiments are described in sufficient detail to enable those of skill in the art to practice the invention. In other instances, well-known circuits, structures, and techniques have not been shown in detail in order not to obscure the understanding of this description. The following detailed description is, therefore, not to be taken in a limiting sense, and the scope of the invention is defined only by the appended claims.

Apparatuses and methods are described for applying a general functional adjustment to layer specific LDPC decoding using belief propagation (BP) or to an approximation of BP. Such functionality permits different encoding/decoding architectures to be realized for a variety of use cases within a general framework which includes the general functional adjustment and decoding implemented with any belief propagation decoding solution, i.e., either using belief propagation or an algorithmic approximation of belief propagation. For example, an error correction system can be designed with different end points utilizing embodiments of the invention. In one instance a system that minimizes hardware usage for error correction and a system that achieves a high correctable raw but error rate from more complex hardware can be obtained from the same general framework by using various embodiments of the invention.

Figure 1:
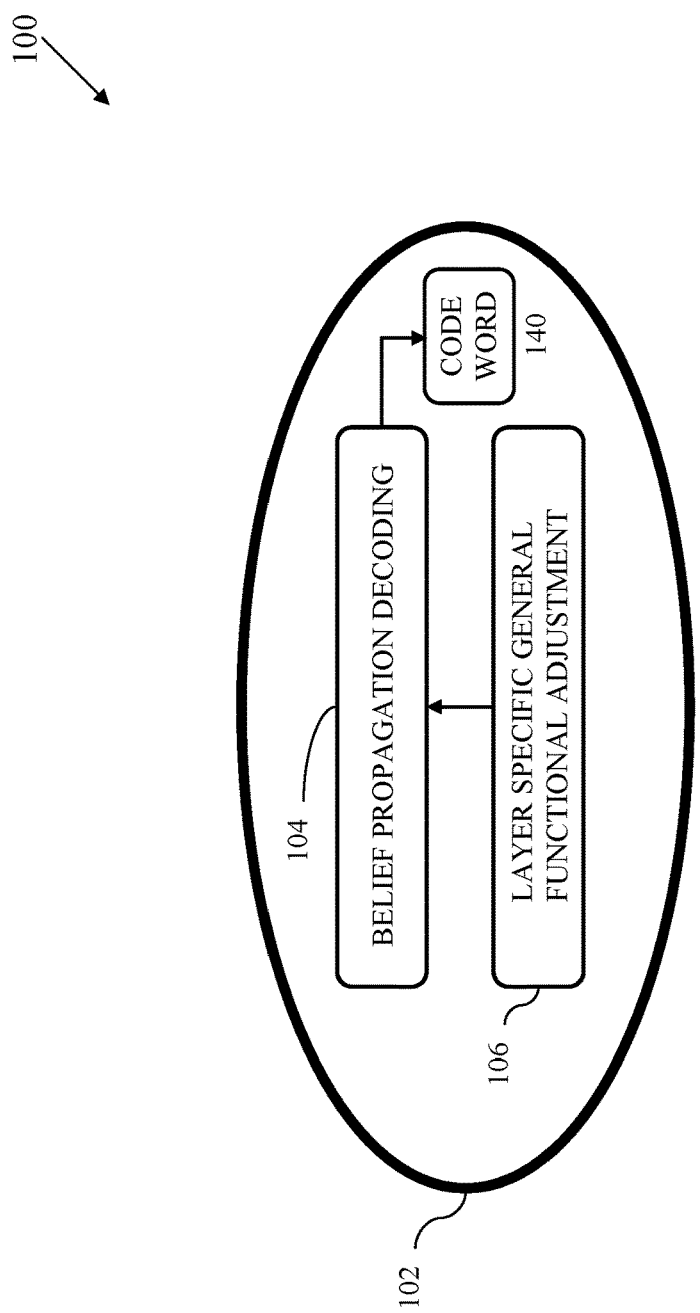
FIG. 1 illustrates generalized layer specific LDPC decoding in accordance with embodiments of the invention.

FIG. 1 illustrates, generally at 100, generalized layer specific LDPC decoding using embodiments of the invention. With reference to FIG. 1, layer specific LDPC decoding using BP is indicated at 102. The decoding paradigm illustrated at 102 is the combination of BP decoding 104 in communication with a layer specific functional adjustment 106 that is applied to the BP decoding 104 layer-by-layer resulting in a code word 140. The BP decoding 104 is either a direct application of belief propagation itself or an approximation to belief propagation, with an algorithm generally such as MIN SUM, FFT-SPA, etc. as described below. As used in this description of embodiments, the term "functional adjustment" is used synonymously with the term "attenuation factor" or "attenuation coefficient." Likewise the term functional adjustment matrix is used synonymously with the term "attenuation factor matrix."

In the operation of a stored channel utilizing LDPC encoding, original data are stored in a non-volatile memory. Different noise sources estimated as White Gaussian Noise (AWGN) Channel corrupt the original stored message resulting in a one becoming a zero or vice versa. To improve the bit error rate (BER), the solid state disk (SSD) write controller may include an LDPC encoder which multiplies an information bit vector with a generator matrix G of the LDPC code. The output of the encoder is then stored in a nonvolatile memory system. During the read operation, the nonvolatile memory system provides the stored codewords to an LDPC decoder which performs the LDPC decoding process.

In various embodiments, the nonvolatile memory system used in the communication system may be a NAND-based flash memory system. However, embodiments of the invention are not limited to NAND-based flash memories. In the description that follows, NAND-based flash memory systems are used by way of example and no limitation is implied thereby. Various mechanisms may lead to bit errors in flash memories, including noise at the power rails, voltage threshold disturbances during the reading and/or writing of neighboring cells, retention loss due to leakage within the cells and tunneling. Error correction codes (ECC) are commonly employed in flash memories to recover stored data that is affected by such error mechanisms. In operation, ECC supplements the user data with parity bits that store enough extra information for the data to be reconstructed if one or more of the data bits are corrupted. Generally, the number of data bit errors detectable and correctable in the data increases with an increasing number of parity bits in the ECC. In many memory devices, data is stored in a memory location of the memory device along with the ECC for the data. In this way, the data and the ECC may be written to the memory location in a single write memory operation and read from the memory location in a single read memory operation. ECC is typically implemented in the flash memory controller.

NAND flash memories are based on floating gate storage. In floating gate storage technologies, two logic states are achieved by altering the number of electrons within the floating gate. The difference between the two logic states (1 and 0) is on the order of few electrons and is decreasing as the floating gate storage technology advances. The decreasing number of electrons responsible for the difference between the two logic states results in an increased probability of errors in the flash memory cell requiring more error correction. The fraction of data bits that are known to be corrupted, and therefore contain incorrect data, before applying the ECC is referred to as the raw bit error rate (RBER). As a result of the advances in the floating gate storage technology, the RBER for a flash page of memory cells is increasing and at technologies with feature sizes in the 1× range (below 20 nm) is nearing the Shannon Limit of the communication channel. The increased probability of errors in the stored data results in an increase in the error code correction necessary to correct the bit errors in the flash memory. The error rate observed after application of the ECC is referred to as the uncorrectable bit error rate (UBER). The acceptable UBER is often dependent upon the application in which the SSD is employed. In the case of price sensitive, consumer applications, which experience a relatively low number of memory accesses during the SSD product lifetime, the SSD may tolerate a higher UBER as compared to a high-end application experiencing a relatively high number of memory accesses, such as an Enterprise application.

To achieve an acceptable UBER for Enterprise applications employed in a flash storage controller, low-density parity-check (LDPC) error correction coding is commonly used. An LDPC code is a linear error correcting code having a parity check matrix with a small number of nonzero elements in each row and column. LDPC codes are capacity-approaching codes that allow the noise threshold to be set very close to the Shannon limit for a symmetric, memoryless channel. The noise threshold defines an upper bound for the channel noise, up to which the probability of lost information can be made as small as desired.

Figure 2:
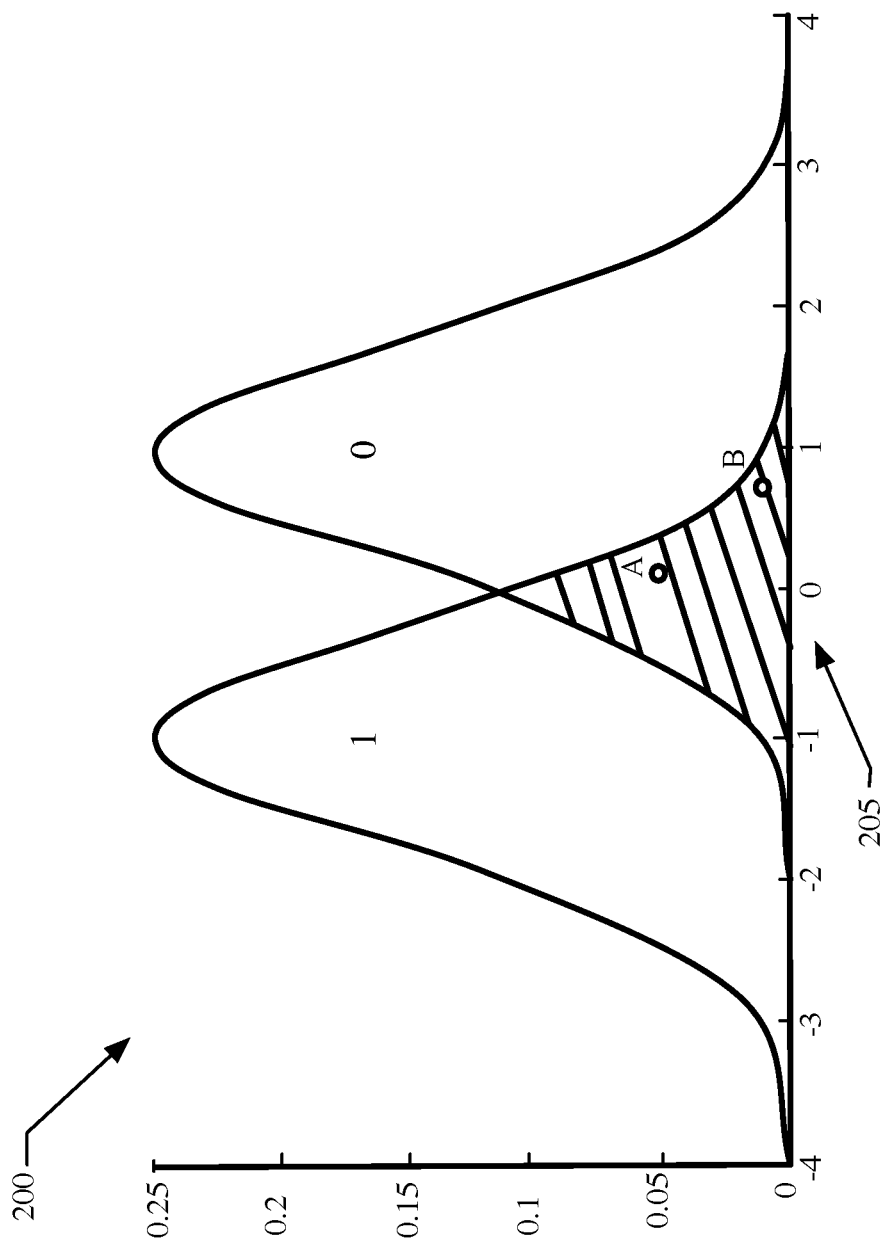
FIG. 2 is graphical illustration of the distribution overlap in the two voltage distributions used for decoding, in accordance with embodiments of the invention.

FIG. 2 illustrates, generally at 200, a graphical illustration of the distribution overlap in the two voltage distributions used for decoding according to embodiments of the invention. The power of LDPC codes resides in the ability of the decoding strategy to exploit the soft information on the stored data. With reference to FIG. 2, in LDPC decoding, the two voltage distributions represent the two possible states: "0" and "1," of the cells within the NAND chips. When the voltage distributions overlap 205, as shown with reference to the graph 200 of FIG. 2, errors arise. A hard decision decoder will read all the positive values as 0 and all the negative values as 1. So, in the situation depicted in the graph 200, the overlap region 205 will be composed of read errors. However, observing error points A and B within the overlap region 205, it is clear that the error points may vary in magnitude. For example, point A is slightly positive, while point B is farther away from zero. As such, point B is considered to be much less in error than point A. By exploiting the exact value of point A and point B, differentiation can be used between the two points and better information can then be provided to the decoder, resulting in improved decoding performance of the decoder in decoding the LDPC encoded codewords. Estimations of the exact value of point A and point B are referred to as soft information, which may be expressed, in some embodiments by a log likelihood ratio (LLR) in the LLR domain. In other embodiments, decoding can proceed for example in the hyperbolic tangent domain (also known as the soft bit domain). In the hyperbolic tangent domain messages have a fixed range of (−1, +1). When the (−1, +1) range is linearly quantized it is equivalent to finer quantization of small valued LLR messages and coarser quantization of large valued LLR messages, thus non-linear quantization of LLR range. With non-linear LLR quantization, a larger LLR range can be represented with fewer bits of precision. In the following description, examples are given in the LLR domain but the reader will note that alternative formulation is readily accomplished in other domains and embodiments of the invention are not limited to the LLR domain. The read errors are not binary in nature, but instead vary from an ideal voltage according to an analog function. LDPC decoders have the ability to address this non-binary behavior using LLRs. The LLR attributed to a bit is representative of the probability that the voltage value read corresponds to a 0 or a 1. In the case of a NAND chip exhibiting a low noise case, a corresponding low raw bit error rate (RBER) will exist wherein most LLRs will have a large magnitude, while only a few LLRs will have a small magnitude.

LDPC decoding is performed based upon a parity check matrix which consists of "0"s and "1"s that define the parity check equations. An M×N parity check matrix (H) comprises M rows and N columns. The number of columns N corresponds to the number N of codeword bits within one encoded codeword and the codeword comprises a plurality of information bits (K) and M parity check bits. The number of rows in the parity check matrix corresponds to the number M of parity check bits in the codeword.

The decoding of the LDPC codes is an iterative process that uses as input, in some embodiments, the LLR of the received data bits in the codeword, as in the equation:

$$LLR(x) = \log\left[\frac{p(x \mid y = 0)}{p(x \mid y = 1)}\right]$$

where "x" is the read message and "y" is the original codeword. When performing decoding of the codeword, the LLRs are propagated and updated between the variable nodes and the check nodes in a Tanner graph that is representative of the parity check matrix of the LDPC code.

Figure 3B:
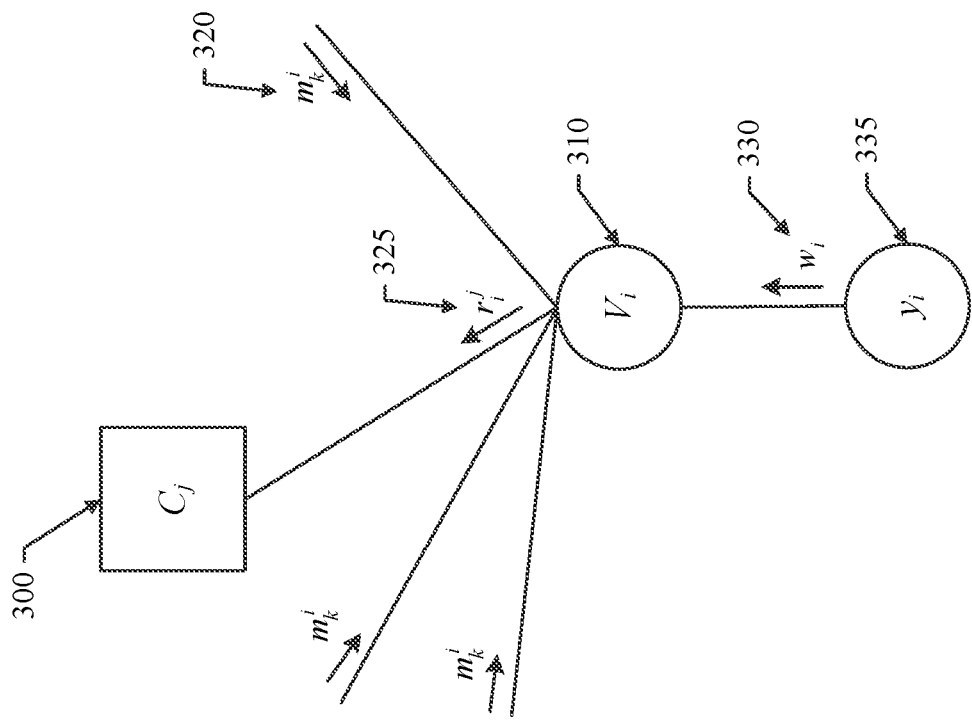
FIG. 3B is a diagram illustrating variable node processing within an LDPC parity check matrix, in accordance with embodiments of the invention.
Figure 3A:
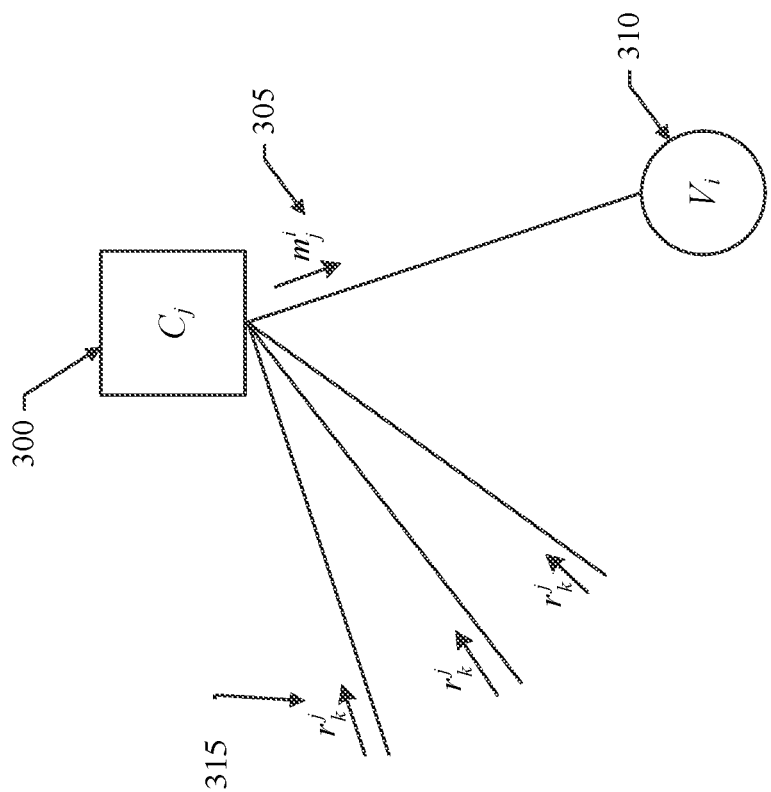
FIG. 3A is a diagram illustrating check node processing within an LDPC parity check matrix, in accordance with embodiments of the invention.

FIG. 3A is a diagram illustrating check node processing within an LDPC parity check matrix, in accordance with embodiments of the invention and FIG. 3B is a diagram illustrating variable node processing within an LDPC parity check matrix, in accordance with embodiments of the invention. With reference to FIGS. 3A-B, it is useful to think of the parity check matrix used for LDPC decoding in terms of its equivalent Tanner graph. A Tanner graph is a bipartite graph used to state constraints or equations that specify error correcting codes. In a Tanner graph representative of the parity check matrix, there are M=N−K check nodes C, one check node for each check equation, and N variable nodes, one variable node for each codeword bit. During the decoding process, the M check nodes and N variable nodes iteratively exchange information between themselves according to the LDPC decoding algorithm. The "1"s in the parity check matrix determine the connections between the check nodes and the variable nodes. Iterative information exchange is performed only between the check nodes and the variable nodes that are connected to each other as defined in the parity check matrix.

In the check node processing phase of the decoding as illustrated in FIG. 3A, each check node ($C_j$) 300 computes values ($m_j^i$) 305 to be sent to the variable nodes ($V_i$) 310 to which the check node 300 is connected as defined by the parity check matrix. Each time the check node 300 computes the value 305, only extrinsic information is taken into account. In other words, the value $m_i$ is computed using all the values sent by the variable nodes connected to that check node $r_k^j$ 315, except variable node i, according to the following formulas:

$$m_j^i = \prod_{k \in N(j) \setminus \{i\}} \text{sign}(r_k^j) \cdot \phi\left(\sum_{k \in N(j) \setminus \{i\}} \phi(|r_k^j|)\right)$$

$$\phi(x) = -\log\left(\tanh\left(\frac{x}{2}\right)\right)$$

A similar concept is applied to variable node processing in accordance with the parity check matrix as shown with reference to FIG. 3B. In variable node processing, the value $r_j$ 325, representing the codeword estimate, is computed using all the values $m_k^i$ 320 sent by the check nodes connected to the variable node 310, except check node j 300 and the input LLRs 330 read from the NAND cells 335, according to the following formula:

$$r_j^i = w_i + \sum_{k \in N(i) \setminus \{j\}} m_k^i$$

Following every iteration of the check node processing and variable node processing steps, the resulting codeword estimate (r) is checked to verify that it is a codeword by multiplying it by the transpose of the parity check matrix (H). If the result is null, then r is a considered a codeword and the decoding is complete. If the result is not null, then the decoding is not considered complete and a new iteration is started.

The message passing computation rule procedure as described above is referred to as a belief propagation (BP) computation rule and is also commonly known as the sum-product algorithm (SPA). Both terms are used synonymously herein and are referred to as BP or SPA. While the sum-product algorithm is known to achieve the best decoding performance, it is computationally complex. The formula used in check node processing following the sum-product algorithm is a very complex formula involving both the tan h and the log function which can be difficult to implement in hardware necessary to compute the check node formula. The computational complexity of the SPA necessitates a decoding device having a large number of logic gates, resulting in an increased cost and decreased power efficiency of the device. As such, in some situations it is desirable to use an approximation to BP as described below.

In the sum-product algorithm, the ϕ function produces a very large result for small values of x (read messages) and a very small result for large values of x (read messages). In general, as x approaches zero, ϕ(x) approaches infinity and as x increases from zero, ϕ(x) rapidly decreases in value.

When a check node receives the extrinsic information it operates on, the majority of the information will have originated from reasonably reliable sources, because most of the variable nodes associated with the check node will have large LLR magnitudes, representing a high probability that the message read from the memory is the original codeword that was stored. When only a small amount of noise has affected the stored bits, and as such the raw bit error rate (RBER) is low, the majority of LLRs will tend to have a large magnitude, while only a few LLRs will have a small magnitude. For example, at a raw bit error rate (RBER) of 1e-3, an average of only 1 in 1000 bits is in error. As such, the extrinsic information operated on by the check nodes will have large LLR magnitudes except for the check nodes that process bits that are in error. However, even in the case where the check node is processing bits that are in error, it is likely that only 1 of the extrinsic sources for that particular check node has a small LLR magnitude. The small LLR magnitude of that one extrinsic source will have the greatest effect on the ϕ function, as previously discussed. As a result of the complexity of the sum-product algorithm, and the assumption that the smallest extrinsic value approximates all extrinsic values received by a check node, approximated decoders utilizing various algorithmic approximations to the sum-product algorithm (BP) are developed. One such algorithmic approximation, as described below, is a min-sum algorithm (MSA).

Figure 4:
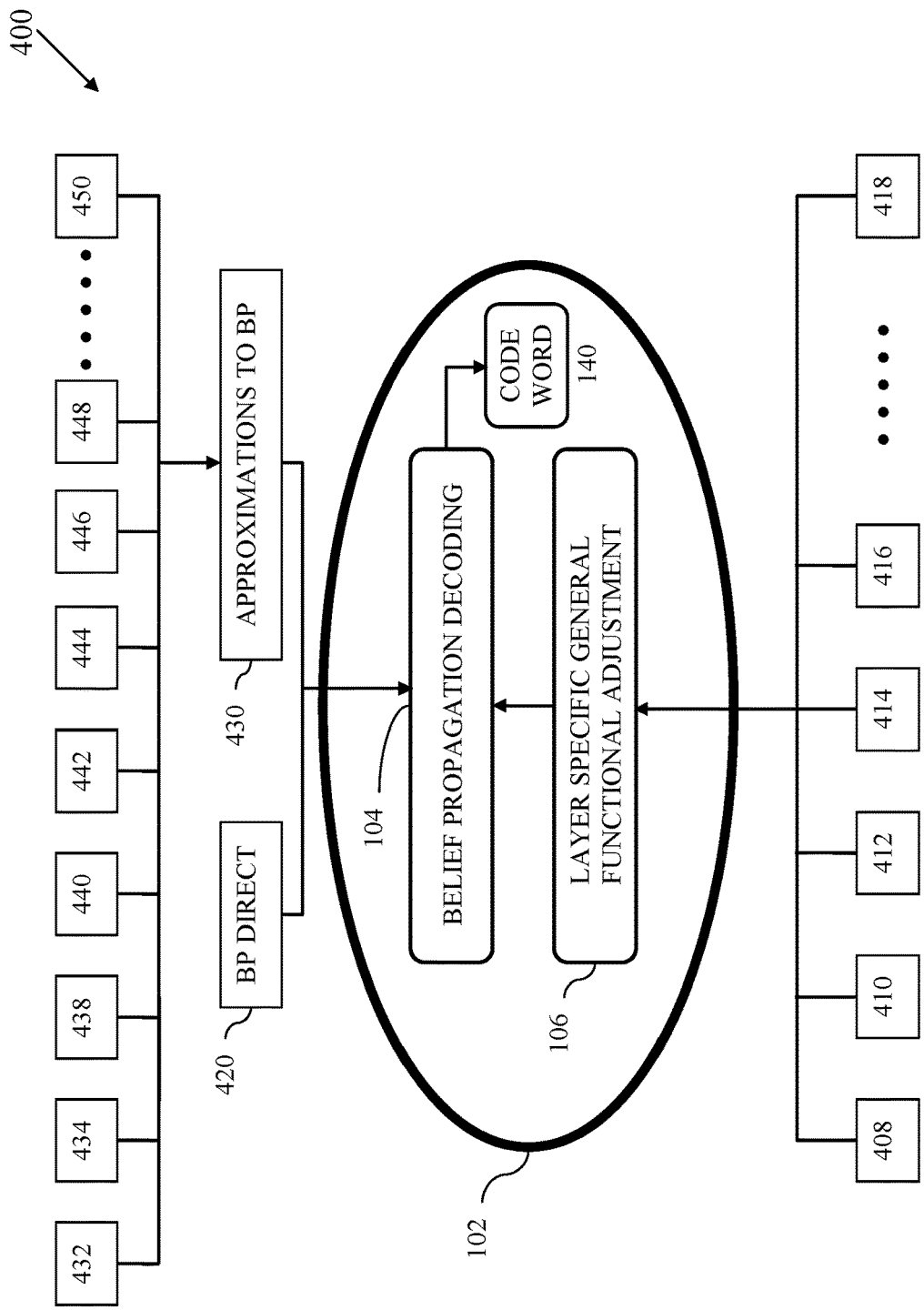
FIG. 4 illustrates generalized layer specific functional adjustment of layer scheduled belief propagation (BP) decoding, in accordance with embodiments of the invention.

FIG. 4 illustrates, generally at 400, generalized layer specific functional adjustment of layer scheduled belief propagation (BP) decoding, in accordance with embodiments of the invention. With reference to FIG. 4, the decoding paradigm 102 forms a decoding framework from which a variety of decoding methods are obtained by selection of one or more layer specific functional adjustments applied to either BP directly or to an algorithm used to approximate BP. The layer specific functional adjustment 106 is applied during the decoding occurring in 104 on a layer-by-layer basis, on an iteration number basis, and in some cases on a partial layer basis.

The layer specific BP decoding in 104 is either a direct implementation of BP as indicated at 420 or it is an approximation to BP as indicated at 430. When a functional adjustment is applied to BP directly it is referred to herein as a BP improvement or a BP approximation in that often faster convergence times are realized during decoding. The terms "direct application of BP" and "BP improvement" are used synonymously in this detailed description of embodiments.

Within 420, according to various embodiments, many configurations of BP are possible. For example, combining a layer specific functional adjustment 106 using either 408 or 410 with 420 applied to the layer specific belief propagation decoding 104 is representative of normalized BP decoding where a BP check node result is either divided (408) or multiplied (410) by a functional adjustment which is an attenuation factor. (408 and 410 are described more fully below). Alternatively, 408 or 410 can multiply or divide the check node by a functional adjustment which is an amplification factor. Normalized BP decoding is described more fully below in conjunction with the figures that follow. Another example is combining a layer specific functional adjustment 106 using either 412 or 414, which is representative of offset BP decoding where a functional adjustment is made with a parameter that is used to obtain a quantity that is either subtracted (412) or added (414) during a check node calculation occurring in 104. Without limitation, 416 can represent any mathematical function that is used in various embodiments to provide a layer specific general functional adjustment at 106. Yet another example is a user defined modification of BP decoding 420 where a user defined functional adjustment 418 is applied to BP decoding 420 during the decoding occurring in 104 on a layer-by-layer basis. Thus, several examples of such improvements of BP are given herein. These examples are provided for illustration and do not limit embodiments of the invention thereto. Embodiments of the invention may be applied to BP improvements that have not been disclosed herein but are within the scope of this teaching of application of layer specific functional adjustments in 400.

In similar fashion, like application of layer specific functional adjustments to BP directly, layer specific functional adjustments are applied to any algorithm used to approximate BP. The general group of all approximations to BP wherein a functional adjustment is applied during the decoding occurring in 104 on a layer-by-layer basis is represented by 430. Some non-limiting examples of members of the group 430 are given by 432, 434, 438, 440, 442, 444, 446, 448, and 450. Within 430, according to various embodiments, any approximation of BP is possible. For example, 432 is representative of an approximation to BP decoding where a MIN SUM algorithm is used. The MIN SUM algorithm is described below in the figures that follow. In another example, 434 is representative of an approximation to BP decoding where a FFT-SPA or Log FFT algorithm is used. The FFT-SPA or Log FFT algorithm is described below in the figures that follow. Another example is 438, which is representative of an approximation to BP decoding where an APPROXIMATE MIN* algorithm is used. The APPROXIMATE MIN* algorithm is described below in the figures that follow. Yet another example is 440, that is representative of an approximation to BP decoding where a RICHARDSON/NOVICHKOV algorithm is used. The RICHARDSON/NOVICHKOV algorithm is described below in the figures that follow. Another example is 442, which is representative of an approximation to BP decoding where a BIT FLIPPING algorithm is used. The BIT FLIPPING algorithm is described below in the figures that follow. Yet another example is 444, which is representative of an approximation to BP decoding where a GAUSS-SIEDEL algorithm is used. The GAUSS-SIEDEL algorithm is described below in the figures that follow. Another example is 446, which is representative of an approximation to BP decoding where an ITERATIVE MAJORITY LOGIC algorithm is used. The ITERATIVE MAJORITY LOGIC algorithm is described below in the figures that follow. Yet another example is 448, which is representative of an approximation to BP decoding where a SPLIT ROW DECODING algorithm is used. The SPLIT ROW DECODING algorithm is described below in the figures that follow. Another example is 450, which is a user defined algorithmic approximation of BP decoding where a user defined algorithm is applied during the decoding occurring in 104 on a layer-by-layer basis. Thus, several non-limiting examples of approximations to BP are given herein. These examples are provided for illustration and do not limit embodiments of the invention thereto. Embodiments of the invention may be applied to algorithms that approximate BP decoding which have not been disclosed herein but are within the scope of this teaching of application of layer specific functional adjustments in 400.

Each of the approximations to BP, i.e., 430 through 450 can be used with one or more of the functional adjustments 408 through 418 in a general way. In the description that follows below, some combinations are specifically described for illustration, such as for example OFFSET MIN SUM, TWO-STEP MIN SUM, NORMALIZED TWO STEP MIN SUM, etc. However, these specific combinations do not limit embodiments of the invention thereto. Likewise, direct application of BP 420 can be used with one or more of the functional adjustments 408 through 418. In the description that follows below, some combinations are specifically described for illustration, such as for example NORMALIZED BP and OFFSET BP. However, these specific combinations do not limit embodiments of the invention thereto.

Functional Adjustments

As described above, within the decoding paradigm of 102 a layer specific functional adjustment 106 is applied to the BP decoding, synonymously referred to herein in various ways such as an attenuation matrix, an attenuation factor(s), a normalization factor(s), etc. In various embodiments, functional adjustments are applied by layer and by iteration during the decoding process. Thus, a set of functional adjustments for a decoder can be conceptualized as a matrix of parameters where the rows of the functional adjustment matrix correspond to the layers of the parity check matrix (H), where, in general, a layer may be considered the largest number of rows of the matrix (H) that never connects a variable node to multiple check nodes. Layers are described more fully below in the discussion that follows. The columns of the functional adjustment matrix correspond to the iteration number. Thus, a specific layer at a specific iteration provides one or more parameters that are used to provide a specific functional adjustment during the decoding.

The layer specific functional adjustment 106 is made with one or more parameters that are applied during the decoding process to modify the decoding process so that the process converges on a codeword more rapidly than would otherwise result without application of the functional adjustment. In some embodiments, the functional adjustment is an attenuation parameter, indicated at 408, which is multiplied by a check node computation thereby reducing a check node message value throughout a layer during decoding. Such an attenuation parameter can have a value of less than one, indicated at 408 or a value greater than one, indicated at 410. In other embodiments, the functional adjustment is a parameter which is subtracted, indicated at 412, to the check node computation within a layer. In other embodiments, the functional adjustment is a parameter that is added, indicated at 414, to the check node computation within a layer. In yet other embodiments, a functional adjustment is one or more parameters which are used to specify a function, in non-limiting examples, such as the logarithmic function "Log" or "ln," indicated at 416, which is used in combination with an input to compute a parameter which is then applied as the functional adjustment during the check node processing within a layer.

For example, a first parameter can indicate a function such as Log and a second parameter can identify a coefficient that is used to modify the argument of the Log function. In some embodiments the argument of the Log function is related to a message value(s) occurring in the processing of a previous layer and the second parameter is a coefficient which is multiplied times the argument of the Log function, in some cases reducing the magnitude of the argument of the Log function thereby. Alternatively the first parameter can be used to identify a different function for a different layer of the functional adjustment matrix. For example, in layer one the Log function is specified by the first parameter; in layer two the "tan h," function is specified by the first parameter, etc. In yet other embodiments, a functional adjustment is a combination of parameters which are both multiplied and added or subtracted during check node processing within a layer, thus combing any of the functional adjustments as dictated by 408, 410, 412, 414, 416 through 418, where 418 is a user defined functional adjustment. Thus, several non-limiting examples of functional adjustments are given herein. These examples are provided for illustration and do not limit embodiments of the invention thereto. Embodiments of the invention may be applied to functional adjustments that have not been disclosed herein but are within the scope of this teaching of application of layer specific functional adjustments in 400.

Functional adjustments can be conceptualized as originating with parameters of a functional adjustment matrix such as illustrated in FIG. 5 and in FIG. 6 below or functional adjustments can be conceptualized as originating with parameters that are stored in a section of memory where certain values which are stored in memory are used with certain layers of the parity check matrix (H) that is associated with a codeword during decoding. Thus, the term "functional adjustment matrix" is only used to illustrate the association of the functional adjustment parameters with the layers of the parity check matrix (H). No limitation is implied by the use of the term "matrix" with the functional adjustment parameters. In some embodiments, it is convenient to store the functional adjustment parameters in a lookup table(s) for use during decoding.

To increase the decoding performance of the LDPC decoder, the unique functional adjustment parameter per layer is used to correctly approximate the check node computation at each layer, and per iteration according to various embodiments of the invention. Utilizing the layer specific functional adjustment parameters, the decoding performance of a standard min-sum LDPC decoder can be improved, as well as other decoders based on other approximations to BP or a decoder utilizing BP decoding can be improved. In a particular embodiment, the layer specific functional adjustment parameters (attenuation factors) are calculated during the design process of the decoder. The layer specific attenuation factors are stored in a lookup table or matrix. During the design process, various lookup tables are populated with layer specific attenuation factors based upon a specific bit error rate (BER), a layer, iteration number, and a code rate. In operation, during the LDPC decoding process, the bit error rate (BER) is estimated and a pointer points to the appropriate lookup table or matrix based upon the estimated BER. The layer specific functional adjustment parameters in accordance with the present invention may be implemented utilizing a matrix as illustrated with reference to FIG. 5 or FIG. 6.

The error performance of the LDPC decoder is improved by using an iterative layered decoding technique which achieves a faster decoding convergence due to the improved scheduling of the messages, referred to herein as layered scheduling.

Layered Scheduling

In layered scheduling for LDPC BP decoding, the iterative decoding process is performed layer-by-layer. The parity-check matrix may be viewed as group of horizontal layers, each horizontal layer representing the check nodes for one layer. In layered scheduling, once the processing has been completed for all the check nodes of a first layer, the processing may immediately switch to the variable node processing. In this way, the computations for the check nodes of the second layer utilize inputs that are more likely to have more reliable LLRs as compared to the initial values utilized in the computations of the first layer. As such, in layered LDPC BP decoding, after the check nodes complete the algorithm for the variable nodes they are connected to in the first layer, these variable nodes are updated and the check nodes utilize these updated messages to complete the algorithm for the second layer.

In various embodiments of the present invention, the concept of layered scheduling is applied to belief propagation to create a layered belief propagation decoding method. In one or more embodiments, once this method has been created, a unique functional adjustment layer-per-layer is computed as the ratio between the average value in check node processing belonging to each layer computed with the layered belief propagation decoding method and the average value in check node processing belonging to each layer computed with an algorithmic approximation to belief propagation as the decoding method. The present invention recognizes that with many approximations to belief propagation, such as in normalized layered min-sum LDPC decoding, the first time a variable node is updated, i.e. first layer, is the most significant step toward a converging result. As such, the BP approximation calculation for the first layer will therefore tend to have more small-valued extrinsics at the check nodes than the BP approximation calculation for the second layer. Due to the larger number of small-valued extrinsics present in the BP approximation calculation for the first layer, the final $\phi$ result for the min-sum (or some other approximation to BP) calculation for the first layer will tend to be larger than the sum-product algorithm would have calculated utilizing the real $\phi$ function. Therefore, the first layer in the layered BP approximation for the LDPC decoding should be attenuated more than the following layers. As follows, the BP approximation calculation for the second layer will tend to have fewer small-valued extrinsics because the largest step to convergence was already taken in the first layer. As such, the final $\phi$ result of the second layer will tend to be closer to the real $\phi$ result of the sum-product algorithm and therefore, should be attenuated to a lesser degree. In general the functional adjustment of the layer is most critical when the convergence is taking the largest steps towards convergence, i.e. when the number of small-valued extrinsics is large. As the number of small-valued extrinsics decreases through the processing of the layers, the functional adjustment should be reduced to more closely approximate the real $\phi$ function of the sum-product algorithm.

Figures 5A, 5B:
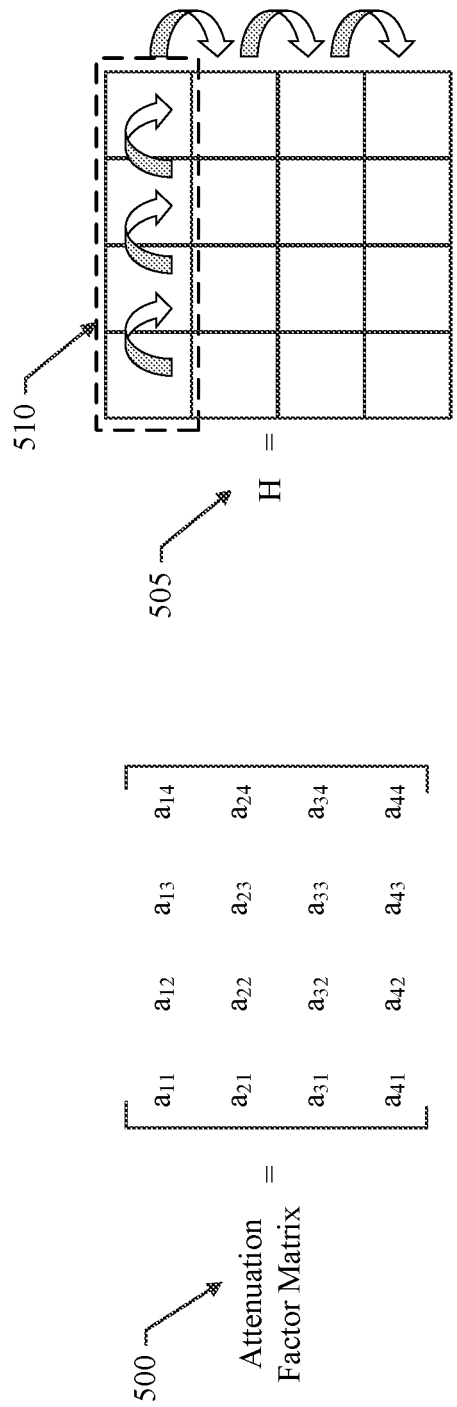
FIG. 5A is an illustration of the attenuation factor matrix in accordance with embodiments of the present invention.
FIG. 5B is an illustration of the message passing between the rows and column of the parity check matrix in accordance with embodiments of the invention.

In the exemplary embodiment illustrated in FIG. 5B, a parity check matrix (H) 505 may comprise 4 layers, wherein a layer 510 may be equivalent to one circulant row for a quasi-cyclic LDPC code having a circulant row weight equal to "1", meaning that only one "1" appears in any row or any column of the matrix (H). In another embodiment, when the weight of a circulant row is greater than "1," a layer may be smaller than a circulant row. As such, it is within the scope of the present invention that there may be multiple layers in a circulant row of the matrix (H) if the weight of the circulant row is greater than "1." In general, a layer may be considered the largest number of rows of the matrix (H) that never connects a variable node to multiple check nodes. In the present invention, a layer is the ideal granularity, offering the most precise level of attenuation control. As such, any attenuation control at a granularity less than a layer does not result in any mathematical advantage.

FIG. 5A is an illustration of the attenuation factor matrix in accordance with embodiments of the present invention. FIG. 5B is an illustration of the message passing between the rows and column of the parity check matrix in accordance with embodiments of the invention. With reference to FIG. 5B, an attenuation factor matrix 500 of FIG. 5A may be used to establish an attenuation factor for each layer 510. The attenuation factors may be dependent upon the iteration count and if a codeword requires more than 4 iterations to achieve decoding, the attenuation factor of the fourth iteration may be used. As illustrated by the attenuation factor matrix 500, a coefficient $\alpha_{rs}$ is identified for every iteration and every layer, where r is the iteration number of the decoding process and s is the layer number in the decoding process. Utilizing a specific attenuation factor per layer allows for correctly approximating the check node computation for each layer and results in improved decoder performance. The layer specific attenuation factor may be a small positive number determined by density evolution. In a particular embodiment, the attenuation factor for each layer may be determined via simulations by comparing the layered approximation to BP, e.g., the layered min-sum algorithm for the layer with a layered belief-propagation (BP) algorithm. The average ratio between the results of these two algorithms may be the attenuation factor for that particular layer.

Figure 6:
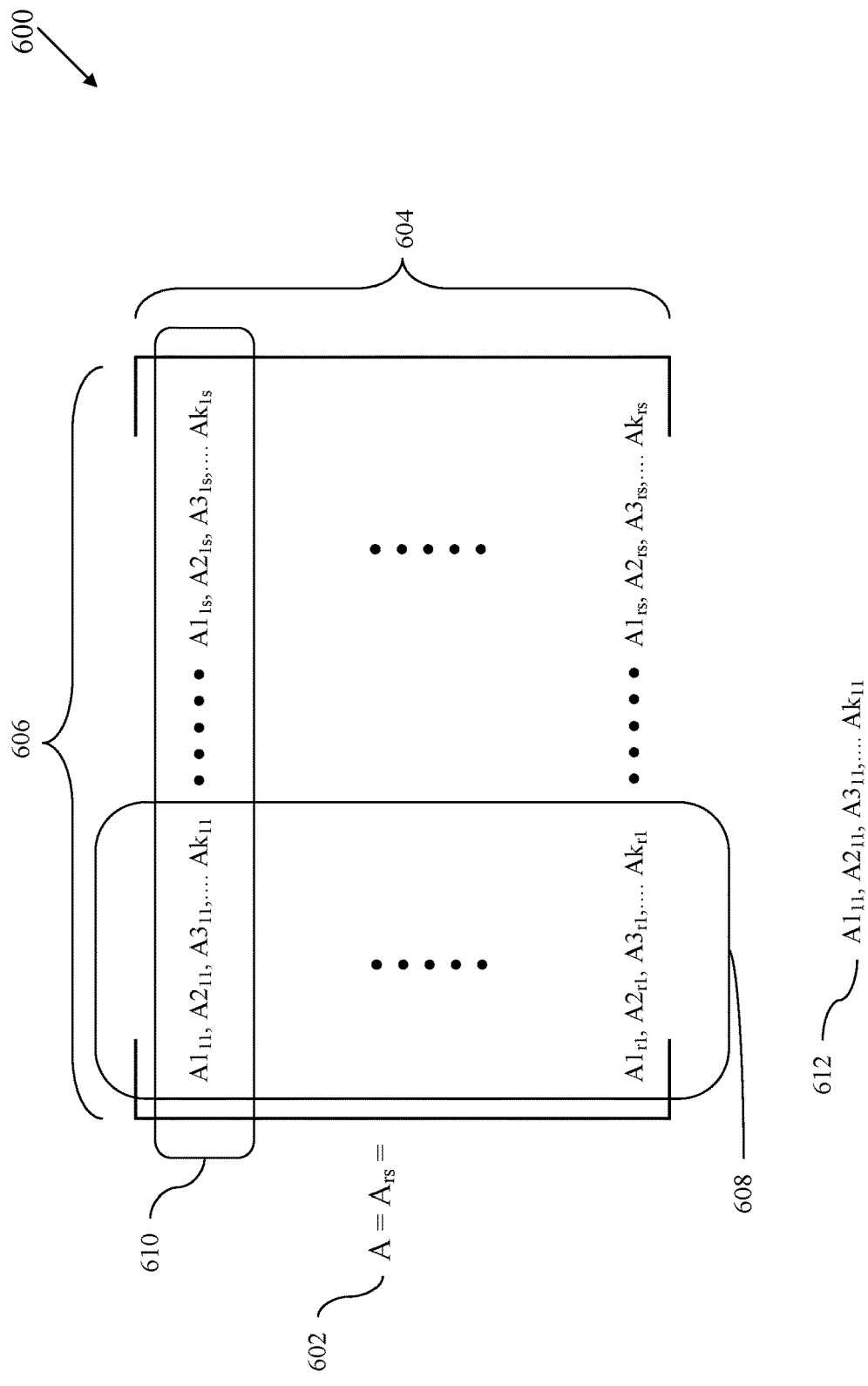
FIG. 6 illustrates multiple functional adjustment parameters in a given layer in accordance with embodiments of the invention.

FIG. 6 illustrates, generally at 600, multiple functional adjustment parameters used in a given layer in accordance with embodiments of the invention. With reference to FIG. 6, a functional adjustment matrix 602 has rows 604 and columns 606. Where a column of parameters 608 can represent all of the functional adjustment parameters used in a layer during successive iterations and each row (e.g. 610) represents the functional adjustment parameters used for each layer during a particular iteration. Other schema can be used to store the parameters used for the functional adjustments and no limitation is implied by the use of a matrix to organize the parameters in FIG. 6 or elsewhere herein.

For each layer and for each iteration, a general number of parameters "k" are used to provide the layer specific functional adjustment. At 612, the parameters for the first row 610 and first column 608 are illustrated as A1 through Ak. Note that in some instances, only one parameter is used and in other instances more than one parameter is used. In some embodiments, one or more parameters have the value of zero. In some embodiments, one or more parameters represent a threshold value which is used to establish whether a functional adjustment is applied to that specific layer in a given iteration or not. Thus, within the embodiments described herein, a general functional adjustment is applied to a layer specific general approximation to BP or to an improvement of BP during LDPC decoding.

Approximations to Belief Propagation (BP)

Min Sum Decoding, Offset Min Sum Decoding, Two-Step Min Sum Decoding and Normalized Two-Step Min Sum Decoding As a result of the complexity of the sum-product algorithm, and the assumption that the smallest extrinsic value approximates all extrinsic values received by a check node, approximated decoders utilizing a min-sum algorithm (MSA) have been developed where the φ function is computed as a minimum among the magnitudes of a set of values according to the formula:

$$m_j^i = \prod_{k \in N(j)\setminus\{i\}} \operatorname{sign}(r_k^j) \cdot \min_{k \in N(j)\setminus\{i\}} |r_k^j|$$

However, since utilizing this formula yields an approximation to the full sum-product algorithm (SPA), an attenuation, or normalization, factor (α) is introduced into the MSA computation as:

$$m_j^i = \alpha \cdot \prod_{k \in N(j)\setminus\{i\}} \operatorname{sign}(r_k^j) \cdot \min_{k \in N(j)\setminus\{i\}} |r_k^j|$$

In the normalized min-sum algorithm, the complicated computation of the tan h function and the log function are replaced with a simple minimum value finding operation at the cost of decoding performance. The loss of decoding performance is then recovered by applying a normalizing factor or attenuation factor to the check node processing outputs to improve the error performance.

For example, assuming a typical low noise situation wherein one small magnitude LLR and three larger magnitude LLRs are received as a series of four extrinsics as 0.1, 3, 3 and 3. The associated φ(x) for these received extrinsics would be 3.00, 0.01, 0.01 and 0.01, respectively, then the sum of the 0 values for these extrinsics would be equal to 3.03 and the φ of the sum would be equal to about 0.1. The min-sum estimate would also result in a value of 0.1 by ignoring the last three LLRs (3, 3, 3) and considering only the first LLR (0.1). As such, in a low noise situation the assumption can be made that the smallest extrinsic value approximates all extrinsic values received by a check node and the min-sum algorithm will provide a close approximation without requiring any additional attenuation. In general, very little attenuation is required in a low noise situation.

In contrast, in a higher noise situation wherein a series of four received extrinsics are 0.1, 1, 1 and 1, the sum of the φ of the received extrinsics is 3+(3*.77)=5.3 and φ(5.3) is equal to 0.01, the output of the check node processing utilizing SPA would be 0.01. However, utilizing the min-sum approximation, the output of the check node processing would be equal to 0.1, which is not a close approximation to the SPA result. As such, in a higher noise situation, the min-sum result will require greater attenuation to more closely approximate the SPA result. In general, attenuating the min-sum result when there is more noise tends to increase the accuracy of the approximation towards the correct check node result.

While in the case of low RBER the min-sum approximation closely approximates the sum-product algorithm (SPA), in the case of high RBER, the approximation may not resemble the sum-product algorithm because the assumption that only 1 extrinsic is small may not be accurate. As such, in the case of high RBER, the min-sum check node calculation may be a poor approximation to the real $\phi$ function result of the sum-product algorithm (SPA). In the case of high RBER, the full min-sum check node calculation will generate a result that is noticeably larger than the sum of $\phi$ result of the sum-product algorithm, which translates to a higher than optimal estimate of the likelihood of which bits are in error versus which are not in error. As such, at high RBER the min-sum calculation tends to be overly optimistic when compared to the sum-product calculation. Thus, layer specific attenuation factors are applied to the min-sum approximation to improve decoding performance.

The functional adjustment parameters $\alpha$ are established for each layer and for each iteration during the design of a decoder as described above by running simulations which allow bit error rate (BER) to vary, and which take into account certain metrics such as layer number, iteration number, code rate, etc. Different metrics can be used in the simulations used to establish the parameters $\alpha$. The simulations result in values for the parameters $\alpha$ for each layer and for each iteration. These values are available to the decoder during decoding. In non-limiting examples, the values can be conceptualized as a matrix of parameters as shown in 500 (FIG. 5A) or 602 (FIG. 6), which can be stored in one or more look-up tables for use during decoding. In some embodiments, all of the parameters are different in each layer and in each iteration. In other embodiments, at least two parameters are different either per layer or per iteration.

FIG. 7A illustrates, generally at 700, an algorithmic approximation to belief propagation decoding using an OFFSET MIN SUM approximation according to embodiments of the invention. With reference to FIG. 7A, the MIN SUM algorithm for the check node message computation discussed above is illustrated at 702. In the OFFSET MIN SUM approximation to BP a parameter $\beta$ is subtracted from the MIN SUM check node equation 702 resulting in OFFSET MIN SUM check node equation 704. The parameters $\beta$, as indicated at 706, can be visualized as a matrix of values as described above in conjunction with FIG. 5 and FIG. 6.

The functional adjustment parameters $\beta$ are established for each layer and for each iteration during the design of a decoder as described above by running simulations which allow bit error rate (BER) to vary, and which take into account certain metrics such as layer number, iteration number, code rate, etc. Sometimes different metrics are used in the simulations to establish the parameters $\beta$. The simulations result in values for the parameters $\beta$ for each layer and for each iteration. These values are available to the decoder during decoding. In non-limiting examples, the values can be conceptualized as a matrix of parameters as shown in 706, which can be stored in one or more look-up tables for use during decoding. In some embodiments, all of the parameters are different in each layer and in each iteration. In other embodiments, at least two parameters are different either per layer or per iteration.

FIG. 7B illustrates, generally at 730, an algorithmic approximation to belief propagation decoding using a TWO-STEP MIN SUM approximation according to embodiment of the invention. With reference to FIG. 7B, the TWO-STEP MIN SUM algorithm uses the MIN SUM algorithm (e.g., 702 in FIG. 7A) when the signs of the incoming messages into a check node are the same. When the signs of the incoming messages into the check node are not the same, a difference in magnitude between the check nodes is used to compute the check node message.

The following example is used to illustrate the TWO STEP MIN SUM check node computation when the signs of the incoming messages are not the same. For example, two messages are received at a check node, one with a minus sign and the other with a plus sign. The check node message is computed by equation 732. Where the difference in the magnitude of the incoming messages is expressed by variable d. In some embodiments, the function $f(d)$ 734 can be simplified for implementation in hardware circuitry by the relationship shown at 736. In 736, dc is a threshold parameter that the difference in magnitude d is tested against. If d is less than or equal to dc then $-yc$ is used for the approximation of $f(d)$ otherwise zero is used for the approximation. Where the term yc is a constant value that approximates the function $f(d)$ in the range: $0 < d < dc$.

The functional adjustment parameters dc are established for each layer and for each iteration during the design of a decoder as described above by running simulations which allow bit error rate (BER) to vary, and which take into account certain metrics such as layer number, iteration number, code rate, etc. Sometimes more metrics are used and sometimes less metrics are used in the simulations used to establish the parameters dc. The simulations result in values for the parameters dc for each layer and for each iteration. These values are available to the decoder during decoding. In non-limiting examples, the values can be conceptualized as a matrix of parameters as shown in 738, which can be stored in one or more look-up tables for use during decoding. In some embodiments, all of the parameters are different in each layer and in each iteration. In other embodiments, at least two parameters are different either per layer or per iteration.

Note that during the design of the decoder dc values are obtained during simulation as described above. However, during decoding, a check node calculation can be performed with the modified MIN SUM algorithm 732 or the TWO STEP MIN SUM algorithm as described above. Thus, the signs of the messages produced during decoding will determine which direction the decoding will proceed in order to resolve the bit errors.

A method for implementing a TWO STEP MIN SUM algorithm is illustrated in FIG. 7B. The method begins at a block 740. At a block 742 the signs of the messages input to the check node are analyzed, i.e., + or 1 at a block 744. If the signs of the messages are the same, control transfers via 746 to 748 where the messages are calculated with the MIN SUM algorithm with equation 702.

At 744 if the incoming messages have opposite signs, then control transfers via 752 to 754 where the check node messages are calculated with the modified MIN SUM algorithm using equation 732 through 738. Following calculation of check node messages with either 754 or 748 control transfers to 750 where the variable nodes are updated. The process stops at a block 756.

Figure 7C:
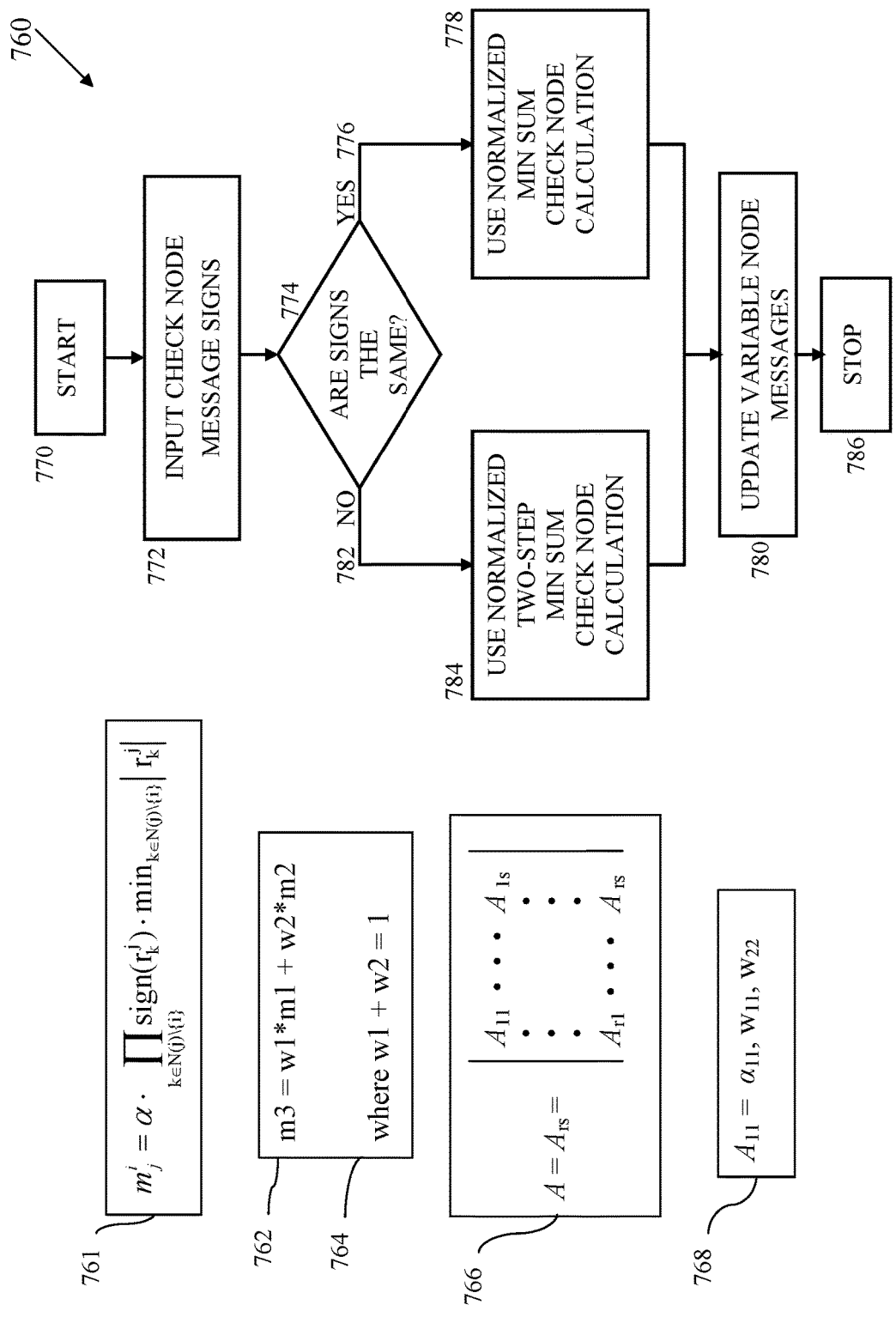
FIG. 7C illustrates an algorithmic approximation to belief propagation decoding using a NORMAILZED TWO-STEP MIN SUM approximation according to embodiments of the invention.

FIG. 7C illustrates, generally at 760, an algorithmic approximation to belief propagation decoding using a NORMALIZED TWO-STEP MIN SUM approximation according to embodiments of the invention. With reference to FIG. 7C, if the signs of the incoming messages into a check node are the same, then the check node calculation is performed using the NORMALIZED MIN SUM approximation as given above and at 761. When the signs of the incoming messages into the check node are not the same, the message is not reliable; therefore the new check node message is computed as a weighted sum of the product of parameters and input message values as shown at 762 with constraint on the parameters as given by 764. In the NORMALIZED TWO-STEP MIN SUM approximation to BP, multiple parameters are used during the functional adjustment that is applied to a given layer in a given iteration. In one or more embodiments, for illustration purposes only, these parameters are shown for the first layer and the first iteration at 768 from a matrix of parameters A given by 766.

The functional adjustment parameters α, w1, w2 are established for each layer and for each iteration during the design of a decoder as described above by running simulations which allow bit error rate (BER) to vary, and which take into account certain metrics such as layer number, iteration number, code rate, etc. Sometimes more metrics are used and sometimes less metrics are used in the simulations used to establish the parameters α, w1, w2. The simulations result in values for the parameters α, w1, w2 for each layer and for each iteration. These values are available to the decoder during decoding. In non-limiting examples, the values can be conceptualized as a matrix of parameters as shown in 766, which can be stored in one or more look-up tables for use during decoding. In some embodiments, all of the parameters are different in each layer and in each iteration. In other embodiments, at least two parameters are different either per layer or per iteration.

Note that during the design of the decoder, the parameter, i.e., α, w1, and w2 values are obtained during simulations as described above. However, during decoding, a check node calculation can be performed with the NORMALIZED MIN SUM algorithm 761 or the NORMALIZED TWO-STEP MIN SUM algorithm as described above. Thus, the signs of the messages produced during decoding will determine which direction the decoding will proceed in order to resolve the bit errors.

A method for implementing a NORMALIZED TWO STEP MIN SUM algorithm is illustrated in FIG. 7C. The method begins at a block 770. At a block 772 the signs of the messages input to the check node are analyzed at a block 774. If the signs of the messages are the same, control transfers via 776 to 778 where the messages are calculated with the NORMALIZED MIN SUM algorithm with equation 761.

At 774, if the incoming messages have opposite signs, then control transfers via 782 to 784 where the check node messages are calculated with the NORMALIZED TWO-STEP MIN SUM algorithm using the method illustrated by equations 762-768. Following calculation of check node messages with either 784 or 778 control transfers to 780 where the variable nodes are updated. The process stops at a block 786.

In one embodiment of the present invention, a method to decode low-density parity check (LDPC) encoded data uses a parity check matrix having a plurality of layers. The method includes receiving a plurality of values at a decoder, each value of the plurality of values representing one of a plurality of bits of an LDPC codeword encoded using the parity check matrix; decoding the LDPC codeword using layered scheduling; and applying a functional adjustment to an approximation of belief propagation used during the decoding, wherein the applying uses a layer specific functional adjustment to provide an estimate of a codeword, where the approximation of belief propagation uses one or more of a Min Sum decoding algorithm, offset Min Sum decoding algorithm, two-step Min Sum decoding algorithm and normalized two-step Min Sum decoding algorithm. When an offset Min Sum decoding algorithm is used, the offset Min Sum decoding algorithm can subtract the layer specific functional adjustment during a check node message calculation. In one embodiment, when signs of incoming messages are the same, a Min Sum decoding algorithm is used for the decoding; or when signs of incoming messages are not the same, a difference in magnitude of the incoming messages is used as an independent variable in a function to compute a new value for the messages used for the decoding. The function may be approximated by a threshold value and the threshold value can be different per layer and per iteration. In an embodiment in which a normalized two-step Min Sum decoding algorithm, is used, when signs of incoming messages are the same a normalized Min Sum algorithm is used for the decoding, where the applying the functional adjustment multiples a coefficient times a message value during decoding of a layer; or when signs of incoming messages are not the same, a new message value $m_j$ is computed using an equation $m_j = \Sigma w_i * m_i$, with constraint $\Sigma w_i = 1$, and $\{i=1, j\}$ is used for the decoding. The applying the functional adjustment can use at least three different parameters during the decoding of a layer. In one embodiment, whether or not a stored parameter is used during the applying the functional adjustment is determined by a message value generated during the decoding.

In the method, the decoding may include performing check node processing followed by variable node processing on a layer of the parity check matrix associated with the LDPC codeword and the functional adjustment is applied to the approximation of belief propagation during the performing; applying the performing to the rest of the layers of the parity check matrix associated with the LDPC codeword during the decoding; and checking an estimate of the LDPC codeword to determine if the estimate is a valid. After the checking, if the estimate is valid, the method includes outputting the estimate as the codeword; and if the estimate is not valid, performing another iteration of the decoding beginning with performing check node processing. Each layer may be one or more circulant rows in the parity check matrix associated with the LDPC codeword. In one embodiment the plurality of layers includes a first layer and a second layer and a functional adjustment parameter for the first layer is different from a functional adjustment parameter for the second layer. At least one functional adjustment parameter may be different for each layer. In one embodiment at least two iterations of processing are to be applied to the parity check matrix associated with the LDPC codeword and at least two functional adjustment parameters are different for the at least two iterations. Also, at least one functional adjustment parameter may be different for each iteration. Also, at least one functional adjustment parameter can be different for each layer and for each iteration.

Normalized Belief Propagation Decoding

FIG. 8 illustrates, generally at 800, improvements to belief propagation (BP) decoding according to embodiment of the invention. With reference to FIG. 8, the convergence of the BP decoding algorithm can be improved by adjusting the message values sent from the variable nodes to the check nodes through functional adjustments. Various functional adjustments can be applied to perform different improvements. In one non-limiting embodiment, an improvement is performed using NORMALIZED BELIEF PROPAGATION. In NORMALIZED BELIEF PROPAGATION the variable node messages are adjusted with a normalization factor α as illustrated in 802. The parameter α, expressed for each layer s and iteration r as $\alpha_{rs}$ is multiplied by the check node calculation equation shown above, which becomes:

$$m_j^i = \prod_{k \in N(j) \setminus i} \text{sign}(r_k^j) \cdot \phi\left(\sum_{k \in N(j) \setminus i} \phi(|r_k^j|)\right) \alpha$$

thereby applying a functional adjustment to belief propagation directly which is different layer-by-layer and iteration-by-iteration. The parameter can be expressed as a matrix of functional adjustment values as illustrated at 804.

The functional adjustment parameters α are established for each layer and for each iteration during the design of a decoder as described above by running simulations which allow bit error rate (BER) to vary, and which take into account certain metrics such as layer number, iteration number, code rate, etc. Sometimes more metrics are used and sometimes less metrics are used in the simulations used to establish the parameters α. The simulations result in values for the parameters α for each layer and for each iteration. These values are available to the decoder during decoding. In non-limiting examples, the values can be conceptualized as a matrix of parameters as shown in 804, which can be stored in one or more look-up tables for use during decoding. In some embodiments, all of the parameters are different in each layer and in each iteration. In other embodiments, at least two parameters are different either per layer or per iteration.

A method to decode low-density parity check (LDPC) encoded data using a parity check matrix having a plurality of layers, includes: receiving a plurality of values at a decoder, each value of the plurality of values representing one of a plurality of bits of an LDPC codeword encoded using the parity check matrix; decoding the LDPC codeword using layered scheduling; and applying a functional adjustment to a normalized belief propagation algorithm used during the decoding, wherein the applying uses a layer specific functional adjustment to provide an estimate of a codeword. In one embodiment the layer specific functional adjustment defines a parameter and the applying multiplies the parameter during a check node calculation. In another embodiment the layer specific functional adjustment defines a parameter and the applying divides by the parameter during a check node calculation. In yet another embodiment the layer specific functional adjustment defines a parameter and the parameter is obtained through decoding simulations performed using the normalized belief propagation algorithm. A parameter can be obtained for each layer and for each iteration.

Offset Belief Propagation Decoding

FIG. 8 illustrates, generally at 850, another improvement of belief propagation decoding according to embodiments of the invention. In another non-limiting embodiment, an improvement is performed using OFFSET BELIEF PROPAGATION. With reference to FIG. 8, a parameter β represents threshold values that are established for use as functional adjustments per layer and per iteration. During the decoding of a layer within an iteration, a magnitude of the message is tested with the formula shown at 852 using a value which has been previously stored for use in the layer during the iteration. If the magnitude of the message is greater than β, then β is subtracted during the computation of the check node message as shown in 852. The other condition that can arise during decoding is that the magnitude of the message can be equal to or less than β. In that case, the check node message computation proceeds unchanged and β is effectively equal to zero during the decoding of that layer and iteration. The parameters β, as indicated at 854, can be visualized as a matrix of values as described above in conjunction with FIG. 5 and FIG. 6.

The functional adjustment parameters β are established for each layer and for each iteration during the design of a decoder as described above by running simulations which allow bit error rate (BER) to vary, and which take into account certain metrics such as layer number, iteration number, code rate, etc. Sometimes more metrics are used and sometimes less metrics are used in the simulations used to establish the parameters β. The simulations result in values for the parameters β for each layer and for each iteration. These values are available to the decoder during decoding. In non-limiting examples, the values can be conceptualized as a matrix of parameters as shown in 854, which can be stored in one or more look-up tables for use during decoding. In some embodiments, all of the parameters are different in each layer and in each iteration. In other embodiments, at least two parameters are different either per layer or per iteration.

In the examples described above, two non-limiting examples of improvements to BP have been described. NORMALIZED BELIEF PROPAGATION is represented by use of either a division 408 or a multiplication 410 with 420 as applied to a functional adjustment 106 which is then applied to layer specific BP decoding 104 using BP directly (420) as the LDPC decoding method as shown in FIG. 4. OFFSET BELIEF PROPAGATION is represented by use of a subtraction 412 applied as a functional adjustment 106 during layer specific BP decoding 104 using belief propagation directly (420) as the LDPC decoding method from FIG. 4. Note that all other improvements of BP decoding are within the scope of the teaching presented herein as represented by FIG. 4 utilizing one or more of 408 through 418 as applied to 106 with 420 applied to 104 to produce a codeword 140.

A method to decode low-density parity check (LDPC) encoded data using a parity check matrix having a plurality of layers, includes: receiving a plurality of values at a decoder, each value of the plurality of values representing one of a plurality of bits of an LDPC codeword encoded using the parity check matrix; decoding the LDPC codeword using layered scheduling; and applying a functional adjustment to an offset belief propagation algorithm used during the decoding, wherein the applying uses a layer specific functional adjustment to provide an estimate of a codeword. In one embodiment the layer specific functional adjustment defines a parameter and the applying adds the parameter during a check node calculation. In another embodiment the layer specific functional adjustment defines a parameter and the applying subtracts the parameter during a check node calculation. In yet another embodiment the layer specific functional adjustment defines a parameter and the parameter is obtained through decoding simulations performed using the offset belief propagation algorithm. A parameter can be obtained for each layer and for each iteration.

Log-FFT Decoding

Figure 9A:
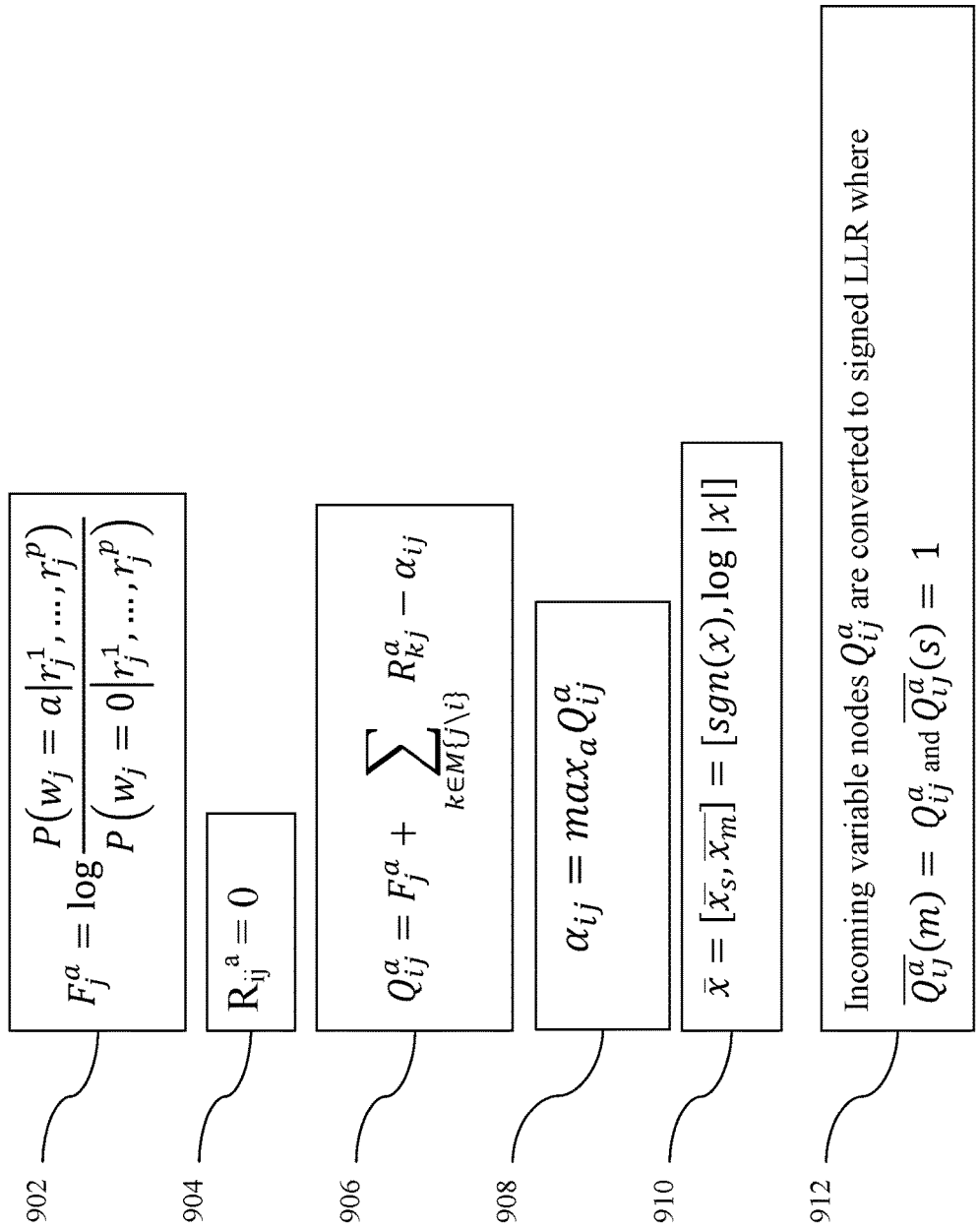
Figure 9C:
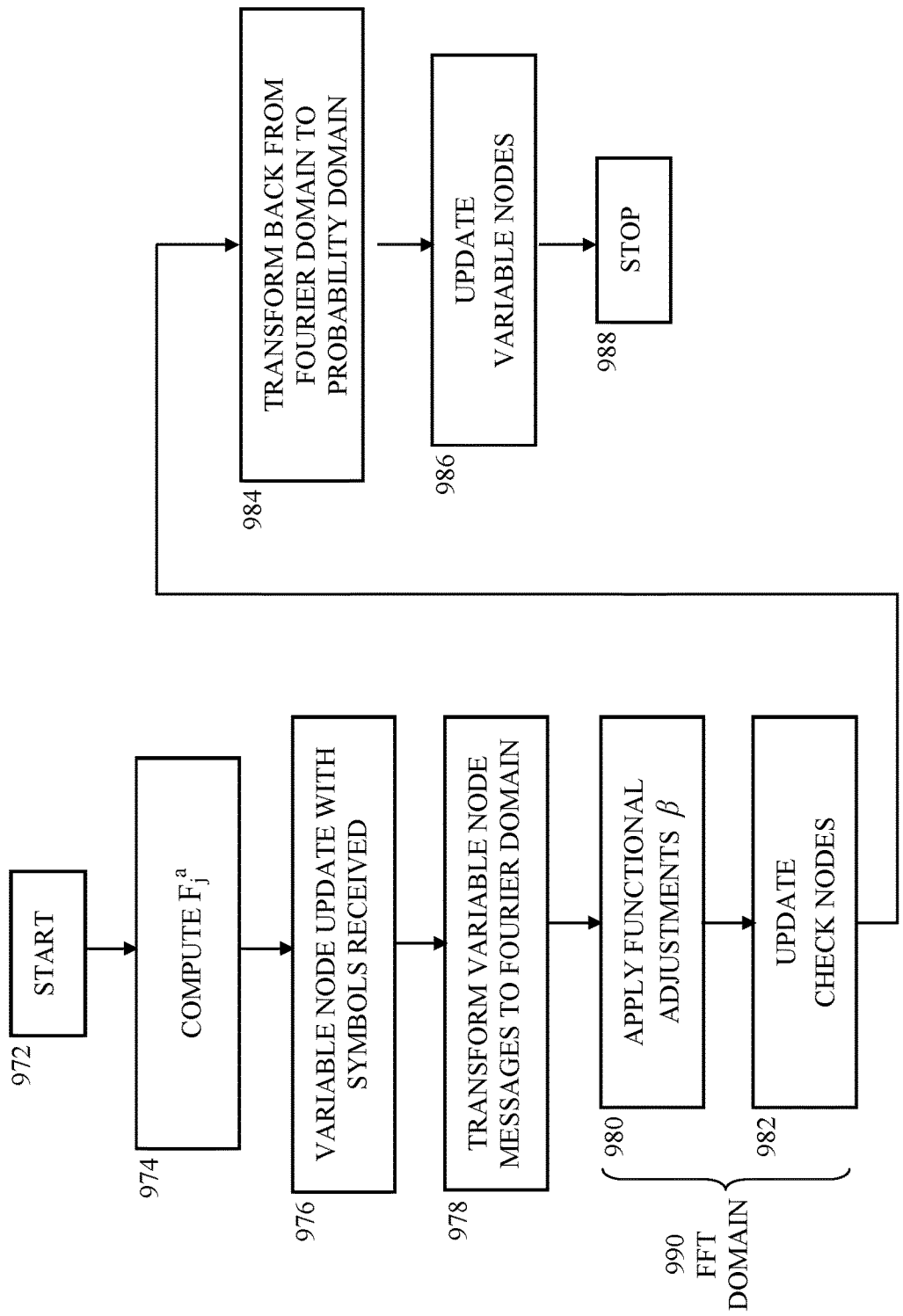

FIG. 9A-9C illustrate an algorithmic approximation to belief propagation decoding using a Log-FFT approximation according to embodiments of the invention. With reference to FIGS. 9A-9C, the log Fast Fourier Transform (FFT) algorithm is also know as the FFT sum product algorithm or FFT-SPA and will be referred to interchangeably by either name within this description of embodiments. The Log-FFT approximation to BP is generally used with non-binary LDPC codes, where instead of two states, i.e., 0 and 1 a general number of states greater than two are represented by a set of symbols α, where α={1, 2, 3, 4, 5, etc} or {a, b, c, d, e, etc.}. The non-binary LDPC code is based on an alphabet of "a" elements. With a non-binary LDPC code, when casting the data read from memory into log likelihood ratio (LLR) form the resulting LLRs are based on the alphabet of the symbol set "α" of size "p" instead of just the binary states (1, 0) according to the equation given at 902. The algorithm will proceed from the probability domain to the FFT domain and then back to the probability domain as the decoding proceeds layer-by-layer as described below.

The algorithm is initialized by computing the channel messages $F_j^a$ as given by equation 902 and setting the check node messages to zero as given by equation 904. Next, the variable nodes are updated with equations 906 and 908. The check node update will take place in the Fourier domain. Therefore, the messages are transformed into the Fourier domain. The sign of the messages can be negative, therefore in order to handle the sign of the messages in the Fourier domain the message in the signed log domain is given by equation 910, where "x" are the numbers in the probability domain and the x bar numbers are in the signed log domain. The incoming variable node messages are converted to signed LLR form as given by the relationships shown in 912. 952 is the equation representing the FFT of the variable node messages in the Fourier domain, where F(x) is the FFT of x and P(x) is the permutation of x by $H_{ij}$, where x is given by equation 954 and $H_{ij}$ is the parity check matrix. Next, check nodes are updated in the Fourier domain with equation 956 operating on the "sign" of the message and equation 958 operating on the magnitude of the message. Functional adjustments are applied during calculation of the magnitude of the check node by application of the parameter β as given by equation 960. Check node messages are updated in the Fourier domain using equations given by 956 for the sign and 960 for the magnitude that provides the functional adjustment from the parameter β. Next, the messages are transformed back to the probability domain with an inverse Fast Fourier Transform (IFFT) and the decoding proceeds using equation 962.

The functional adjustment parameter β is established for each layer and each iteration during design of a decoder as described above by running simulations which allow bit error rate (BER) to vary, and which take into account certain metrics such as layer number, iteration number, code rate, etc. Sometimes more metrics are used and sometimes less metrics are used in the simulations used to establish the parameters β. The simulations result in values for the parameters β for each layer and each iteration. These values are available to the decoder during decoding. The values can be conceptualized as a matrix of parameters as shown in 964, which can be stored in one or more look-up tables for use during decoding. In some embodiments, all of the parameters are different in each layer and for each iteration. In other embodiments, at least two parameters are different either per layer or per iteration.

A process for implementing the Log-FFT approximation to BP is illustrated in FIG. 9C. With reference to FIG. 9C, a process starts at a block 972. At a block 974 the algorithm is initialized with channel messages calculated with equation 902 and equation 904. At a block 976 variable node messages are updated with equation 906 and 908. At a block 978 variable node messages are transformed to the Fourier domain as indicated at 990. At a block 980 a functional adjustment is applied to the check node message calculation as described above using equation 960 and the functional adjustment provided by the parameter β for the particular layer and particular iteration. At a block 982 the check nodes are updated using the equation 956 for the sign and 960 for the magnitude in the Fourier domain. At a block 984 the messages are transformed back to the probability domain with the IFFT. At a block 986 the decoding proceeds using equation 962. The process stops at a block 988.

A method to decode low-density parity check (LDPC) encoded data using a parity check matrix having a plurality of layers, includes: receiving a plurality of values at a decoder, each value of the plurality of values representing one of a plurality of bits of an LDPC codeword encoded using the parity check matrix; decoding the LDPC codeword using layered scheduling; and applying a functional adjustment to a log-Fast Fourier transform (LOG-FFT) approximation to belief propagation used during the decoding, wherein the applying uses a layer specific functional adjustment to provide an estimate of a codeword. In one embodiment the layer specific functional adjustment defines a parameter and the applying multiplies the parameter during a check node calculation. In another embodiment the layer specific functional adjustment defines a parameter and the applying divides by the parameter during a check node calculation.

A method to decode low-density parity check (LDPC) encoded data using a parity check matrix having a plurality of layers, includes receiving a plurality of values at a decoder, each of the plurality of values representing one of a plurality of bits of a LDPC codeword encoded using the parity check matrix, the method to perform in order; a. updating messages at variable nodes; b. transforming messages to a Fourier Domain; c. updating check node messages in the Fourier Domain; d. applying a functional adjustment during the updating check node messages (c); and e. applying an inverse Fourier transform to the messages. In one embodiment the plurality of bits are binary data. Each of the plurality of bits can belong to a symbol set representing a plurality of states. The plurality of values can be log-likelihood ratios. A Fast Fourier Transform (FFT) can be used to transform the messages into the Fourier Domain. An Inverse Fast Fourier Transform (IFFT) can be used to transform the messages from the Fourier Domain.

Approximate MIN* Decoding

Figure 10A:
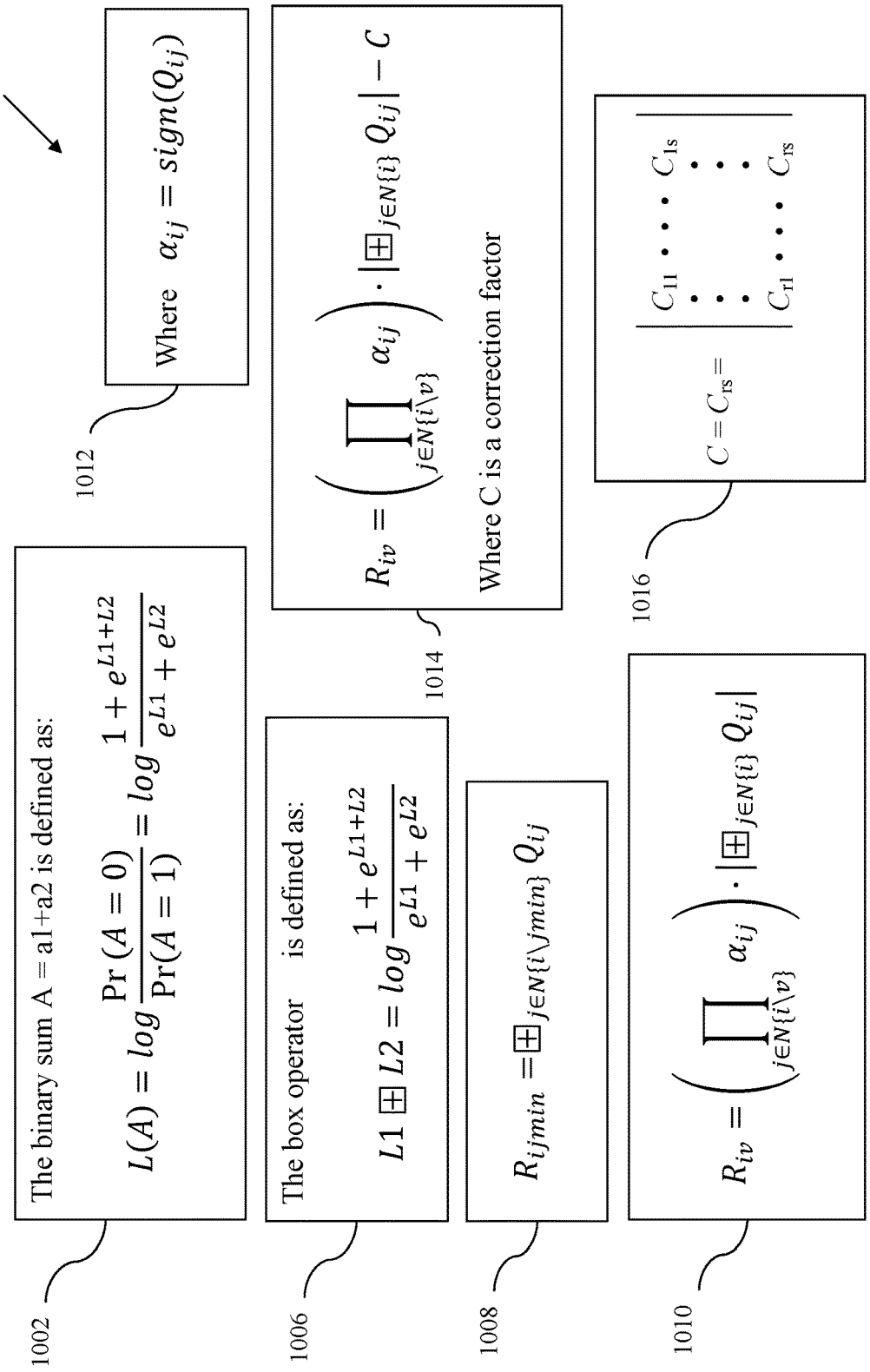
FIGS. 10A-10B illustrate an algorithmic approximation to belief propagation decoding using an APPROXIMATE MIN* approximation according to embodiments of the invention.

FIG. 10A illustrates, generally at 1000, an algorithmic approximation to belief propagation decoding using an APPROXIMATE MIN* algorithm according to embodiments of the invention. With reference to FIG. 10A, since the APPROXIMATE MIN* algorithm makes use of the products of LLR values it is convenient to use the box operator which is defined as follows. Two independent values a1 and a2 have LLR values of LLR L1 and LLR L2 respectively. The LLR of the binary sum A=a1+a2 is given by the equation 1002 and the box operator is defined by equation 1006.

Next, the algorithm analyzes the messages received at a check node "i" coming from the variable nodes connected thereto and selects the least reliable message received by the $i^{th}$ check node. The least reliable message is synonymous with the message having the minimum value. The variable node that sent the least reliable message is noted as jmin. Two different check node messages are computed, a first check node message is sent to jmin and a second check node message is sent to the rest of the variable nodes connected to the $i^{th}$ check node.

The first check node message is sent to the variable node jmin which is computed with the sum product algorithm as given by equation 1008. The second check node message is computed with the equations 1010 and 1012 as modified by a functional adjustment parameter C, the adjusted check node calculation is given by equation 1014.

The functional adjustment parameter C is established for each layer and each iteration during design of a decoder as described above by running simulations which allow bit error rate (BER) to vary, and which take into account certain metrics such as layer number, iteration number, code rate, etc. Sometimes more metrics are used and sometimes less metrics are used in the simulations used to establish the parameters C. The simulations result in values for the parameters C for each layer and each iteration. These values are available to the decoder during decoding. The values can be conceptualized as a matrix of parameters as shown in 1016, which can be stored in one or more look-up tables for use during decoding. In some embodiments, all of the parameters are different in each layer and for each iteration. In other embodiments, at least two parameters are different either per layer or per iteration.

Figure 10B:
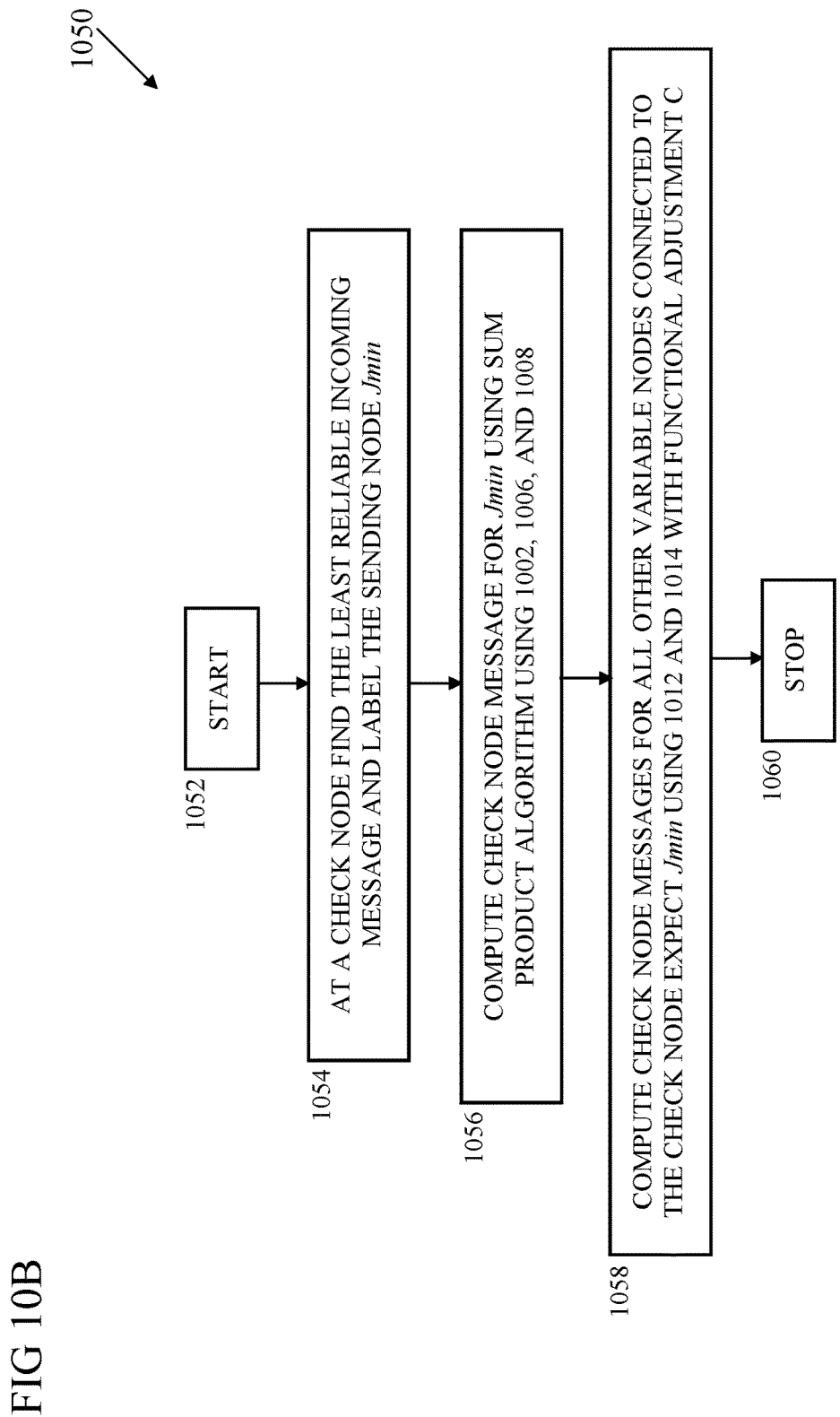

A process for implementing the APPROXIMATE MIN* algorithm is illustrated in FIG. 10B, generally, at 1050 for embodiments of the invention. With reference to FIG. 10B, the process starts at a block 1052. At a block 1054 the incoming messages into a check node from the variable nodes connected thereto are analyzed and the least reliable message is identified and the variable node sending that message is referred to herein as jmin. At a block 1056 the check node message is computed for variable node jmin using the log-sum product algorithm as given by equations 1002 through 1008. At a block 1058 the check node messages for the rest of the variable nodes connected to the check node are calculated with equations 1012-1016 with functional adjustment C applied thereto. The process stops at a block 1060.

A method to decode low-density parity check (LDPC) encoded data using a parity check matrix having a plurality of layers, includes: receiving a plurality of values at a decoder, each value of the plurality of values representing one of a plurality of bits of an LDPC codeword encoded using the parity check matrix; decoding the LDPC codeword using layered scheduling; and applying a functional adjustment to an approximate MIN* approximation to belief propagation algorithm used during the decoding, wherein the applying uses a layer specific functional adjustment to provide an estimate of a codeword. In one embodiment the layer specific functional adjustment defines a parameter and the applying adds the parameter during a check node calculation. In another embodiment the layer specific functional adjustment defines a parameter and the applying subtracts the parameter during a check node calculation. In yet another embodiment the layer specific functional adjustment defines a parameter and the parameter is obtained through decoding simulations performed using the approximate MIN* approximation to belief propagation algorithm. A parameter can be obtained for each layer and for each iteration.

Richardson/Novichkov Decoding

FIG. 11A illustrates, generally at 1100, an algorithmic approximation to belief propagation decoding using a RICHARDSON/NOVICHKOV approximation according to embodiments of the invention. Within various embodiments, the general functional adjustment can be applied to algorithms that are used to implement belief propagation (BP) in hardware where message passing involves integers such as in the RICHARDSON/NOVICHKOV approximation. With reference to FIG. 11A, the BP algorithm is expressed using equations 1102 and 1104. In hardware implementations of PDPC decoding, messages are passed as integers, therefore the magnitude of the messages passed is expressed using equation 1106. Where $\beta_{j,i} = \delta b_{j,i}$ and $\delta = \ln(2)$ and $\delta = \ln(2)$ (1108). When x is large, $\log(1 \pm e^{-x}) \cong e^{-x}$, which leads to the simplification shown in equation 1110. The inverse of this approximation is given by equation 1112. With this approximation, check node messages are calculated with equation 1114. In this case two functional adjustments parameters C1, as shown at 1116, and C2, as shown at 1118, are used layer-by-layer during decoding.

The functional adjustment parameters C1 and C2 are established for each layer and for each iteration during the design of a decoder as described above by running simulations which allow bit error rate (BER) to vary, and which take into account certain metrics such as layer number, iteration number, code rate, etc. Sometimes more metrics are used and sometimes less metrics are used in the simulations used to establish the parameters C1 and C2. The simulations result in values for the parameters C1 and C2 for each layer and for each iteration. These values are available to the decoder during decoding. In non-limiting examples, the values can be conceptualized as a matrix of parameters as shown in 1116 and 1118, which can be stored in one or more look-up tables for use during decoding. In some embodiments, all of the parameters are different in each layer and for each iteration. In other embodiments, at least two parameters are different either per layer or per iteration.

Figure 11B:
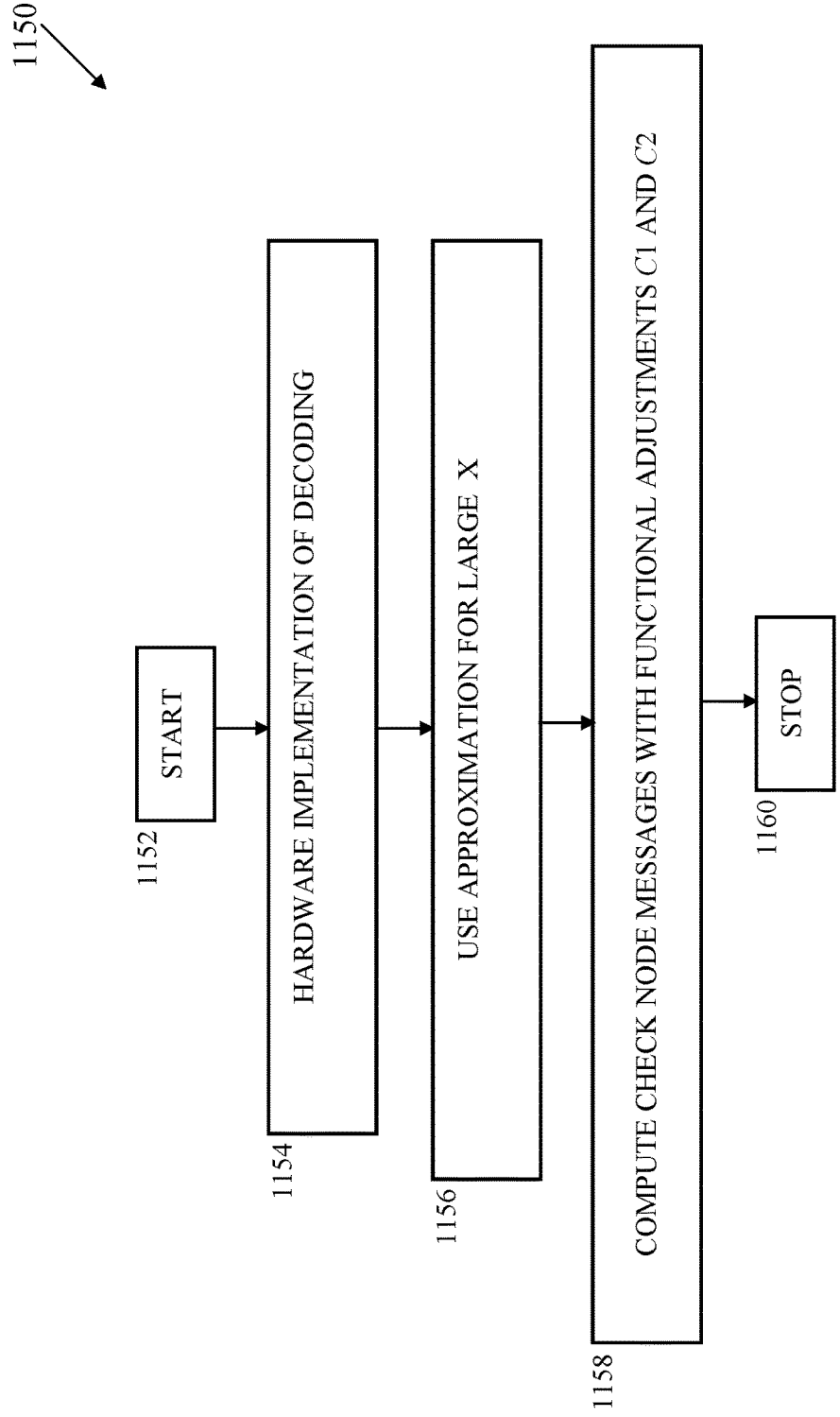

A process for implementing the RICHARDSON/NOVICHKOV approximation is illustrated in FIG. 11B, generally, at 1150 for embodiments of the invention. With reference to FIG. 11B, the process starts at a block 1152. At a block 1154 a hardware implementation for decoding is used to base the decoder design on, where message magnitude is expressed with the use of equations 1106 and 1108. At a block 1156 an approximation is used to simplify calculations using equation 1110. At a block 1158 the check node messages are calculated using equations 1114 with functional adjustments C1 (1116) and C2 (1118) applied thereto. The process stops at a block 1160.

A method to decode low-density parity check (LDPC) encoded data using a parity check matrix having a plurality of layers, includes: receiving a plurality of values at a decoder, each value of the plurality of values representing one of a plurality of bits of an LDPC codeword encoded using the parity check matrix; decoding the LDPC codeword using layered scheduling; and applying a functional adjustment to a RICHARDSON/NOVICHKOV approximation to belief propagation algorithm used during the decoding, wherein the applying uses a layer specific functional adjustment to provide an estimate of a codeword. In one embodiment the layer specific functional adjustment defines two parameters and the applying adds at least one of the two parameters during a check node calculation. In one embodiment the layer specific functional adjustment defines at least two parameters and the applying subtracts at least one of the two parameters during a check node calculation. In another embodiment the functional adjustment defines two parameters and the two parameters are obtained through decoding simulations performed using the RICHARDSON/NOVICHKOV approximation to belief propagation algorithm. The two parameters can be obtained for each layer and for each iteration.

Hard Decoding—Bit Flipping, Weighted Bit Flipping Iterative Majority logic, et al.

Embodiments of the invention are applicable to hard decoding approximations to the belief propagation decoding algorithm such as "bit flipping" as well as other algorithms. As an example of several non-limiting embodiments, BIT FLIPPING and WEIGHTED BIT FLIPPING are implemented with layer specific functional adjustments and are described below.

Bit Flipping and Weighted Bit Flipping

Figure 12A:
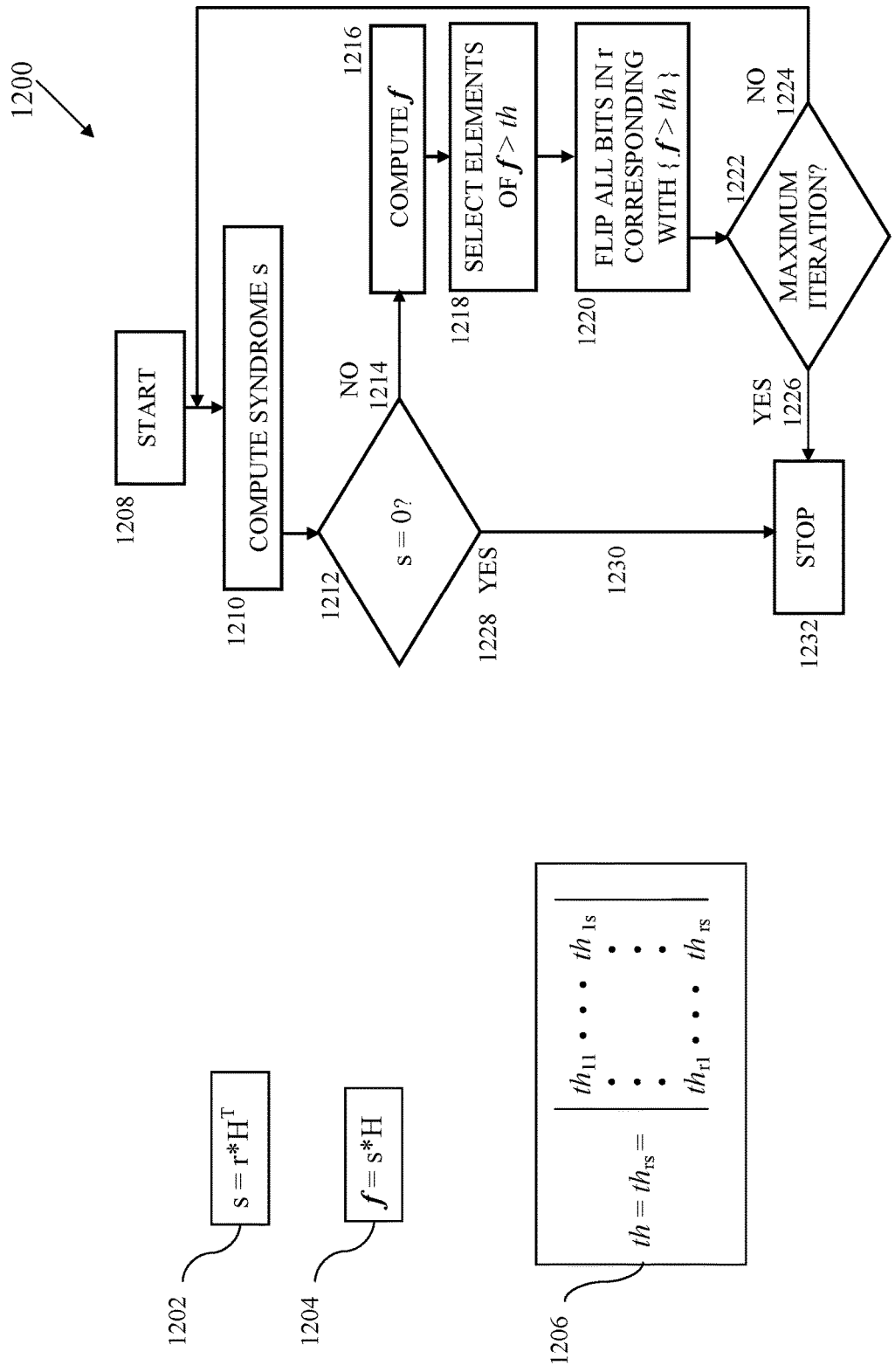
FIG. 12A illustrates an algorithmic approximation to belief propagation decoding using a BIT FLIPPING approximation according to embodiments of the invention.

FIG. 12A illustrates, generally at 1200, an algorithmic approximation to belief propagation decoding using a BIT FLIPPING approximation according to embodiments of the invention. With reference to FIG. 12A, the syndrome "s" is computed by multiplying the received message "r" time the transpose of the H matrix as given by equation 1202. The vector 'f' is computed by multiplying the syndrome "s" times the H matrix as shown in equation 1204. Functional adjustment parameters "$th_{rs}$" are used per layer and per iteration as shown in equation 1206.

A method that utilizes the BIT FLIPPING algorithm to perform layer specific functional adjustments is illustrated in 1200 starting at a block 1208. At a block 1210 the syndrome "s" of the received message "r" is computed at a block 1210 using equation 1202. At a block 1212 if the syndrome is non-zero control proceeds down the branch 1214. At a block 1216 the vector "f" is computed using equation 1204. Steps 1218 and 1220 proceed on a per layer basis. At a block 1218 the elements of "f" that are greater than a threshold value "th" are identified. At a block 1220 all bits in "r" that correspond with the selected bits from 1218 are flipped. "Flipped" means that if a bit has a value of a 1 it is flipped to a zero. Alternatively, if a bit has a value of zero it is flipped to a one. At a block 1222, if the maximum number of iterations has been reached, then control transfers at 1226 to a block 1232 and the decoding process stops. If the maximum number of iterations has not been reached at 1222 then control transfers at 1224 to 1210 the syndrome is computed again at 1210. At 1212 if the syndrome is equal to zero 1228 then the decoding was successful and control transfers at 1230 to 1232 where the decoding process stops. At the block 1212 if the decoding was not successful then the syndrome "s" is not equal to zero and another iteration of decoding proceeds through the layers again with 1216, 1218, 1220 until the maximum number of iterations is reached.

The functional adjustment parameters th are established for each layer and for each iteration during the design of a decoder as described above by running simulations which allow bit error rate (BER) to vary, and which take into account certain metrics such as layer number, iteration number, code rate, etc. Sometimes more metrics are used and sometimes less metrics are used in the simulations used to establish the parameters th. The simulations result in values for the parameters th for each layer and for each iteration. These values are available to the decoder during decoding. In non-limiting examples, the values can be conceptualized as a matrix of parameters as shown in 1206, which can be stored in one or more look-up tables for use during decoding. In some embodiments, all of the parameters are different in each layer and in each iteration. In other embodiments, at least two parameters are different either per layer or per iteration.

Figure 12B:
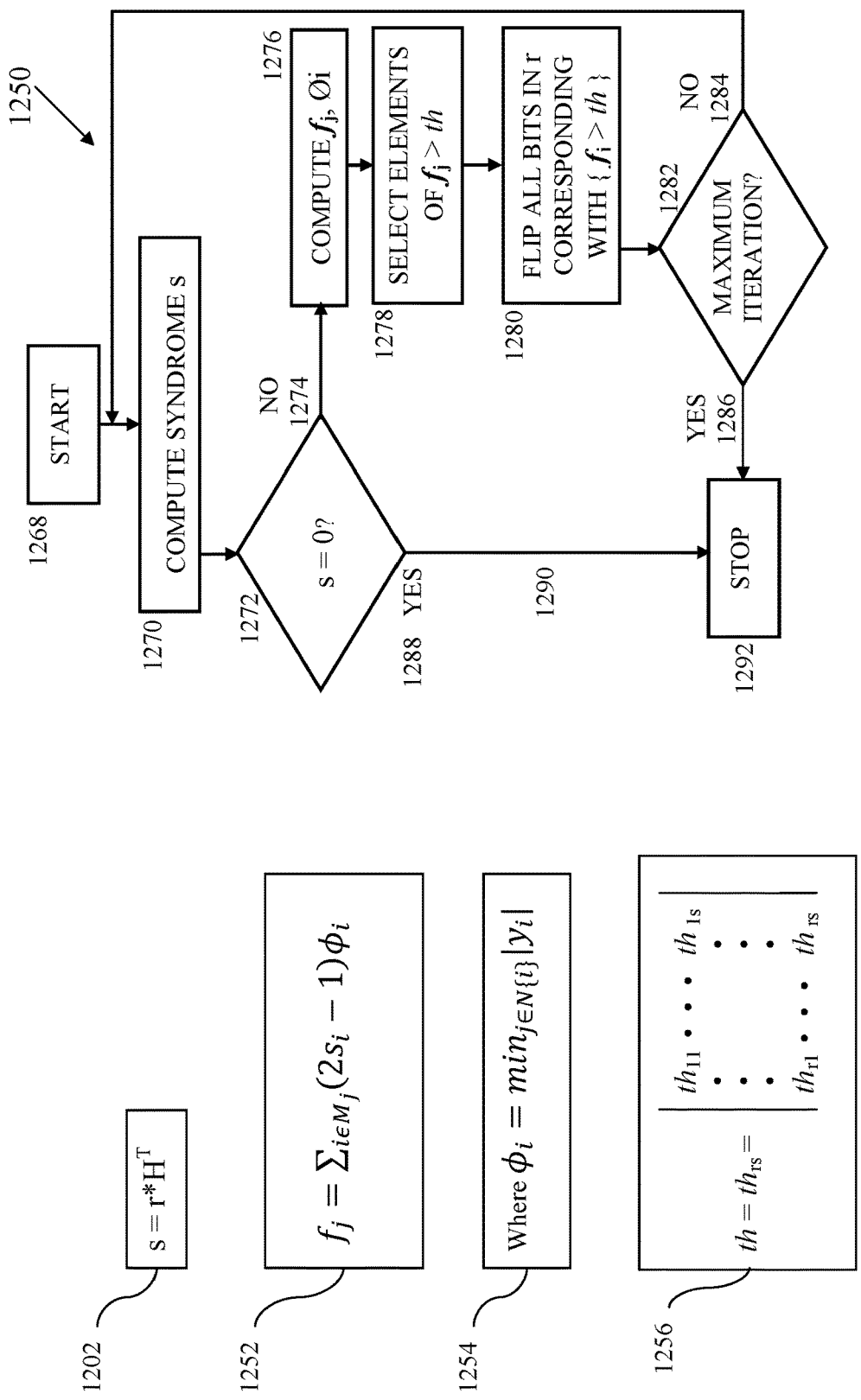
FIG. 12B illustrates an algorithmic approximation to belief propagation decoding using a WEIGHTED BIT FLIPPING approximation according to embodiments of the invention

FIG. 12B illustrates, generally at 1250, an algorithmic approximation to belief propagation decoding using a WEIGHTED BIT FLIPPING approximation according to embodiments of the invention. With reference to FIG. 12B, the syndrome "s" is computed by multiplying the received message "r" time the transpose of the H matrix as given by equation 1202. The vector "$f_j$" is computed as shown in equation 1252 and 1254. Functional adjustment parameters "$th_{rs}$" are used per layer and per iteration as shown in equation 1256.

A method that utilizes the WEIGHTED BIT FLIPPING algorithm to perform layer specific functional adjustments is illustrated in 1250 starting at a block 1268. At a block 1270 the syndrome "s" of the received message "r" is computed at a block 1270 using equation 1202. At a block 1272 if the syndrome is non-zero control proceeds down the branch 1274. At a block 1276 the vector "$f_j$" is computed using equation 1252 and 1254. Steps 1278 and 1280 proceed on a per layer basis. At a block 1278 the elements of "$f_j$" that are greater than a threshold value "th" are identified. At a block 1280 all bits in "r" that correspond with the selected bits from 1278 are flipped. "Flipped" means that if a bit has a value of a 1 it is flipped to a zero. Alternatively, if a bit has a value of zero it is flipped to a one. At a block 1282, if the maximum number of iterations has been reached, then control transfers at 1286 to a block 1292 and the decoding process stops. If the maximum number of iterations has not been reached at 1282 then control transfers at 1284 to 1270 the syndrome is computed again at 1270. At 1272 if the syndrome is equal to zero 1288 then the decoding was successful and control transfers at 1290 to 1292 where the decoding process stops. At the block 1272 if the decoding was not successful then the syndrome "s" is not equal to zero and another iteration of decoding proceeds through the layers again with 1276, 1278, 1280 until the maximum number of iterations is reached at which time decoding stops at 1292.

The functional adjustment parameters th are established for each layer and for each iteration during the design of a decoder as described above by running simulations which allow bit error rate (BER) to vary, and which take into account certain metrics such as layer number, iteration number, code rate, etc. Sometimes more metrics are used and sometimes less metrics are used in the simulations used to establish the parameters th. The simulations result in values for the parameters th for each layer and for each iteration. These values are available to the decoder during decoding. In non-limiting examples, the values can be conceptualized as a matrix of parameters as shown in 1256, which can be stored in one or more look-up tables for use during decoding. In some embodiments, all of the parameters are different in each layer and in each iteration. In other embodiments, at least two parameters are different either per layer or per iteration.

In other embodiments, various other functional adjustments are applied to BIT FLIPPING algorithmic approximations to BP. Such other general functional adjustments applied to approximations of BP using BIT FLIPPING are within the scope of embodiments taught herein as indicated by the combination of a user defined functional adjustment 418 in combination with a user defined approximation to BP 450 (FIG. 4).

A method to decode low-density parity check (LDPC) encoded data using a parity check matrix having a plurality of layers, includes: receiving a plurality of values at a decoder, each value of the plurality of values representing one of a plurality of bits of an LDPC codeword encoded using the parity check matrix; decoding the LDPC codeword using layered scheduling; and applying a functional adjustment to a bit flipping approximation of belief propagation algorithm used during the decoding, wherein the applying uses a layer specific functional adjustment to provide an estimate of a codeword. In one embodiment the layer specific functional adjustment defines a parameter and the applying selects bits based on the parameter to be flipped. In one embodiment all bits that are greater than the parameter are flipped. In another embodiment the layer specific functional adjustment defines a parameter and the parameter is obtained through decoding simulations performed using the bit flipping approximation of belief propagation algorithm. A parameter can be obtained for each layer and for each iteration.

Iterative Majority Logic Decoding

Figure 13:
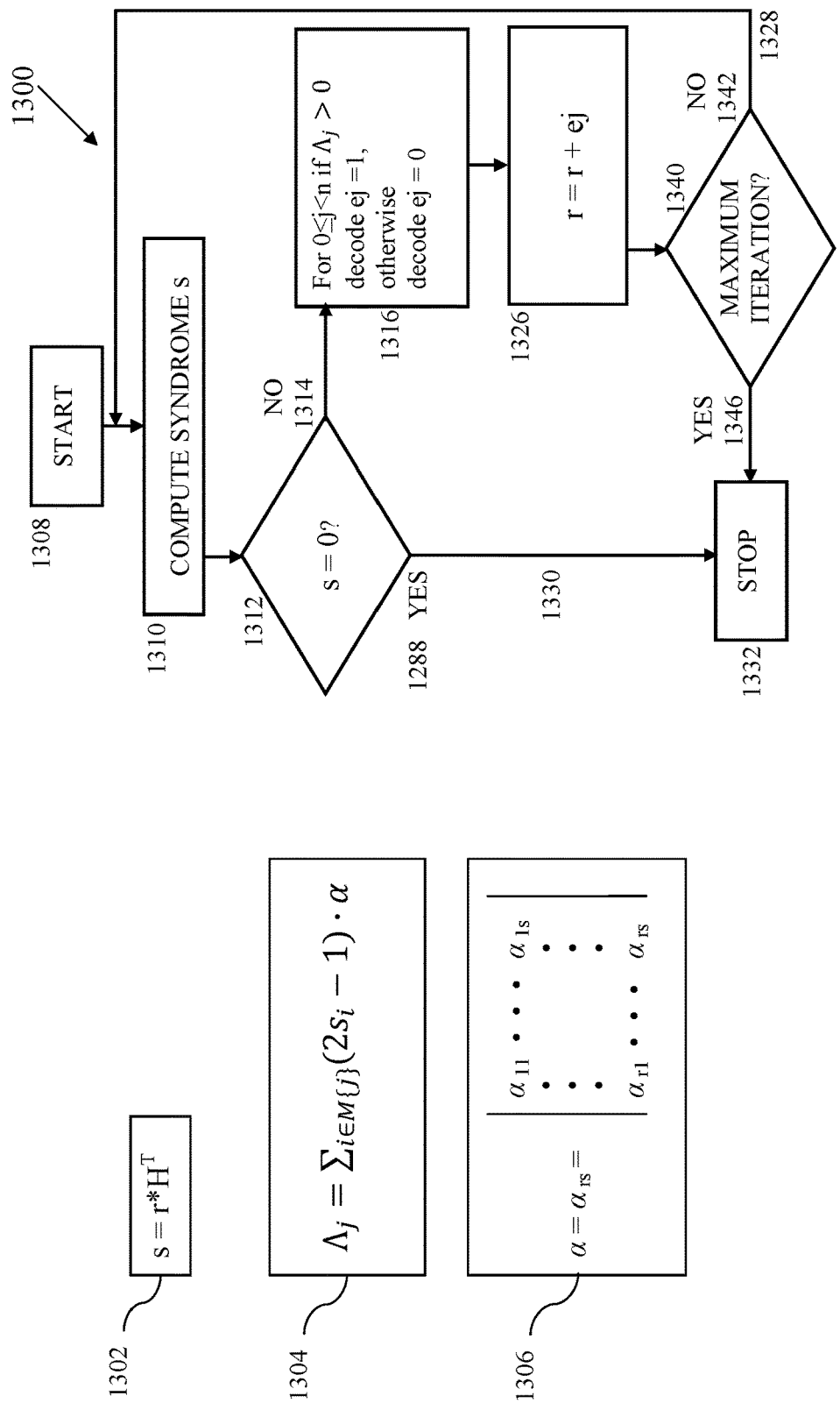
FIG. 13 illustrates an algorithmic approximation to belief propagation decoding using an ITERATIVE MAJORITY LOGIC approximation according to embodiments of the invention.

Other hard decoding algorithms are utilized within embodiments of the invention by implementation on a per layer per iteration basis. For example, another hard decoding algorithm is the ITERATIVE MAJORITY LOGIC approximation to belief propagation. FIG. 13 illustrates, generally at 1300, an algorithmic approximation to belief propagation (BP) decoding using the ITERATIVE MAJORITY LOGIC approximation according to embodiments of the invention. With reference to FIG. 13, the syndrome "s" is computed by multiplying the received message "r" time the transpose of the H matrix as given by equation 1302. The vector "$\Lambda_1$" is computed as shown in equation 1304. Functional adjustment parameters "$\alpha$" are used per layer and per iteration as shown in equation 1306. In the ITERATIVE MAJORITY LOGIC approximation decoding is accomplished generally in one iteration. However, decoders can be created to perform more than one iteration during decoding.

A process that utilizes the ITERATIVE MAJORITY LOGIC algorithm to perform layer specific functional adjustments is illustrated in 1300. The process of 1300 can be performed with multiple iterations or with simplification to blocks 1308 1316, 1326, and 1332 in a single iteration. The multiple iteration configuration is described in the following discussion. The process starts at a block 1308. At a block 1310 the syndrome "s" of the received message "r" is computed using equation 1302. At a block 1312 if the syndrome is non-zero control proceeds down the branch 1314. At a block 1316 the vector "$\Lambda_j$" is computed using equation 1304 and decoding proceeds as follows layer-by-layer. If $\Lambda_j$ are greater than zero then decode ej=1, otherwise decode ej=0. At a block 1326 the estimated codeword is formed as shown. At a block 1340 if the maximum iteration has not been reached then control transfers at 1342 to 1328 and the syndrome is computed at 1310. At 1312 if the syndrome is equal to zero 1288 then the decoding was successful and control transfers to 1330 where the decoding process stops at 1332. At the block 1312 if the decoding was not successful then the syndrome "s" is not equal to zero and another iteration of decoding proceeds through the layers again with 1316, 1326, 1328 until either the code word is obtained or the maximum number of iterations is reached.

The functional adjustment parameters $\alpha$ are established for each layer and for each iteration during the design of a decoder as described above by running simulations which allow bit error rate (BER) to vary, and which take into account certain metrics such as layer number, iteration number, code rate, etc. Sometimes more metrics are used and sometimes less metrics are used in the simulations used to establish the parameters $\alpha$. The simulations result in values for the parameters $\alpha$ for each layer and for each iteration. These values are available to the decoder during decoding. In non-limiting examples, the values can be conceptualized as a matrix of parameters as shown in 1306, which can be stored in one or more look-up tables for use during decoding. In some embodiments, all of the parameters are different in each layer and in each iteration. In other embodiments, at least two parameters are different either per layer or per iteration.

In other embodiments, various other functional adjustments are applied to other hard decoding algorithmic approximations to BP. Such other general functional adjustments applied to approximations of BP using hard decoding are within the scope of embodiments taught herein as indicated by the combination of a user defined functional adjustment 418 in combination with a user defined approximation to BP 450 (FIG. 4).

A method to decode low-density parity check (LDPC) encoded data using a parity check matrix having a plurality of layers, includes: receiving a plurality of values at a decoder, each value of the plurality of values representing one of a plurality of bits of an LDPC codeword encoded using the parity check matrix; decoding the LDPC codeword using layered scheduling; and applying a functional adjustment to an iterative majority logic approximation of belief propagation algorithm used during the decoding, wherein the applying uses a layer specific functional adjustment to provide an estimate of a codeword. The layer specific functional adjustment can define a parameter and the parameter is obtained through decoding simulations performed using the iterative majority logic approximation of belief propagation algorithm. In one embodiment of the method a parameter is obtained for each layer and for each iteration. In yet another embodiment, the applying uses the functional adjustment to establish $\Lambda_j$, wherein $\Lambda_j$ sets a threshold that guides the decoding. The decoding can result in one of the two values (a) or (b). More particularly, (a.) if is greater than zero then decode ej=1; (b.) if $\Lambda_j$ is not greater than zero then decode ej=0; and (c.) forming the estimated codeword r with the value of ej obtained from either (a) or (b) using r=r+ej.

Quasi Cyclic Codes [Gauss-Siedel Decoding]

Figure 14:
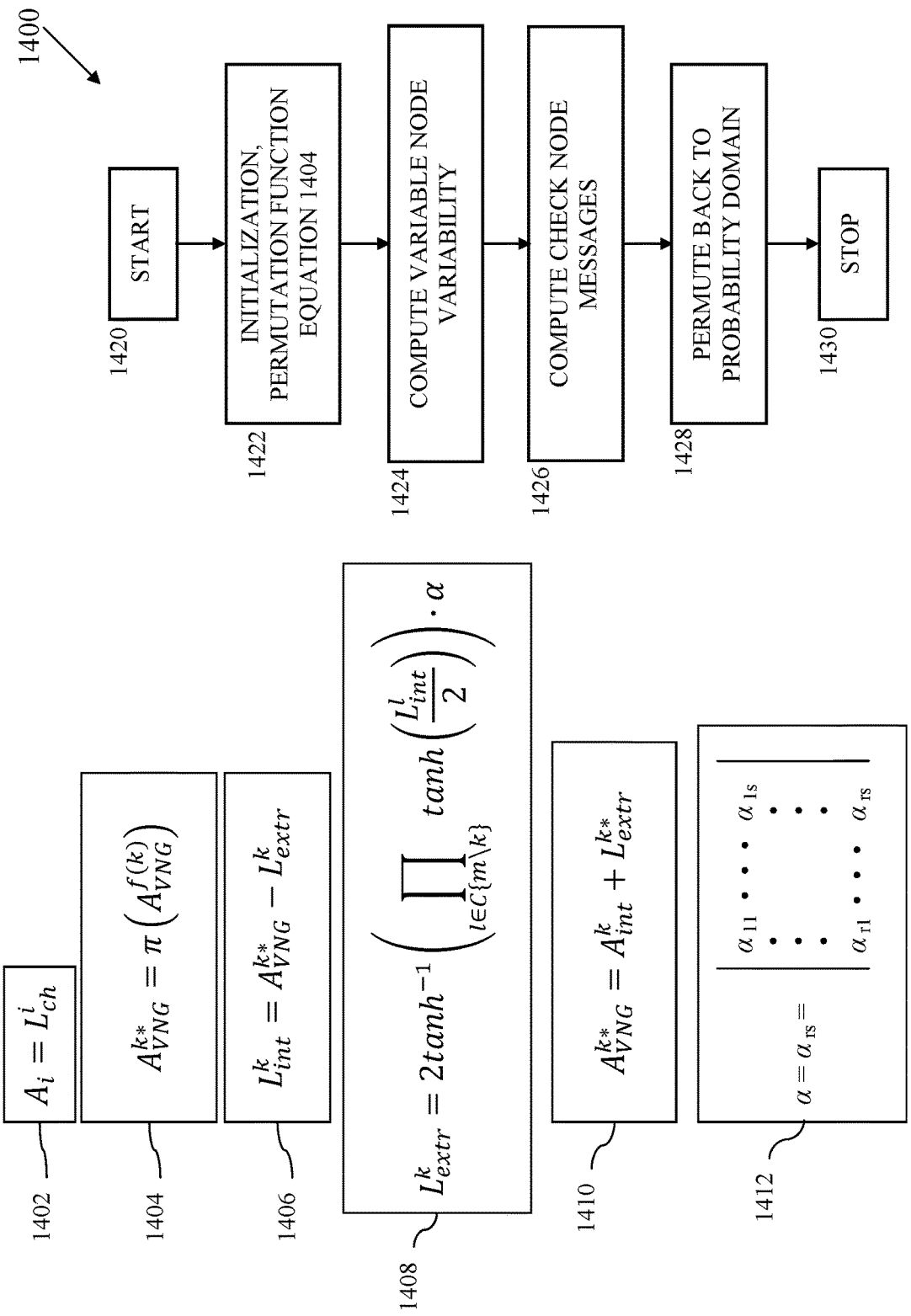
FIG. 14 illustrates an algorithmic approximation to belief propagation decoding using a GAUSS-SIEDEL approximation according to embodiments of the invention.

Embodiments of the invention are applicable to the subset of LDPC codes known as QC-IRA (quasi-cyclic irregular repeat accumulate). QC-IRA codes are based on circulant permutation matrices. QC-IRA codes can have lower encoding complexity than traditional IRA codes and can be decoded in a partially parallel decoder like QC-LDPC codes. The following non-limiting example of applying embodiments of the invention to QC-IRA codes using the GAUSS-SIEDEL approximation to BP is provided as an example and does not limit embodiments of the invention. Embodiments of the invention are applicable to other approximations to BP decoding of QC-IRA codes as well as QC-LDPC codes. FIG. 14 illustrates, generally at 1400, an algorithmic approximation to belief propagation decoding using a GAUSS-SIEDEL approximation according to embodiments of the invention. With reference to FIG. 14, the algorithm begins by initializing an accumulator A with the LLR from a channel of memory as shown in equation 1402. For the variable node group "n" the accumulator $A_{n_{VNG}}$ contains the accumulators of all the variable nodes contained in the variable node group "n."

In quasi-cyclic (QC) codes, every part of the parity check matrix (H) is composed of a permutation of the identity matrix. C(m) is the set of permuted identity matrices that are contributing to a check node group "m." We let $f(k)$ represents the corresponding variable node group "n" for the permuted identity matrix "k" in C(m). Therefore, the set of permuted identity matrices that are contributing to a check node group are defined in equation 1404 for a variable node.

After the set has been identified, the variable node update is performed as a subtraction of matrices as shown in equation 1406. Where $L^k_{extr}$ in equation 1406 are the incoming messages from the other check nodes that are connected to the variable node that is being updated.

The check node messages are computed with equation 1408, where "$\alpha$" represents a parameter that is used to perform a functional adjustment layer-by-layer and iteration-by-iteration. The parameters for "$\alpha$" are illustrated in equation 1412. The functional adjustment parameters $\alpha$ are established for each layer and for each iteration during the design of a decoder as described above by running simulations which allow bit error rate (BER) to vary, and which take into account certain metrics such as layer number, iteration number, code rate, etc. Sometimes more metrics are used and sometimes less metrics are used in the simulations used to establish the parameters α. The simulations result in values for the parameters α for each layer and for each iteration. These values are available to the decoder during decoding. In non-limiting examples, the values can be conceptualized as a matrix of parameters as shown in 1412, which can be stored in one or more look-up tables for use during decoding. In some embodiments, all of the parameters are different in each layer and in each iteration. In other embodiments, at least two parameters are different either per layer or per iteration.

New a-posteriori information is computed according to equation 1410. Messages are then permuted back to the probability domain.

A process that uses the GAUSS-SIEDEL approximation to belief propagation decoding is illustrated in FIG. 14. In overview, in various embodiments, the process applies the permutation function to the H matrix associated with the codeword as described above. Check nodes are updated and then the messages are permuted back. A process starts at a block 1420. At a block 1422 initialization is performed by initializing an accumulator A with the LLR from a channel of memory as shown in equation 1402. The set of permuted identity matrices that are contributing to a check node group are defined in equation 1404 for a variable node. At a block 1424 the variable nodes are updated according to equation 1406. At a block 1426 the check nodes are updated according to equation 1408. Blocks 1424 and 1426 are performed layer-by-layer and functional adjustment parameter α is applied layer-by-layer during the decoding. At a block 1428 the messages are permuted back. The prospective codeword is checked and if needed another iteration of decoding is performed and information is updated based on previous decoding using equation 1410. The process stops at a block 1430.

A method to decode low-density parity check (LDPC) encoded data using a parity check matrix having a plurality of layers, includes: receiving a plurality of values at a decoder, each value of the plurality of values representing one of a plurality of bits of an LDPC codeword encoded using the parity check matrix; decoding the LDPC codeword using layered scheduling; and applying a functional adjustment to a Gauss-Siedel approximation to belief propagation algorithm used during the decoding, wherein the applying uses a layer specific functional adjustment to provide an estimate of a codeword. In one embodiment the layer specific functional adjustment defines a parameter and the applying multiplies the parameter during a check node calculation. In another embodiment the layer specific functional adjustment defines a parameter and the applying divides by the parameter during a check node calculation.

Split Row Decoding

The SPLIT ROW decoding approximation to belief propagation for LDPC decoding is a soft decoding method that can be applied to any LDPC code. SPLIT ROW decoding permits the decoding to proceed without operating on an entire row of the parity check matrix H which is associated with a code word at once. SPLIT ROW decoding is especially useful with irregular codes where all of the matrix values need to be stored, thereby eliminating the need to load an entire row of values into memory at one time, thereby reducing the demands placed on a hardware design. With split row decoding, a portion of a row is read into memory, decoded and then another portion of the row is read into memory and decoded, etc. Accordingly, embodiments of the invention are used to apply functional adjustments to portions of a row or portions of a layer of the parity check matrix during decoding.

FIG. 15A illustrates, generally at 1500, an algorithmic approximation to belief propagation decoding using a SPLIT ROW DECODING approximation according to embodiments of the invention. With reference to FIG. 15A, the BP algorithm is illustrated at 1502. When expressed for a portion of a row, i.e., Nsplit, the BP algorithm 1502 becomes 1504. The function Ø is a positive function, therefore the summation based on Nsplit is less than or equal to the summation based on N as given by equation 1506. The function Ø is also a decreasing function so that Ø(Nsplit) is greater than or equal to Ø(N) as shown in equation 1508. During the decoding of part of a row, the result from the check node calculation will exceed the value that would be produced if belief propagation were used for the decoding method. Thus, the approximation presented by SPLIT ROW DECODING does not track the path of BP decoding. A functional adjustment applied to the split row improves the decoding performance of a SPLIT ROW decoding process. Therefore, the check node update equation 1504 is divided by an attenuation factor "S" resulting in equation 1510 for the check node calculation of Nsplit. In various embodiments, the scaling factor S is applied per layer portion (s) and per iteration (r) resulting in parameters which can be expressed as a matrix such as $S_{rst}$ shown at 1512.

Figure 15B:
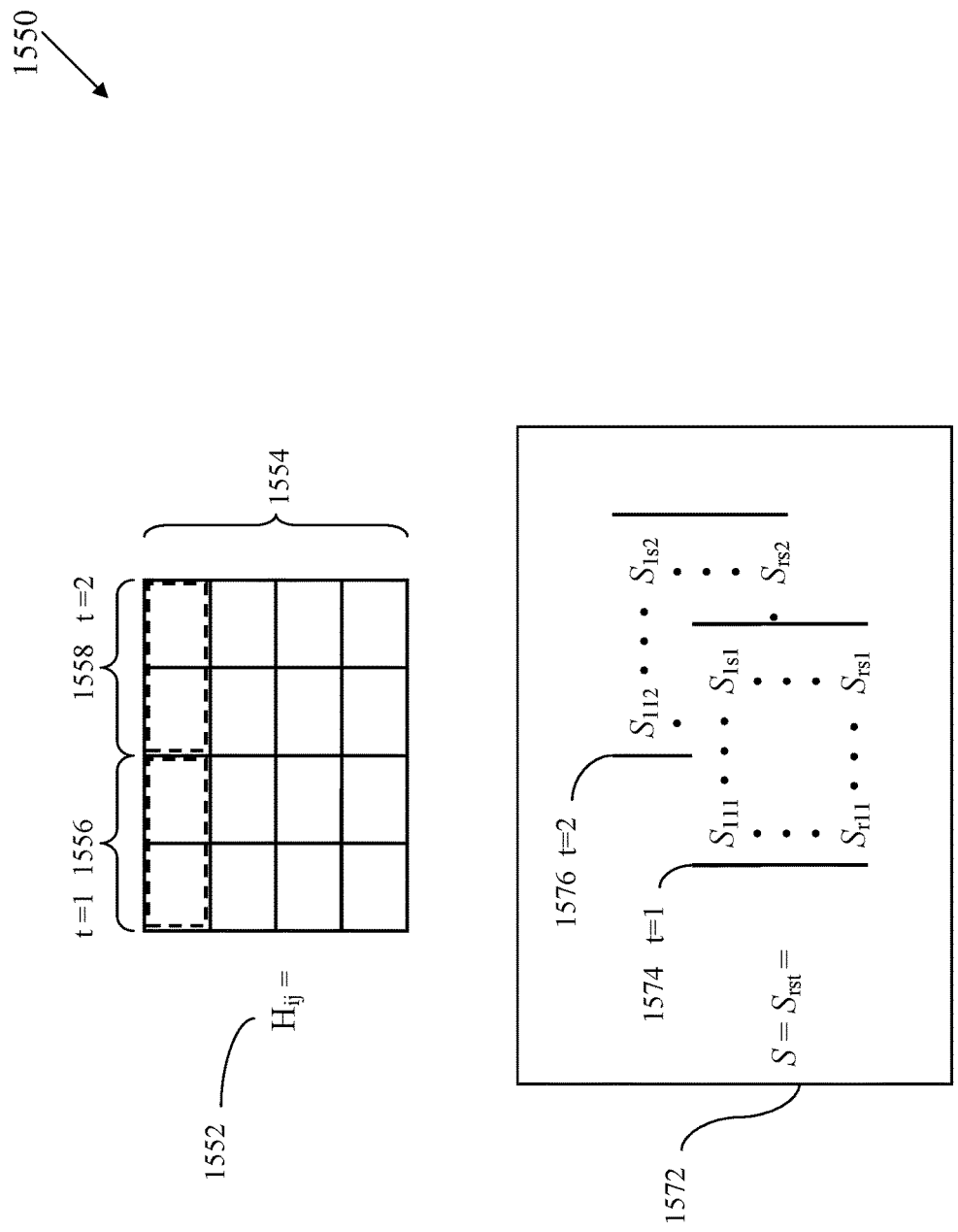

In some embodiments, the functional adjustments applied during SPLIT ROW decoding can be varied across the layer as well, indicated by layer portion "s" in equation 1512. In such a case, SPLIT ROW decoding introduces more granularity to the decoding process by dividing the layer up along the row index. FIG. 15B illustrates generally at 1550, applying functional adjustments to portions of a layer during decoding. With reference to FIG. 15B, a parity check matrix $H_{ij}$ is indicated at 1552. Matrix 1552 has layers as indicated by 1554. Within a first row, a first layer is indicated as consisting of a first portion of a row 1556 (t=1) and a second portion of a row 1558 (t=2). A matrix of functional adjustment values $S_{rst}$ is indicated at 1572, where row indices r represents iteration number, column indices s represents layer number, and index t indicates portions of a layer. In the example of 1572, two portions of a row are represented by 1574 (t=1) and 1576 (t=2).

The check node messages are computed with equation 1510, where "S" represents a parameter that is used to perform a functional adjustment portion-by-portion of a row, layer-by-layer, and iteration-by-iteration. The parameters for "$S_{rst}$" are illustrated in equation 1572. The functional adjustment parameters $S_{rst}$ are established for each portion of a layer and for each iteration during the design of a decoder as described above by running simulations which allow bit error rate (BER) to vary, and which take into account certain metrics such as layer portion number, iteration number, code rate, etc. Sometimes more metrics are used and sometimes less metrics are used in the simulations used to establish the parameters $S_{rst}$. The simulations result in values for the parameters $S_{rst}$ for each portion of a layer and for each iteration. These values are available to the decoder during decoding. In non-limiting examples, the values can be conceptualized as a matrix of parameters as shown in 1572, which can be stored in one or more look-up tables for use during decoding. In some embodiments, all of the parameters are different in each layer and in each iteration. In other embodiments, at least two parameters are different either per layer or per iteration.

In various other embodiments, other functional adjustments are applied to other general decoding algorithmic approximations to BP that have not been explicitly described herein. Such other general functional adjustments applied to other general approximations of BP are within the scope of embodiments taught herein as indicated by the combination of a user defined functional adjustment 418 in combination with a user defined approximation to BP 450 (FIG. 4).

A method to decode low-density parity check (LDPC) encoded data using a parity check matrix having a plurality of layers, includes: receiving a plurality of values at a decoder, each value of the plurality of values representing one of a plurality of bits of an LDPC codeword encoded using the parity check matrix; decoding the LDPC codeword using layered scheduling; and applying a functional adjustment to a split row decoding approximation to belief propagation algorithm used during the decoding, wherein the applying uses a layer specific functional adjustment to provide an estimate of a codeword. In one embodiment, the layer specific functional adjustment defines a parameter and the applying multiplies the parameter during a check node calculation. In one embodiment of the method, the layer specific functional adjustment defines a parameter and the applying divides by the parameter during a check node calculation. In another embodiment of the method, the plurality of bits corresponds with a portion of a layer and a functional adjustment is applied to the portion during the applying.

In one embodiment of the method, during the decoding, a portion of a layer is decoded separately from the rest of the layer. In this embodiment a functional adjustment can be applied to the portion of the layer during the applying.

Apparatus—Nonvolatile Memory System

Figure 16:
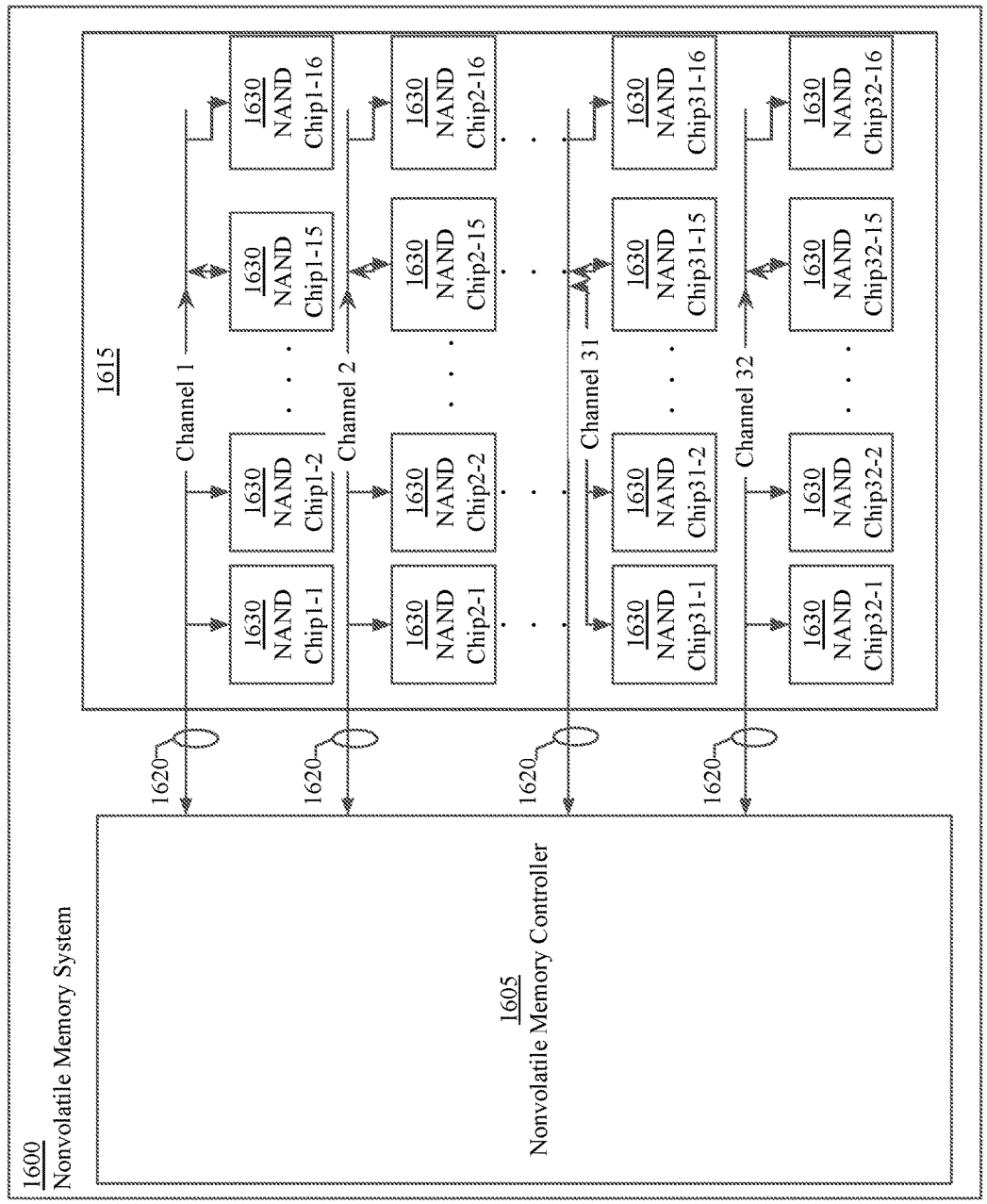
FIG. 16 is a block diagram illustrating a nonvolatile memory system in accordance with embodiments of the present invention.

FIG. 16 is a block diagram illustrating a nonvolatile memory system in accordance with embodiments of the present invention.

The attenuation factor matrix of the present invention may be used to improve the performance of the LDPC decoder in decoding LDPC encoded data that is stored in a nonvolatile memory system. As shown with reference to FIG. 16, a nonvolatile memory system 1600, such as a solid state drive, may include a nonvolatile storage module 1615 and a nonvolatile memory controller 1605. The nonvolatile memory storage module 1615 may comprise a plurality of NAND chips 1630. Each of the plurality of NAND chips 1630 may be coupled to the nonvolatile memory controller 1605 through a plurality of channels 1620. In this embodiment, the NAND chips 1630 store the encoded codewords and the memory controller 1605 is designed to execute reading and writing controls for the NAND chips 1630 according to reading and writing instructions received from an access device.

In various embodiments, the circuit depicted in 1600 (with or without additional components illustrated in the other figures) is implemented in an integrated circuit device, which may include an integrated circuit package containing the integrated circuit. As used in this description of embodiments, the term "integrated circuit" is used synonymously with the term "integrated circuit device." Note also that the term "integrated circuit" is understood to represent at least a part of an integrated circuit but not necessarily what would constitute an entire chip. In some embodiments, the circuit 1600 is implemented in a single integrated circuit die. In other embodiments, the circuit 1600 is implemented in more than one integrated circuit die of an integrated circuit device that may include a multi-chip package containing the integrated circuit. The embodiments of the present invention are not limited to any particular semiconductor manufacturing technology. Embodiments of the present invention can be implemented using C-MOS, BIPOLAR, Silicon Germanium, or other process technology. The process technologies listed here are provided merely for example and do not limit embodiments of the invention.

Figure 17:
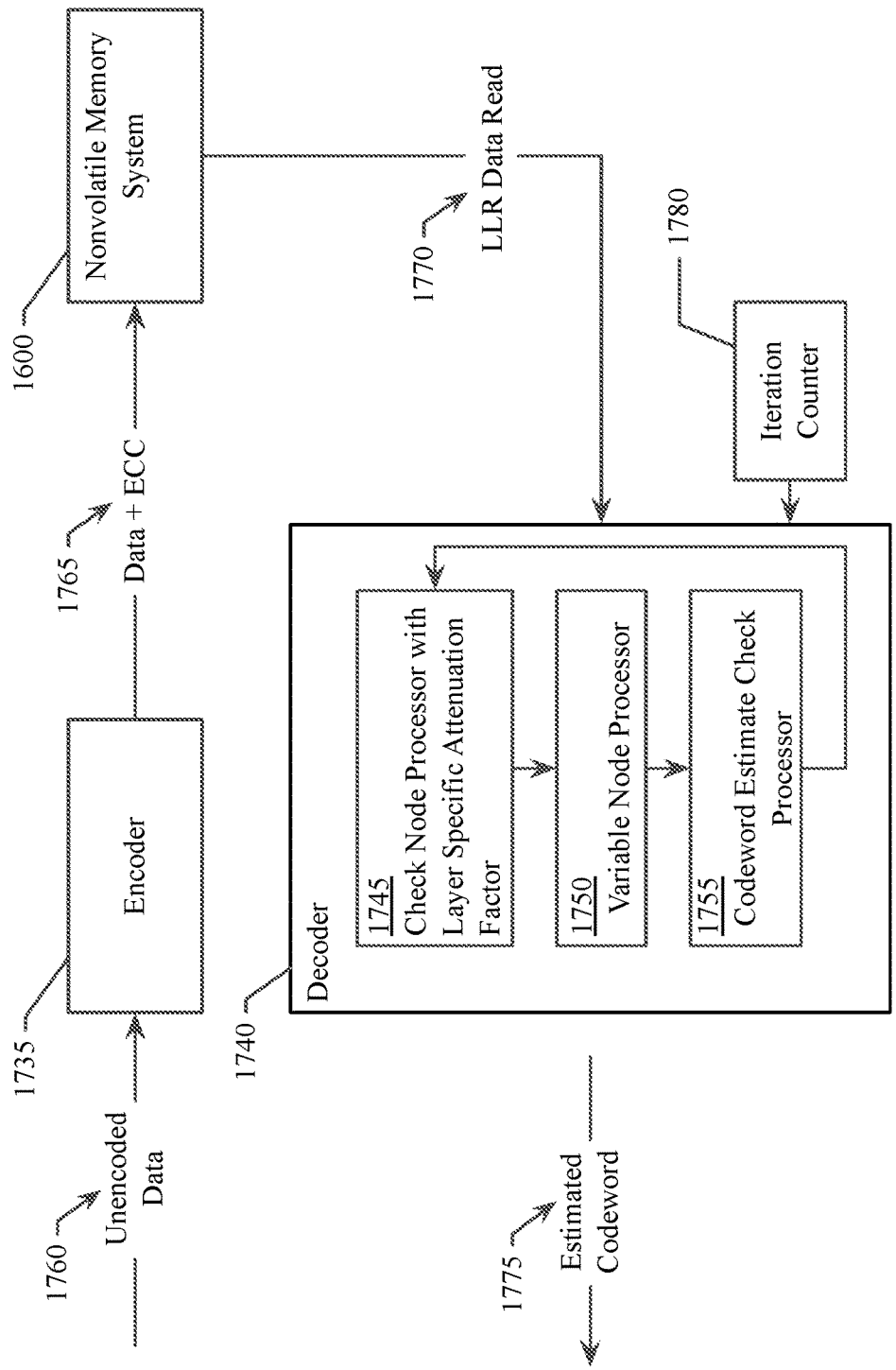
FIG. 17 is a block diagram illustrating LDPC encoding and LDPC decoding in accordance with embodiments of the present invention.

The nonvolatile memory system 1600 of FIG. 16 may be incorporated into a LDPC system as shown with reference to FIG. 17. FIG. 17 is a block diagram illustrating LDPC encoding and LDPC decoding in accordance with embodiments of the present invention.

As shown, the LDPC system may comprise an encoder 1735 that is responsible for adding the parity bits to the user data 1760 in accordance with a low-density parity check (LDPC) code. The LDPC encoded data 1765, which includes the user data 1760 and an error correction code, may then be stored as encoded codewords in the nonvolatile memory system 1600. In a particular embodiment the nonvolatile memory system 1600 may include a plurality of NAND chips 1630 and a nonvolatile memory controller 1605 as previously described with reference to FIG. 16.

In the present invention, according to various embodiments, LDPC decoding of the codeword is performed based upon the parity check matrix and an attenuation factor matrix (functional adjustments). The parity check matrix consists of "0"s and "1"s defining the parity check equations. For an "M" row×"N" column parity check matrix, M check nodes and N variable nodes iteratively exchange messages between each other according to the LDPC decoding algorithm. The "1"s in the parity check matrix define the connections between the variable nodes and the check nodes and the exchange of information is performed only between the nodes connected to each other as defined by the parity check matrix. The present invention employs a layered decoding technique in which message updates are performed after the completion of each layer of the parity check matrix. A layer may be defined as a single row of the parity check matrix, or as a group of rows of the parity check matrix. The values of the attenuation factor matrix define an attenuation factor to be used for the check node processing for each layer, and for each iteration, during the decoding process. The layer specific attenuation factor may be different for each layer or the layer specific attenuation factor may be different for only one layer of the parity check matrix.

In operation of the present invention, according to various embodiments, during a read operation of the nonvolatile memory system 1600, multiple reads of the stored codewords are executed to provide soft information represented by LLRs 1770 as previously described. The LLRs 1770 are used as input to the LDPC decoder 1740 to decode the user message data 1760 and encoded by, the encoder 1735, utilizing LDPC coding following a parity check matrix (H). The received LLR values for each variable node are taken as the initial variable node messages. The check node processor 1745 updates the check nodes of a first layer with the variable node messages they are connected to, using the approximation to belief propagation (BP) implemented in the decoder 1740, such as the normalized layered min-sum algorithm, modified by the layer specific attenuation factor from the attenuation matrix for the first layer and the first iteration. The resulting messages of the check node processor 1745 are then passed to the variable node processor 1750 and the variable node processor 1750 then updates each variable node with the check node messages to which they are connected. The decoding process continues at the second layer, using the approximation to BP (e.g., the normalized layered min-sum algorithm) modified by the layer specific attenuation factor from the attenuation factor matrix for the second layer and the first iteration or a layered BP improvement can be used. The decoding process continues in this way, utilizing the layer specific attenuation factor from the attenuation factor matrix for each of the layers, resulting in a codeword estimate. The codeword estimate is checked by codeword estimate check processor 1755, to verify whether or not the codeword estimate is a codeword (i.e., whether the codeword estimate is valid). In a particular embodiment, the codeword estimate may be multiplied by the parity check matrix to determine the syndrome and if the syndrome is zero, it may be determined that the codeword estimate is a codeword. If the codeword estimate is a codeword, the decoding is complete and the estimated codeword is provided as output 1775 from the decoder 1740. If it is determined by the codeword estimate check processor 1755 that the codeword estimate is not a codeword, a second iteration of the decoding begins. In the second iteration, the attenuation factors from the attenuation factor matrix for the second iteration for each of the layers are used. The iteration counter 1780 may be used to track the number of iterations of the decoding process and may cause the decoding to terminate if a maximum number of iterations is reached.

In various embodiments, the decoder depicted in 1740 (with or without additional components illustrated in the figure or in other figures) is implemented in an integrated circuit device, which may include an integrated circuit package containing the integrated circuit. As used in this description of embodiments, the term "integrated circuit" is used synonymously with the term "integrated circuit device." Note also that the term "integrated circuit" is understood to represent at least a part of an integrated circuit but not necessarily what would constitute an entire chip. In some embodiments, the decoder 1740 is implemented in a single integrated circuit die. In other embodiments, the decoder 1740 is implemented in more than one integrated circuit die of an integrated circuit device that may include a multi-chip package containing the integrated circuit. The embodiments of the present invention are not limited to any particular semiconductor manufacturing technology. Embodiments of the present invention can be implemented using C-MOS, BIPOLAR, Silicon Germanium, or other process technology. The process technologies listed here are provided merely for example and do not limit embodiments of the invention.

Decoding Method

Figure 18:
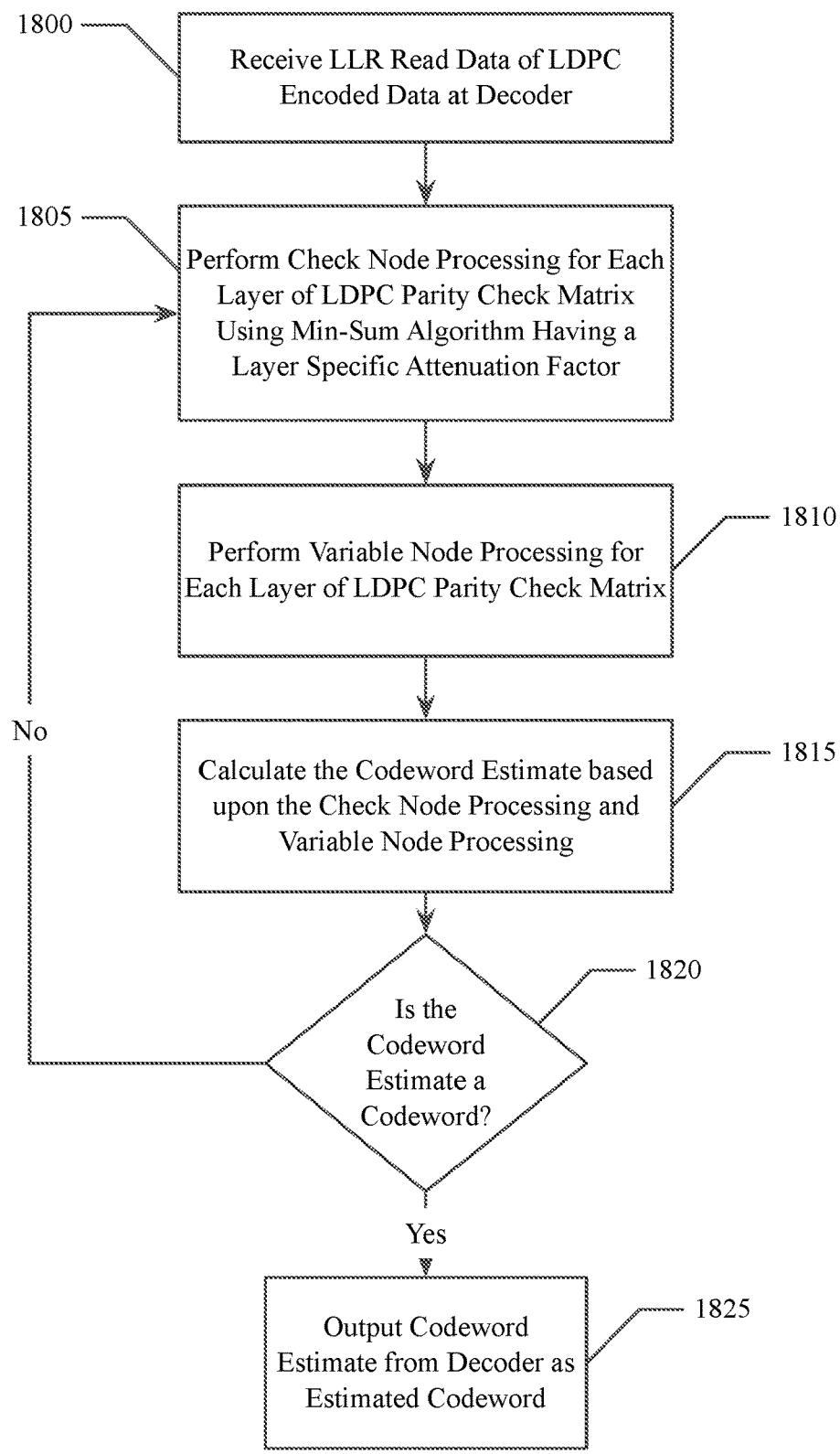
FIG. 18 is a flow diagram illustrating the decoding method in accordance with embodiments of the present invention.

FIG. 18 is a flow diagram illustrating the decoding method in accordance with embodiments of the present invention. With reference to FIG. 18, in a particular embodiment of the present invention, LLR read data of the LDPC encoded data may be received at an LDPC decoder 1800. In a particular embodiment, the LLRs may be read from a nonvolatile memory storage, such as a solid state drive (SSD) comprising a plurality of NAND chips. As previously described, iterative decoding is performed using the LLRs of the LDPC codeword. In iterative decoding, the check node processor 1745 of the decoder 1740 performs check node processing for each layer of the LDPC parity check matrix using a layered min-sum algorithm having a layer specific attenuation factor 1805. In the present invention, the adjustment to the min-sum algorithm result may be different for each layer of the parity check matrix depending upon the layer specific attenuation factor. The layer specific attenuation factor may also be different for each iteration of the decoding process. The messages resulting from the check node processing are passed to the variable node processor and the variable node processor 1750 of the decoder 1740 then performs variable node processing for each layer 1810 and produces a codeword estimate based upon the check node processing and variable node processing 1815. The codeword estimate check processor 1755 of the decoder 1740 then checks to verify that the codeword estimate is a codeword 1820. If the codeword estimate is determined to be a codeword, the codeword estimate is transmitted from the decoder as an estimated codeword 1825. However, if the codeword estimate is not determined to be a codeword, a next iteration of the decoding process is initiated beginning with the check node processing step 1805.

Apparatus

An apparatus such as, for example, nonvolatile memory controller 1605 is configured to decode low-density parity check (LDPC) encoded data using a parity check matrix having a plurality of layers, includes: a functional adjustment matrix containing functional adjustment parameters, each location in the functional adjustment matrix to provide a layer specific functional adjustment for each layer of the plurality of layers. Check node processor 1745 is coupled to the functional adjustment matrix, and check node processor 1745 has circuitry to perform check node processing on a plurality of values for each layer of the parity check matrix associated with a codeword utilizing an approximation to belief propagation that uses one or more of a Min Sum decoding algorithm, offset Min Sum decoding algorithm, two-step Min Sum decoding algorithm and a normalized two-step Min Sum decoding algorithm. When a two-step Min Sum decoding algorithm is used and; when signs of incoming messages are the same, a Min Sum decoding algorithm is used to decode; or when signs of incoming messages are not the same, a difference in magnitude of the incoming messages is used as an independent variable in a function to compute a new value for the messages used to decode. In this embodiment the function is approximated by a threshold value and the threshold value can be different per layer and per iteration. When a normalized two-step Min Sum decoding algorithm is used; when signs of incoming messages are the same a normalized Min Sum algorithm is used to decode, wherein a functional adjustment multiples a coefficient times a message value during decoding of a layer; or when signs of incoming messages are not the same, a new message value $m_j$ is computed using an equation $m_j = \Sigma w_i * m_i$, with constraint $\Sigma w_i = 1$, and $\{i=1, j\}$ is used to decode. In this embodiment, the functional adjustment provides at least three different parameters for use during the decoding of a layer. In another embodiment, whether or not a stored parameter is used during application of the functional adjustment is determined by a message value generated during decoding.

In one embodiment an apparatus such as, for example, nonvolatile memory controller 1605 is configured to decode low-density parity check (LDPC) encoded data using a parity check matrix having a plurality of layers. Decoder 1740 includes circuitry to decode, layer by layer, a LDPC codeword utilizing functional adjustments and an algorithmic approximation to belief propagation that uses one or more of a Min Sum decoding algorithm, offset Min Sum decoding algorithm, two-step Min Sum decoding algorithm and a normalized two-step Min Sum decoding algorithm, to provide an estimate of the LDPC codeword, the functional adjustments including layer specific parameters for at least two layers of the parity check matrix associated with the LDPC codeword. When an offset Min Sum decoding algorithm is used a functional adjustment can be subtracted during a check node message calculation. When a two-step Min Sum decoding algorithm is used, and; when signs of incoming messages are the same, a Min Sum decoding algorithm is implemented in the circuitry to decode; or when signs of incoming messages are not the same, a difference in magnitude of the incoming messages is used as an independent variable in a function to compute a new value for the messages used in the circuitry to decode. In one embodiment the function is approximated by a threshold value and the threshold value can be different per layer and per iteration. When a normalized two-step Min Sum decoding algorithm is used and; when signs of incoming messages are the same a normalized Min Sum algorithm is implemented in the circuitry to decode, and the circuitry multiplies the functional adjustment by a message value during decoding of a layer; or when signs of incoming messages are not the same, a new message value $m_j$ is computed using an equation $m_j = \Sigma w_i * m_i$, with constraint $\Sigma w_i = 1$, and $\{i=1, j\}$ and is used in the circuitry to decode. The functional adjustment can provide at least three different parameters for use during decoding of a layer. Also, parameters can be stored, and the stored parameters can be used to apply the functional adjustment is determined by a message value generated during decoding.

In one embodiment the circuitry of decoder 1740 is configured to perform, in order, a.) check node processing followed by variable node processing on a layer of the parity check matrix associated with the LDPC codeword and to apply a functional adjustment to the algorithmic approximation of belief propagation; b.) the decoding process of "a." is applied to the rest of the layers of the parity check matrix associated with the LDPC codeword; and c.) an estimate of the LDPC codeword is checked to determine if the estimate is valid. The circuitry can also contain logic to: output the LDPC codeword if the estimate is valid; and perform another iteration of the decoding beginning with "a." if the estimate is not valid. In this embodiment each layer can be one or more circulant rows in the parity check matrix associated with the LDPC codeword.

In one embodiment an apparatus such as, for example, nonvolatile memory system 1600 includes an integrated circuit to decode low-density parity check (LDPC) encoded data using a parity check matrix having a plurality of layers. The nonvolatile memory system 1600 includes a section of memory that is configured to store functional adjustment parameters. The section of memory may be memory on nonvolatile controller 1605 or memory on one or more NAND chip 1630 that is coupled to nonvolatile memory controller 1605.

An apparatus such as, for example, nonvolatile memory controller 1605, to decode low-density parity check (LDPC) encoded data using a parity check matrix having a plurality of layers, includes: a functional adjustment matrix containing functional adjustment parameters, each location in the functional adjustment matrix to provide a layer specific functional adjustment for each layer of the plurality of layers; a check node processor 1745 coupled to the functional adjustment matrix, the check node processor 1745 having circuitry to perform check node processing on a plurality of values for each layer of the parity check matrix associated with a codeword utilizing normalized belief propagation decoding; a variable node processor 1750 coupled to the check node processor 1745, the variable node processor 1750 having circuitry to perform variable node processing on a plurality of values for each layer of the parity check matrix associated with the codeword; and a codeword estimate check processor 1755 coupled to the variable node processor 1750, the codeword estimate check processor 1755 having circuitry to perform a check of an estimate of the codeword to determine if the estimate is valid.

An apparatus such as, for example, nonvolatile memory controller 1605, to decode low-density parity check (LDPC) encoded data using a parity check matrix having a plurality of layers, includes a decoder 1740 that includes circuitry to decode, layer-by-layer, an LDPC codeword utilizing functional adjustments and a normalized belief propagation algorithm to provide an estimate of the LDPC codeword, the functional adjustments including layer specific parameters for at least two layers of the parity check matrix associated with the LDPC codeword. In one embodiment the functional adjustments define parameters and the circuitry multiplies at least one parameter during a check node calculation in a layer. In one embodiment the functional adjustments define parameters and the circuitry divides by at least one parameter during a check node calculation in a layer.

An apparatus such as, for example, nonvolatile memory controller 1605, to decode low-density parity check (LDPC) encoded data using a parity check matrix having a plurality of layers, includes: a functional adjustment matrix containing functional adjustment parameters, each location in the functional adjustment matrix to provide a layer specific functional adjustment for each layer of the plurality of layers; a check node processor 1745 coupled to the functional adjustment matrix, the check node processor 1745 having circuitry to perform check node processing on a plurality of values for each layer of the parity check matrix associated with a codeword using offset belief propagation decoding; a variable node processor 1750 coupled to the check node processor, the variable node processor 1750 having circuitry to perform variable node processing on a plurality of values for each layer of the parity check matrix associated with the codeword; and a codeword estimate check processor 1755 coupled to the variable node processor 1750, the codeword estimate check processor 1755 having circuitry to perform a check of an estimate of the codeword to determine if the estimate is valid.

An apparatus such as, for example, nonvolatile memory controller 1605, to decode low-density parity check (LDPC) encoded data using a parity check matrix having a plurality of layers, includes a decoder 1740 having circuitry to decode, layer-by-layer, an LDPC codeword utilizing functional adjustments and offset belief propagation to provide an estimate of the LDPC codeword, the functional adjustments including layer specific parameters for at least two layers of the parity check matrix associated with the LDPC codeword. In one embodiment the functional adjustments define parameters and the circuitry adds at least one parameter during a check node calculation in a layer. In one embodiment the functional adjustments define parameters and the circuitry subtracts at least one parameter during a check node calculation in a layer.

An apparatus such as, for example, nonvolatile memory controller 1605 to decode low-density parity check (LDPC) encoded data using a parity check matrix having a plurality of layers, includes: a functional adjustment matrix containing functional adjustment parameters, each location in the functional adjustment matrix to provide a layer specific functional adjustment for each layer of the plurality of layers; a check node processor 1745 coupled to the functional adjustment matrix, the check node processor 1745 having circuitry to perform check node processing on a plurality of values for each layer of the parity check matrix associated with a codeword utilizing a log-Fast Fourier transform (LOG-FFT) approximation to belief propagation decoding; a variable node processor 1750 coupled to the check node processor, the variable node processor 1750 having circuitry to perform variable node processing on a plurality of values for each layer of the parity check matrix associated with the codeword; and a codeword estimate check processor 1755 coupled to the variable node processor, the codeword estimate check processor 1755 having circuitry to perform a check of an estimate of the codeword to determine if the estimate is valid.

An apparatus such as, for example, nonvolatile memory controller 1605, to decode low-density parity check (LDPC) encoded data using a parity check matrix having a plurality of layers includes a decoder 1740 having circuitry to decode, layer-by-layer, an LDPC codeword utilizing functional adjustments and a log-Fast Fourier transform (LOG-FFT) approximation to belief propagation to provide an estimate of the LDPC codeword, the functional adjustments including layer specific parameters for at least two layers of the parity check matrix associated with the LDPC codeword. In one embodiment the functional adjustments define parameters and the circuitry adds at least one parameter during a check node calculation in a layer. In one embodiment the functional adjustments define parameters and the circuitry subtracts at least one parameter during a check node calculation in a layer.

An apparatus such as, for example, nonvolatile memory controller 1605, to decode low-density parity check (LDPC) encoded data using a parity check matrix having a plurality of layers, includes: a functional adjustment matrix containing functional adjustment parameters, each location in the functional adjustment matrix to provide a layer specific functional adjustment for each layer of the plurality of layers; a check node processor 1745 coupled to the functional adjustment matrix, the check node processor 1745 having circuitry to perform check node processing on a plurality of values for each layer of the parity check matrix associated with a codeword utilizing an approximate MIN* approximation to belief propagation algorithm; a variable node processor 1750 coupled to the check node processor 1745, the variable node processor 1750 having circuitry to perform variable node processing on a plurality of values for each layer of the parity check matrix associated with the codeword; and a codeword estimate check processor 1755 coupled to the variable node processor, the codeword estimate check processor has circuitry to perform a check of an estimate of the codeword to determine if the estimate is valid.

An apparatus to decode low-density parity check (LDPC) encoded data using a parity check matrix having a plurality of layers, includes a decoder having circuitry to decode, layer-by-layer, an LDPC codeword utilizing functional adjustments and an approximate MIN* approximation to belief propagation algorithm to provide an estimate of the LDPC codeword, the functional adjustments including layer specific parameters for at least two layers of the parity check matrix associated with the LDPC codeword. In one embodiment the functional adjustments define parameters and the circuitry adds at least one parameter during a check node calculation in a layer. In one embodiment the functional adjustments define parameters and the circuitry subtracts at least one parameter during a check node calculation in a layer. In another embodiment a check node processor is configured to select a least reliable message arriving at a check node and to compute two messages for the check node in response to the least reliable message. A first message can be sent to a variable node that sent the least reliable message and the first message is to be computed with a belief propagation decoding algorithm. A functional adjustment C is can be applied to the second message and the second message is to be sent to the other variable nodes which are connected to the check node, the second message is to be computed with $$R_{iv} = \left( \prod_{j \in N\{iv\}} \alpha_{ij} \right) \cdot |\boxplus_{j \in N[i]} Q_{ij}| - C.$$

In various embodiments, the system of the present invention may be implemented in a Field Programmable Gate Array (FPGA) or Application Specific Integrated Circuit (ASIC) suitable for the design of encoders/decoders for LDPC codes.

The algorithms presented herein are not inherently related to any particular computer or other apparatus. Various general-purpose systems may be used with programs in accordance with the teachings herein, or it may prove convenient to construct more specialized apparatus to perform the required method. For example, any of the methods according to the present invention can be implemented in hard-wired circuitry, by programming a general-purpose processor, or by any combination of hardware and software. One of ordinary skill in the art will immediately appreciate that the invention can be practiced with computer system configurations other than those described, including hand-held devices, multiprocessor systems, microprocessor-based or programmable consumer electronics, digital signal processing (DSP) devices, set top boxes, network PCs, minicomputers, mainframe computers, and the like. The invention can also be practiced in distributed computing environments where tasks are performed by remote processing devices that are linked through a communications network.

The methods herein may be implemented using computer software. If written in a programming language conforming to a recognized standard, sequences of instructions designed to implement the methods can be compiled for execution on a variety of hardware platforms and for interface to a variety of operating systems. In addition, the present invention is not described with reference to any particular programming language. It will be appreciated that a variety of programming languages may be used to implement the teachings of the invention as described herein. Furthermore, it is common in the art to speak of software, in one form or another (e.g., program, procedure, application, driver, . . . ), as taking an action or causing a result. Such expressions are merely a shorthand way of saying that execution of the software by a computer causes the processor of the computer to perform an action or produce a result.

It is to be understood that various terms and techniques are used by those knowledgeable in the art to describe communications, protocols, applications, implementations, mechanisms, etc. One such technique is the description of an implementation of a technique in terms of an algorithm or mathematical expression. That is, while the technique may be, for example, implemented as executing code on a computer, the expression of that technique may be more aptly and succinctly conveyed and communicated as a formula, algorithm, or mathematical expression. Thus, one of ordinary skill in the art would recognize a block denoting A+B=C as an additive function whose implementation in hardware and/or software would take two inputs (A and B) and produce a summation output (C). Thus, the use of formula, algorithm, or mathematical expression as descriptions is to be understood as having a physical embodiment in at least hardware and/or software (such as a computer system in which the techniques of the present invention may be practiced as well as implemented as an embodiment).

Non-transitory machine-readable media is understood to include any mechanism for storing information in a form readable by a machine (e.g., a computer). For example, a machine-readable medium, synonymously referred to as a computer-readable medium, includes read only memory (ROM); random access memory (RAM); magnetic disk storage media; optical storage media; flash memory devices; except electrical, optical, acoustical or other forms of transmitting information via propagated signals (e.g., carrier waves, infrared signals, digital signals, etc.); etc.

As used in this description, "one embodiment" or "an embodiment" or similar phrases means that the feature(s) being described are included in at least one embodiment of the invention. References to "one embodiment" in this description do not necessarily refer to the same embodiment; however, neither are such embodiments mutually exclusive. Nor does "one embodiment" imply that there is but a single embodiment of the invention. For example, a feature, structure, act, etc. described in "one embodiment" may also be included in other embodiments. Thus, the invention may include a variety of combinations and/or integrations of the embodiments described herein.

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. A method to decode low-density parity check (LDPC) encoded data using a parity check matrix having a plurality of layers, comprising:
   receiving a plurality of values at a decoder, each value of the plurality of values representing one of a plurality of bits of an LDPC codeword encoded using the parity check matrix;
   decoding the LDPC codeword using layered scheduling; and
   applying a functional adjustment to an approximation of belief propagation used during the decoding, wherein the applying includes applying a first functional adjustment parameter to a first layer and applying a second functional adjustment parameter to a second layer to provide an estimate of a codeword, wherein the first functional adjustment parameter is different from the second functional adjustment parameter.

2. The method of claim 1, wherein the approximation to belief propagation is selected from the group consisting of normalized belief propagation, offset belief propagation, Two-Step Min Sum, Normalized Two-Step Min Sum, Log-FFT, approximate min*, RICHARDSON/NOVICHKOV, bit flipping, iterative majority logic, GAUSS-SIEDEL, and split row decoding.

3. The method of claim 1, wherein the approximation of belief propagation is a RICHARDSON/NOVICHKOV approximation to belief propagation algorithm and wherein the first functional adjustment parameter and the second functional adjustment parameter are obtained through decoding simulations performed using the RICHARD SON/NOVICHKOV approximation of belief propagation algorithm.

4. The method of claim 1, wherein the layer specific functional adjustment is a user defined function and the applying uses a quantity from the user defined function during a check node calculation to change a result of the check node calculation and wherein the user defined function uses a parameter from a previous layer during a check node calculation of a current layer.

5. The method of claim 1, wherein the plurality of values are log-likelihood ratios (LLRs).

6. An apparatus to decode low-density parity check (LDPC) encoded data using a parity check matrix having a plurality of layers, comprising:
   a decoder, the decoder including circuitry to decode, layer by layer, a LDPC codeword utilizing functional adjustments and an algorithmic approximation to belief propagation to provide an estimate of the LDPC codeword, the functional adjustments including layer specific parameters for at least two layers of the parity check matrix associated with the LDPC codeword, the layer specific parameters including a first functional adjustment parameter to modify the results of processing of a first layer of the plurality of layers and a second functional adjustment parameter to modify the results of processing of a second layer of the plurality of layers, the second functional adjustment parameter different from the first functional adjustment parameter.

7. The apparatus of claim 6, wherein the algorithmic approximation to belief propagation is selected from the group consisting of normalized belief propagation, offset belief propagation, Two-Step Min Sum, Normalized Two-Step Min Sum, Log-FFT, approximate min*, RICHARDSON/NOVICHKOV, bit flipping, iterative majority logic, GAUSS-SIEDEL, and split row decoding.

8. The apparatus of claim 6, wherein the first functional adjustment parameter and a third functional adjustment parameter are obtained through decoding simulations performed using the RICHARDSON/NOVICHKOV approximation to belief propagation, the third functional parameter applied to the first layer to further modify the results of the processing of the first layer.

9. The apparatus of claim 6, wherein the circuitry adds the first functional adjustment parameter during the processing of the first layer to modify the results of the processing of the first layer and adds the second functional adjustment parameter during the processing of the second layer to modify the results of the processing of the second layer.

10. The apparatus of claim 6, wherein the decoder is configured to output a codeword estimate or perform another iteration of decoding if the codeword estimate is not valid.

11. The apparatus of claim 6, wherein each layer is one or more circulant rows in the parity check matrix associated with the LDPC codeword.

12. An integrated circuit to decode low-density parity check (LDPC) encoded data using a parity check matrix having a plurality of layers, comprising:
   a check node processor having circuitry to perform check node processing on a plurality of values for each layer of the parity check matrix associated with a codeword utilizing an algorithm that approximates belief propagation, the algorithm applying a first functional adjustment parameter in the check node processing of a first layer to modify the results of the check node processing of the first layer and applying a second functional adjustment parameter in the check node processing of the second layer to modify the results of the check node processing of the second layer, the second functional adjustment parameter different from the first functional adjustment parameter;

a variable node processor coupled to the check node processor, the variable node processor having circuitry to perform variable node processing on a plurality of values for each layer of the parity check matrix associated with the codeword;

a codeword estimate check processor coupled to the variable node processor, the codeword estimate check processor having circuitry to perform a check of an estimate of the codeword to determine if the estimate is a codeword; and wherein the integrated circuit is configured to output the codeword if the estimate is a codeword or perform another iteration of decoding if the estimate is not a codeword.

13. The integrated circuit of claim 12, wherein the plurality of values for each layer are log-likelihood ratios (LLRs).

14. The integrated circuit of claim 12, wherein the algorithm that approximates belief propagation is an off-set Min Sum decoding algorithm that subtracts the first functional adjustment parameter during a check node message calculation.

15. The integrated circuit of claim 12, wherein the algorithm that approximates belief propagation is a two-step Min Sum decoding algorithm, wherein;
1. when signs of incoming messages are the same, a Min Sum decoding algorithm is implemented in the circuitry to decode; or
2. when signs of incoming messages are not the same, a difference in magnitude of the incoming messages is used as an independent variable in a function to compute a new value for the messages used in the circuitry to decode.

16. The integrated circuit of claim 12, wherein the algorithm that approximates belief propagation is a normalized two-step Min Sum decoding algorithm, wherein;
1. when signs of incoming messages are the same a normalized Min Sum algorithm is implemented in the circuitry to decode, and the circuitry multiplies first functional adjustment parameter by a message value during decoding of the first layer; or
2. when signs of incoming messages are not the same, a new message value $m_j$ is computed using the equation $m_j=\Sigma w_i*m_i$, with constraint $\Sigma w_i=1$, and $\{i=1, j\}$ and used in the circuitry to decode.

17. The integrated circuit of claim 12, wherein the functional adjustment provides at least three different functional adjustment parameters for use during decoding of a layer.

18. The integrated circuit of claim 12, wherein, whether a stored parameter is used to apply the functional adjustment is determined by a message value during decoding.

19. The integrated circuit of claim 12, wherein each layer is one or more circulant rows in the parity check matrix associated with the codeword.

20. The integrated circuit of claim 12, wherein the algorithm that approximates belief propagation is selected from the group consisting of normalized belief propagation, offset belief propagation, Two-Step Min Sum, Normalized Two-Step Min Sum, Log-FFT, Approximate Min*, RICHARDSON/NOVICHKOV, bit flipping, iterative majority logic, GAUSS-SIEDEL, and split row decoding.

* * * * *

UNITED STATES PATENT AND TRADEMARK OFFICE
CERTIFICATE OF CORRECTION

PATENT NO. : 10,230,396 B1
APPLICATION NO. : 15/715011
DATED : March 12, 2019
INVENTOR(S) : Rino Micheloni et al.

Page 1 of 1

It is certified that error appears in the above-identified patent and that said Letters Patent is hereby corrected as shown below:

On the Title Page

Item (60), on the first line of the section titled "Related U.S. Application Data" replace the word "Continuation-in-part" with --Continuation of application No. 14/747,042, filed on Jun. 23, 2015, now Pat. No. 9,813,080 which is a continuation-in-part--

On the fifth and sixth lines of the section titled "Related U.S. Application Data" delete the phrase ", which is a continuation of application No. 14/747,042, filed on Jun. 23, 2015, now Pat. No. 9,813,080"

Signed and Sealed this
Twenty-third Day of July, 2019

Andrei Iancu
*Director of the United States Patent and Trademark Office*